United States Patent [19]

Matsuda et al.

[11] Patent Number: 5,324,364
[45] Date of Patent: Jun. 28, 1994

[54] PIN JUNCTION PHOTOVOLTAIC DEVICE HAVING AN I-TYPE A-SIGE SEMICONDUCTOR LAYER WITH A MAXIMAL POINT FOR THE GE CONTENT

[75] Inventors: Koichi Matsuda; Masafumi Sano; Tsutomu Murakami, all of Nagahama, Japan

[73] Assignee: Canon Kabushiki Kaisha, Tokyo, Japan

[21] Appl. No.: 45,176

[22] Filed: Apr. 13, 1993

[30] Foreign Application Priority Data

Apr. 15, 1992 [JP] Japan .................. 4-119843
Mar. 22, 1993 [JP] Japan .................. 5-085105

[51] Int. Cl.$^5$ ........................... H01L 31/075
[52] U.S. Cl. .................... 136/249; 136/255; 136/258; 257/55; 257/440; 257/458
[58] Field of Search ......... 136/249 TJ, 255, 258 AM; 257/55, 440, 458

[56] References Cited

U.S. PATENT DOCUMENTS

| | | | |
|---|---|---|---|
| 2,949,498 | 8/1960 | Jackson | 136/244 |
| 4,377,723 | 3/1983 | Dalal | 136/249 |
| 4,542,256 | 9/1985 | Wiedeman | 136/249 |
| 4,816,082 | 3/1989 | Guha et al. | 136/249 |
| 5,002,617 | 3/1991 | Kanai et al. | 136/258 |
| 5,002,618 | 3/1991 | Kanai et al. | 136/258 |
| 5,006,180 | 4/1991 | Kanai et al. | 136/258 |
| 5,007,971 | 4/1991 | Kanai et al. | 136/258 |
| 5,104,455 | 4/1992 | Yokota | 136/249 |
| 5,252,142 | 10/1993 | Matsuyama et al. | 136/255 |

FOREIGN PATENT DOCUMENTS 55-125680 9/1980 Japan .

Primary Examiner—Aaron Weisstuch
Attorney, Agent, or Firm—Fitzpatrick, Cella, Harper & Scinto

[57] ABSTRACT

A pin junction photovoltaic device comprising a substrate and a pin·junction semiconductor active layer region disposed on said substrate, said pin junction semiconductor active layer region comprising a p-type semiconductor layer composed of a p-type non-single crystalline semiconductor material, an i-type semiconductor layer composed of an i-type non-single crystalline semiconductor material, and an n-type semiconductor layer composed of an n-type non-single crystalline semiconductor material, characterized in that (a) a buffer layer comprising a non-single crystalline silicon semiconductor material substantially free of germanium atoms is interposed between said p-type semiconductor layer and said i-type semiconductor layer, (b) a buffer layer comprising a non-single crystalline silicon semiconductor material substantially free of germanium atoms is interposed between said i-type semiconductor layer and said n-type semiconductor layer, and said i-type semiconductor layer is formed of an amorphous silicon germanium semiconductor material containing the germanium atoms in an amount of 20 to 70 atomic % in the entire region in which the concentration distribution of the germanium atoms in the thickness direction is varied while providing a maximum concentration point.

30 Claims, 18 Drawing Sheets

PIN JUNCTION PHOTOVOLTAIC DEVICE HAVING AN I-TYPE A-SIGE SEMICONDUCTOR LAYER WITH A MAXIMAL POINT FOR THE GE CONTENT

BACKGROUND OF THE INVENTION

1. Field of the Invention

The present invention relates to an improved, highly reliable pin junction photovoltaic device which stably and continuously exhibits an improved photoelectric conversion efficiency without being deteriorated even upon repeated use over a long period of time. More particularly, the present invention relates to a pin junction photovoltaic device having a buffer layer positioned between a p-type semiconductor layer and an i-type semiconductor layer and another buffer layer positioned between said i-type semiconductor layer and an n-type semiconductor layer, wherein said i-type semiconductor layer is formed of an amorphous silicon germanium (that is, a-SiGe) material and has a maximal point for the content of the germanium atoms contained therein. The pin junction photovoltaic element is effectively usable as a solar cell or a photosensor.

2. Related Background Art

There are presently a variety of photovoltaic devices which have been put into practical use as solar cells for power supplies and also as photosensors in image readers.

Now, at the present time, solar cells mostly have been used for power sources of consumer electronic apparatus such as electronic calculators, watches, etc. However, solar cells are expected to be a future power generation source since they supply electric power without causing $CO_2$ buildup as in the case of oil fired power generation.

Solar cells are based on the technology of utilizing photoelectromotive force generated in a semiconductor active region having a pn junction. Such semiconductor active region with a pn junction is generally formed by using a silicon-containing semiconductor material or a germanium-containing semiconductor material. In the semiconductor active region, light such as sunlight is absorbed, the absorbed light generates photocarriers including electrons and holes, and the photocarriers are separated by the action of an internal electric field of the pn junction, whereby photoelectromotive force is outputted.

Of the presently known solar cells, a solar cell made of a single crystalline silicon material has been found to be highly reliable and high in photoelectric conversion efficiency (this solar cell will be hereinafter called "single crystal silicon solar cell"). However, there are disadvantages of the single crystal silicon solar cell as will be described in the following. That is, it is costly since it is produced by way of the so-called semiconductor wafer process. And the single crystalline silicon material of which the single crystal silicon solar cell is constituted is relatively small in light absorbance and because of this, it is necessary for the single crystal silicon solar cell to have a thick semiconductor active region with a thickness of more than 50 $\mu$m in order to facilitate its function absorb light such as sunlight. In addition, the single crystalline silicon material of the single crystal silicon solar cell is of about 1.1 eV in band gap and because of this, short wavelength energy components of the sunlight spectrum are not utilized for photoelectric conversion in the single crystal silicon solar cell. Further in addition, it is extremely difficult for the single crystal silicon solar cell to be of a large area because there is a limit for the size of silicon wafers that can be produced because of the requirement for growing a single crystal.

There are known a number of solar cells made of a polycrystalline silicon material (this solar cell will be hereinafter called "polycrystal silicon solar cell"). The polycrystal silicon solar cell is advantageous in that is can be produced at a cost which is lower than that of the single crystal silicon solar cell. However, as for the polycrystal silicon solar cell, there are disadvantages similar to those in the case of the single crystal silicon solar cell. Particularly, the polycrystalline silicon material of which the polycrystal silicon solar cell is constituted is relatively low in light absorbance and because of this, it is necessary for the polycrystal silicon solar cell to have a thick semiconductor active region as in the case of the single crystal silicon solar cell. In addition, the semiconductor active region of the polycrystal silicon solar cell contains grain boundaries and because of this, the polycrystal silicon solar cell is not satisfactory in terms of solar cell characteristics.

In view of the above, solar cells made of an amorphous silicon material (that is, a-Si; this solar cell will be hereinafter called "amorphous silicon solar cell") have been spotlighted because of their various advantages as will be described in the following. That is, their constituent semiconductor film can be relatively easily formed in a large area, thinned as desired, and formed on a selected substrate. In addition to these advantages, there are also other advantages in that a large area solar cell can be produced on an industrial scale, and thus, it is possible to provide an amorphous silicon solar cell at a reasonable cost.

There is, however, a disadvantage of such an amorphous silicon solar cell in that its photoelectric conversion efficiency is inferior to that of the above-mentioned single crystal silicon solar cell and is not sufficient for the amorphous silicon solar cell to be used as a daily power supply source.

In order to improve such a disadvantage of the amorphous silicon solar cell, U.S. Pat. No. 4,377,723 or Japanese Unexamined Patent Publication No. 125680/1980 proposes a technique of improving the open-circuit voltage (Voc) of an amorphous silicon solar cell by stacking a plurality of photovoltaic cell units each having a pn or pin junction.

Besides the above proposal, U.S. Pat. No. 4,542,256, U.S. Pat. No. 4,816,082, and U.S. Pat. No. 4,816,082 propose a technique of improving the light absorbance of an amorphous silicon solar cell by varying the band gap of each of the constituent semiconductor layers. Particularly, said U.S. Pat. No. 4,542,256 describes a technique of improving the open-circuit voltage (Voc) and short-circuit current (Jsc) of a pin junction solar cell by disposing a layer (that is a so-called intermediate layer) having a continuously graded band gap with an affinity gradient either at the interface between the p-type semiconductor layer and the i-type semiconductor layer or at the interface between the n-type semiconductor layer and the i-type semiconductor layer.

However, neither of these proposals is sufficient in terms of providing a high enough photoelectric conversion efficiency in a pin junction amorphous silicon photovoltaic cell.

FIG. 24 is a schematic diagram illustrating the profile of the energy band gap in the photovoltaic cell described in the above-mentioned U.S. Pat. No. 4,542,256 which has such a graded band gap layer as above described.

In FIG. 24, reference numeral 1 indicates an n-type amorphous silicon germanium semiconductor layer (that is, an n-type a-SiGe semiconductor layer), reference numeral 2 indicates a non-doped (i-type) amorphous silicon germanium semiconductor layer (that is, an i-type a-SiGe semiconductor layer), reference numeral 3 indicates a graded band gap layer comprised of a non-doped a-SiGe semiconductor material in which the composition ratio between the Si atoms and the Ge atoms is varied in the thickness direction, and reference numeral 4 indicates a p-type amorphous silicon semiconductor layer (that is, a p-type a-Si semiconductor layer). Particularly, the composition ratio between the Si atoms and the Ge atoms constituting the graded band gap layer 3 is designed such that the layer contains Ge atoms in an amount of 20 atomic % on the side of the i-type a-SiGe semiconductor layer but does not contain Ge atoms on the side of the p-type a-Si semiconductor layer 4.

FIG. 25 is a schematic diagram illustrating the profile of the energy band gap in the photovoltaic cell described in the above-mentioned U.S. Pat. No. 4,816,082.

In FIG. 25, reference numeral 1' indicates an n-type semiconductor layer comprised of a microcrystalline silicon semiconductor material (that is, $\mu$c-Si), reference numeral 2' indicates an i-type semiconductor layer comprised of a non-doped a-SiGe semiconductor material in which the content of the Ge atoms is continuously varied from 0 atomic % to 30 atomic % in the thickness direction, reference numeral 3' indicates an i-type semiconductor layer comprised of a non-doped a-SiGe in which the content of the Ge atoms is continuously varied from 30 atomic % to 0 atomic % in the thickness direction, reference numeral 5 indicates an i-type a-Si semiconductor layer, and reference numeral 4' indicates a p-type $\mu$c-Si semiconductor layer.

As apparent from FIG. 25, in the profile of the energy band gap in the photovoltaic cell described in said U.S. Pat. No. 4,816,082, most of the i-type semiconductor layer regions are designed to have a graded band gap while having a layer region with a minimum band gap at a given position.

FIG. 26 is a schematic diagram illustrating the profile of the energy band gap in a photovoltaic element having an i-type semiconductor layer with a plurality of layer regions having different graded band gaps which has been previously proposed by two of the three inventors of the instant invention together with three others (see U.S. Pat. No. 5,252,142).

In FIG. 26, reference numeral 1' indicates an n-type $\mu$c-Si layer, reference numeral 3' indicates an i-type a-SiGe semiconductor layer in which the content of the Ge atoms is continuously varied from 30 atomic % to 0 atomic % in the thickness direction (this means that the i-type a-SiGe semiconductor layer has a graded band gap), reference numeral 5' indicates an i-type semiconductor layer, and reference numeral 4' indicates a p-type semiconductor layer formed of a p-type microcrystalline silicon germanium film (that is, a p-type uc-SiGe film). The photovoltaic element shown in FIG. 26 further contains an i-type a-SiGe semiconductor layer 6 with a graded band gap and another i-type a-SiGe semiconductor layer 7 with a graded band gap which is different from that of the i-type a-SiGe semiconductor layer 6 between the n-type semiconductor layer 1' and the i-type semiconductor layer 3'. This configuration is thus different from that of the photovoltaic element shown in FIG. 25.

Each of the proposals mentioned in FIGS. 24 to 26 is of the technique wherein separation of photocarriers due to their drift is facilitated by the action of a layer with a continuously graded band gap, whereby the photocarriers are prevented from recombining.

The present inventors have studied these proposals. As a result, it has been found that the technique according to any of these proposals is effective in improving the initial photoelectric conversion efficiency of an amorphous silicon photovoltaic cell to a certain extent but there still remains a problem in that when the photovoltaic cell is continuously irradiated with light over a long period of time, the photoelectric conversion efficiency is liable to deteriorate, as in the case of an amorphous silicon photovoltaic cell without having such a graded band gap layer as above described.

SUMMARY OF THE INVENTION

The present invention is aimed at eliminating the foregoing problem in the prior art and providing an improved amorphous silicon photovoltaic device which is free of such a problem.

Another object of the present invention is to provide an improved photovoltaic device which can be used as a daily power supply source.

A further object of the present invention is to provide an improved photovoltaic device which stably and continuously exhibits improved photovoltaic characteristics without deteriorating even upon repeated use under the irradiation of light over a long period of time.

A still further object of the present invention is to provide an improved photovoltaic device which exhibits an improved initial photoelectric conversion efficiency, and which still stably and continuously exhibits, even after repeated use over a long period of time, a satisfactory photoelectric conversion efficiency which is quite similar to the initial photoelectric conversion efficiency.

A yet further object of the present invention is to provide an improved photovoltaic device having a specific i-type semiconductor layer structure comprising a specific a-SiGe film with a graded band gap wherein recombination of photocarriers is extremely reduced, and if recombination of the photocarriers should occur, a defect due to such a recombination is not caused, whereby a desirable photoelectric conversion efficiency is stably and continuously provided over a long period of time without being deteriorated by the light irradiation.

DESCRIPTION OF THE INVENTION

Figure 1:
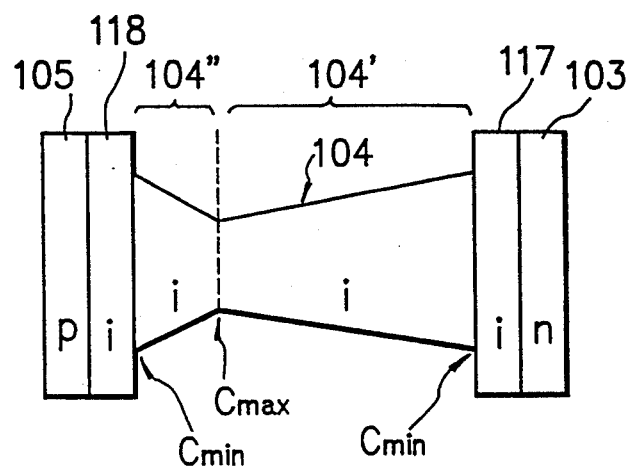
FIG. 1 is a schematic diagram illustrating the profile of the energy band gap in an example of a photovoltaic device according to the present invention.

The present inventors have made extensive studies through experiments, which will be described below, in order to eliminate the foregoing problem in the prior art and in order to attain the above objects.

Particularly, the present inventors have prepared a number of photovoltaic devices while forming a variety of a-Si:H semiconductor films and a plurality of a-SiGe:H films and examined these a-Si:H and a-SiGe:H semiconductor films, aiming at finding a high performance, highly reliable photovoltaic device which effectively attains the above objects. As a result, findings have been obtained in that a particular a-SiGe:H semiconductor film, which excels in photoconductivity and has few defects and which maintains an excellent photoconductivity without being deteriorated even when continuously irradiated with light, can be obtained by properly controlling the stoichimetric ratio between a silicon containing film-forming raw material gas and a germanium containing film-forming raw material gas such that desired thicknesswise composition ratios of the constituent elements are provided, and said a-SiGe:H semiconductor film makes it possible to obtain a desirable photovoltaic device in which photocarrier recombination is extremely reduced, and if recombination of the photocarriers should occur, a defect due to such a recombination is not caused, whereby a satisfactory photoelectric conversion efficiency is stably and continuously provided over a long period of time without being deteriorated by the irradiated light.

The present invention has been accomplished based on these findings obtained through the experimental studies of the present inventors.

The present invention is directed to an improvement in photovoltaic devices with a pin junction semiconductor active layer region comprising a non-single crystalline semiconductor material, and it includes the following three aspects.

A first aspect of the present invention is to provide a photovoltaic device comprising a substrate and a pin junction semiconductor active layer region disposed on said substrate, said pin junction semiconductor active layer region comprising a p-type semiconductor layer composed of a p-type non-single crystalline semiconductor material, an i-type semiconductor layer composed of an i-type non-single crystalline semiconductor material, and an n-type semiconductor layer composed of an n-type non-single crystalline semiconductor material, characterized in that a buffer layer comprising a non-single crystalline silicon semiconductor material substantially free of germanium atoms is interposed between said p-type semiconductor layer and said i-type semiconductor layer, another buffer layer comprising a non-single crystalline silicon semiconductor material substantially free of germanium atoms is interposed between said i-type semiconductor layer and said n-type semiconductor layer, and said i-type semiconductor layer is formed of an amorphous silicon germanium semiconductor material (that is, an a-SiGe semiconductor material) containing the germanium atoms in an amount of 20 to 70 atomic % in the entire region in which the concentration distribution of the germanium atoms in the thickness direction is varied while providing a maximum concentration point.

A second aspect of the present invention is provide a photovoltaic device of a tandem type in which light is to be impinged through the top cell side, said photovoltaic device comprising a substrate, (a) a first pin junction cell disposed on said substrate, and (b) a second pin junction cell disposed on said first pin junction cell (a), said first pin junction cell (a) comprising (a-i) a p-type semiconductor layer composed of a p-type non-single crystalline semiconductor material, (a-ii) an i-type semiconductor layer composed of an i-type non-single crystalline semiconductor material, and (a-iii) an n-type semiconductor layer composed of an n-type non-single crystalline semiconductor material, said second pin junction cell (b) comprising (b-i) a p-type semiconductor layer composed of a p-type non-single crystalline semiconductor material, (b-ii) an i-type semiconductor layer composed of an i-type non-single crystalline semiconductor material, and (b-ill) an n-type semiconductor layer composed of an n-type non-single crystalline semiconductor material, characterized in that said first pin junction cell (a) contains a buffer layer comprising a non-single crystalline silicon semiconductor material substantially fee of germanium atoms interposed between said p-type semiconductor layer (a-i) and said i-type semiconductor layer (a-ii) and another buffer layer comprising a non-single crystalline silicon semiconductor material substantially free of germanium atoms interposed between said i-type semiconductor layer (a-ii) and said n-type semiconductor layer (a-iii), and said i-type semiconductor layer (a-ii) of said first pin junction cell (a) is formed of an amorphous silicon germanium semiconductor material (that is, an a-SiGe semiconductor material) containing the germanium atoms in an amount of 20 to 70 atomic % in the entire region in which the concentration distribution of the germanium atoms in the thickness direction is varied while providing a maximum concentration point.

A third aspect of the present invention is provide a photovoltaic device of a triple cell type in which light is to be impinged through the top cell side, said photovoltaic device comprising a substrate, (a) a first pin junction cell disposed on said substrate, and (b) a second pin junction cell disposed on said first pin junction cell (a), and (c) a third pin junction cell disposed on said second pin junction cell (b), said first pin junction cell (a) comprising (a-i) a p-type semiconductor layer composed of a p-type non-single crystalline semiconductor material, (a-ii) an i-type semiconductor layer composed of an i-type non-single crystalline semiconductor material, and (a-ill) an n-type semiconductor layer composed of an n-type non-single crystalline semiconductor material, said second pin junction cell (b) comprising (b-i) a p-type semiconductor layer composed of a p-type non-single crystalline semiconductor material, (b-ii) an i-type semiconductor layer composed of an i-type non-single crystalline semiconductor material, and (b-ill) an n-type semiconductor layer composed of an n-type non-single crystalline semiconductor material, and said third pin junction cell (c) comprising (c-i) a p-type semiconductor layer composed of a p-type non-single crystalline semiconductor material, (c-ii) an i-type semiconductor layer composed of an i-type non-single crystalline semiconductor material, and (c-ill) an n-type semiconductor layer composed of an n-type non-single crystalline semiconductor material, characterized in that said first pin junction cell (a) contains (a-iv) a buffer layer comprising a non-single crystalline silicon semiconductor material substantially free of germanium atoms interposed between said p-type semiconductor layer (a-i) and said i-type semiconductor layer (a-ii) and (a-v) a buffer layer comprising a non-single crystalline silicon semiconductor material substantially free of germanium atoms interposed between said i-type semiconductor layer (a-ii) and said n-type semiconductor layer (a-iii), and said i-type semiconductor layer (a-ii) of said first pin junction cell (a) is formed of an amorphous silicon germanium semiconductor material (that is, an a-SiGe semiconductor material) containing the germanium atoms in an amount of 20 to 70 atomic % in the entire region in which the concentration distribution of the germanium atoms in the thickness direction is varied while providing a maximum concentration point; said second pin junction cell (b) contains (b-iv) a buffer layer comprising a non-single crystalline silicon semiconductor material substantially free of germanium atoms interposed between said p-type semiconductor layer (b-i) and said i-type semiconductor layer (b-ii) and (b-v) a buffer layer comprising a non-single crystalline silicon semiconductor material substantially free of germanium atoms interposed between said i-type semiconductor layer (b-ii) and said n-type semiconductor layer (b-ill), and said i-type semiconductor layer (b-ii) of said second pin junction cell (b) is formed of an amorphous silicon germanium semiconductor material (that is, an a-SiGe semiconductor material) containing the germanium atoms in an amount of 20 to 70 atomic % in the entire region in which the concentration distribution of the germanium atoms in the thickness direction is varied while providing a maximum concentration point.

In the following, description will be made of the experiments conducted by the present inventors.

Experiment 1

Figure 3:
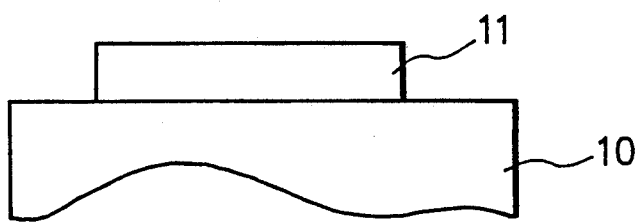
FIG. 3 is a schematic cross section view of a specimen used in Experiment 1 which will be later described.
Figure 4:
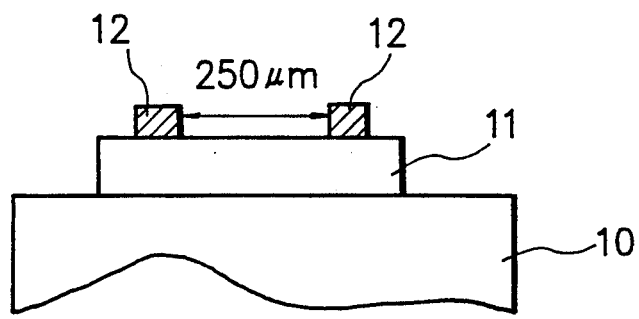
FIG. 4 is a schematic cross section view of an article comprising the specimen shown in FIG. 4 which is provided with a pair of electrodes, used in Experiment 1 which will be later described.

In this experiment, there were prepared a plurality of specimens of the configuration shown in FIG. 3, each comprising an a-SiGe:H film 11 formed on a substrate 10, and a plurality of samples of the configuration shown in FIG. 4.

The specimen shown in FIG. 3 was used for measurement of the band gap of the a-SiGe:H film 11.

The sample shown in FIG. 4 comprises the specimen shown in FIG. 3 and a pair of electrodes 12 disposed on the a-SiGe:H film 11 of the specimen.

The sample shown in FIG. 4 was used for measurement of the photoconductivity of the a-SiGe:H film 11.

Figure 5:
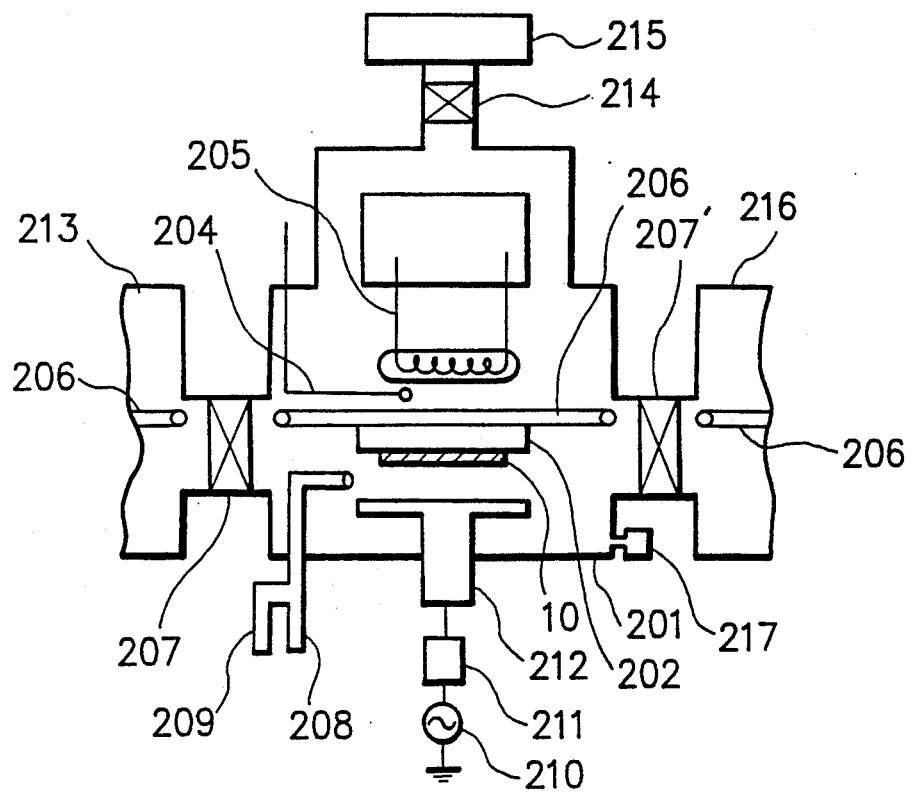
FIG. 5 is a schematic explanatory view of a film-forming apparatus used for the preparation of a photovoltaic device according to the present invention.

Each specimen was prepared by using a plasma CVD apparatus of the constitution shown in FIG. 5.

Description will now be made of the plasma CVD apparatus shown in FIG. 5. In FIG. 5, reference numeral 201 indicates a film-forming chamber. Reference numeral 202 indicates a substrate holder for holding a substrate 10 (see, FIG. 3) on which a film is to be formed. Reference numeral 206 indicates a transportation mechanism which serves to transport an assembly comprising the substrate holder 202 and the substrate 10 placed on the substrate holder while supporting the assembly thereon. The transportation mechanism 206 is designed such that it can move not only in the horizontal direction but also in the upward and downward directions. Reference numeral 205 indicates a heater which serves to heat the substrate 10. Reference numeral 204 indicates a thermocouple positioned in the film-forming chamber 201. The thermocouple 204 serves to detect the temperature of the substrate 10.

Reference numeral 213 indicates a load lock chamber which is connected to the film-forming chamber 201 through a gate valve 207. The gate valve 207 is designed such that the assembly comprising the substrate holder 202 and the substrate 10 placed on the substrate holder can be transported from the load lock chamber 213 to the film-forming chamber 201 or from the latter to the former under a vacuum condition.

The film-forming chamber 201 is provided with an exhaust pipe which is connected through a throttle valve 214 to a vacuum pump 215. The film-forming chamber 201 is provided with a pressure gage which serves to monitor the inner pressure of the film-forming chamber. The inner pressure of the film-forming chamber 201 can be maintained at a predetermined vacuum by adjusting the opening of the throttle valve 214 while monitoring via the pressure gage 217. Each of reference numerals 208 and 209 indicates a gas feed pipe which serves to introduce a film-forming raw material gas into the film-forming chamber 201. Each of the gas feed pipes 208 and 209 extends to a gas reservoir (not shown). Reference numeral 212 indicates a cathode electrode positioned in the film-forming chamber 201. The cathode electrode 212 is electrically connected to a high frequency power source 210 through a matching box 211. High frequency power from the high frequency power source 210 is applied through the matching box 211 to the cathode electrode 212 during film formation.

Reference numeral 216 indicates an additional film-forming chamber which is used during forming of an additional film on a film formed in the film-forming chamber 201. The film-forming chamber 216 is connected to the film-forming chamber 201 through a gate valve 207'. The constitution of the film-forming chamber 216 is the same as that of the film-forming chamber 201.

The formation of an a-SiGe:H film 11 on a substrate 10 (see, FIG. 3) using the plasma CVD apparatus shown in FIG. 5 is conducted, for example, in the following manner. That is, a Si-imparting raw material gas, a Ge-imparting raw material gas and $H_2$ gas are introduced through the gas feed pipes 208 and 209 while mixing with each other into the reaction space of the film-forming chamber 201 having the substrate 10 arranged therein, followed by applying high frequency power from the high frequency power source 210 into the reaction space through the cathode 212, to thereby produce plasma in the reaction space, wherein the gases introduced are decomposed to cause the formation of an a-SiGe:H film on the substrate maintained at a predetermined temperature. In the case of forming an a-SiGe film with a different composition ratio between the Si and Ge atoms, the Si-imparting raw material gas is introduced constantly at a fixed flow rate, wherein the Ge-imparting raw material gas is introduced while varying the flow rate therefor based on an analytical curve which has been provided in advance.

(1) Preparation of specimen of the configuration shown in FIG. 3 and measurement of band gap There were prepared a plurality of specimens each having the configuration shown in FIG. 3 following the above film-forming procedure using the film-forming apparatus shown in FIG. 5.

There were provided a plurality of commercially available No. 7059 glass plates each of 2 inches×2 inches in size and 0.8 mm in thickness (produced by Corning Glass Works Company) as the substrate 10.

The glass plates as the substrate 10 were fixed to the substrate holder 202 on the transportation mechanism 206 in the load lock chamber 213 in such a way as shown in FIG. 5 wherein the surface of the substrate 10 faces downward. Then, the load lock chamber 213 was evacuated to a vacuum of less than $1 \times 10^{-5}$ Torr by operating a vacuum pump (not shown) for the load lock chamber 213. The film-forming chamber 201 was also evacuated to a vacuum of less than $1 \times 10^{-5}$ by operating the vacuum pump 215. The gate valve 207 was opened, and the substrate holder 202 having the glass plates arraned thereon was transferred into the film-forming chamber 201 by means of the transportation mechanism 206 under vacuum conditions. Then, the gate valve 207 was closed. The substrate holder 202 was moved so as to provide a distance of 30 mm between the surfaces of the glass substrate plates 10 and the surface of the cathode electrode 212 by operating the transportation mechanism 206. The glass substrate plates 10 were heated to and maintained at 250° C. by actuating the heater 205. Then, $Si_2H_6$ gas (as a raw material gas A), $H_2$ gas (as a raw material gas B), and $GeH_4$ gas (as a raw material gas C) were introduced into the reaction space of the film-forming chamber 201, wherein the respective flow rates of the $Si_2H_6$ gas and the $H_2$ gas were maintained constant at 10 sccm and 500 sccm, while the $GeH_4$ gas was introduced at a different flow rate as shown in Table 1 in each case. The inner pressure of the film-forming chamber 201 was adjusted to 1.1 Torr by regulating the opening of the throttle valve 214. After the flow rate of each of the raw material gases became stable at the predetermined flow rate, the high frequency power source 210 was switched on to apply a high frequency power of 15 W (13.56 MHz) to the cathode electrode 212, wherein plasma was produced to cause the formation of an a-SiGe:H film on each of the glass substrate plates 10. Thereafter, the high frequency power source 210 was switched off. At the same time, the heater 205 was also switched off. And the introduction of the gases was stopped. Next, the operation of the vacuum pump 215 was stopped. Then, the inner pressure of the film-forming chamber 201 was returned to normal pressure. The substrate holder 202 having the glass substrates each having the a-SiGe:H film thereon was transferred back into the load lock chamber 213, wherein the glass substrates were cooled to room temperature. The glass substrates 10 each having the a-SiGe:H film thereon were then taken out from the load lock chamber 213. In this way, there were obtained nine kinds of specimens (Samples Nos. 1-1 to 1-9), each kind comprising an a-SiGe:H film with a different composition ratio as to the Ge. The film forming conditions employed in each case are collectively shown in Table 1.

Each of the specimens obtained was subjected to measurement of optical band gap ($Eg^{opt}$) using a commercially available visible-ultraviolet spectrophotometer. The measured results are collectively shown in Table 1.

In addition, each of the specimens was subjected to elemental analysis by Auger electron spectroscopy to examine the composition ratio of the Ge in the film. In this case, it was found that the constituent elements other than the Ge are silicon (Si) and hydrogen (H).

The results obtained are collectively shown in Table 1.

(2) Preparation of sample having the configuration shown in FIG. 4 and measurement of photoconductivity There were prepared a plurality of samples for the measurement of photoconductivity, each having the configuration shown in FIG. 4, using the remaining nine kinds of specimens obtained in the above.

In each case, on the surface of the specimen there was formed a pair of 1000 Å thick Cr electrodes of 250 μm in width and 1 cm in length using a commercially available electron beam evaporation apparatus (trademark name: FBX-6D, produced by ULBAC Company).

Each of the samples thus obtained was placed on a sample table provided with a temperature controlling mechanism. Then, each sample was maintained at 25° C., and irradiated with AM 1.5 light from a solar cell simulator provided with a Xenon lamp at an intensity of 100 mW/cm$^2$, to thereby measure its photoconductivity $\sigma(0)$. Then, after the sample was continuously irradiated with said light for 100 hours, its photoconductivity $\sigma(100)$ was measured.

Based on the resultant $\sigma(0)$ and $\sigma(100)$, there was obtained a value of $\sigma(100)/\sigma(0)$. The value obtained was a physical quantity indicating a deterioration factor.

For each of the samples, there was obtained a value of $\sigma(100)/\sigma(0)$. The resultant values are graphically shown in relation to the composition ratio of the Ge (Ge/(GE+Si+H) obtained in the above (1) in FIG. 6.

Figure 6:
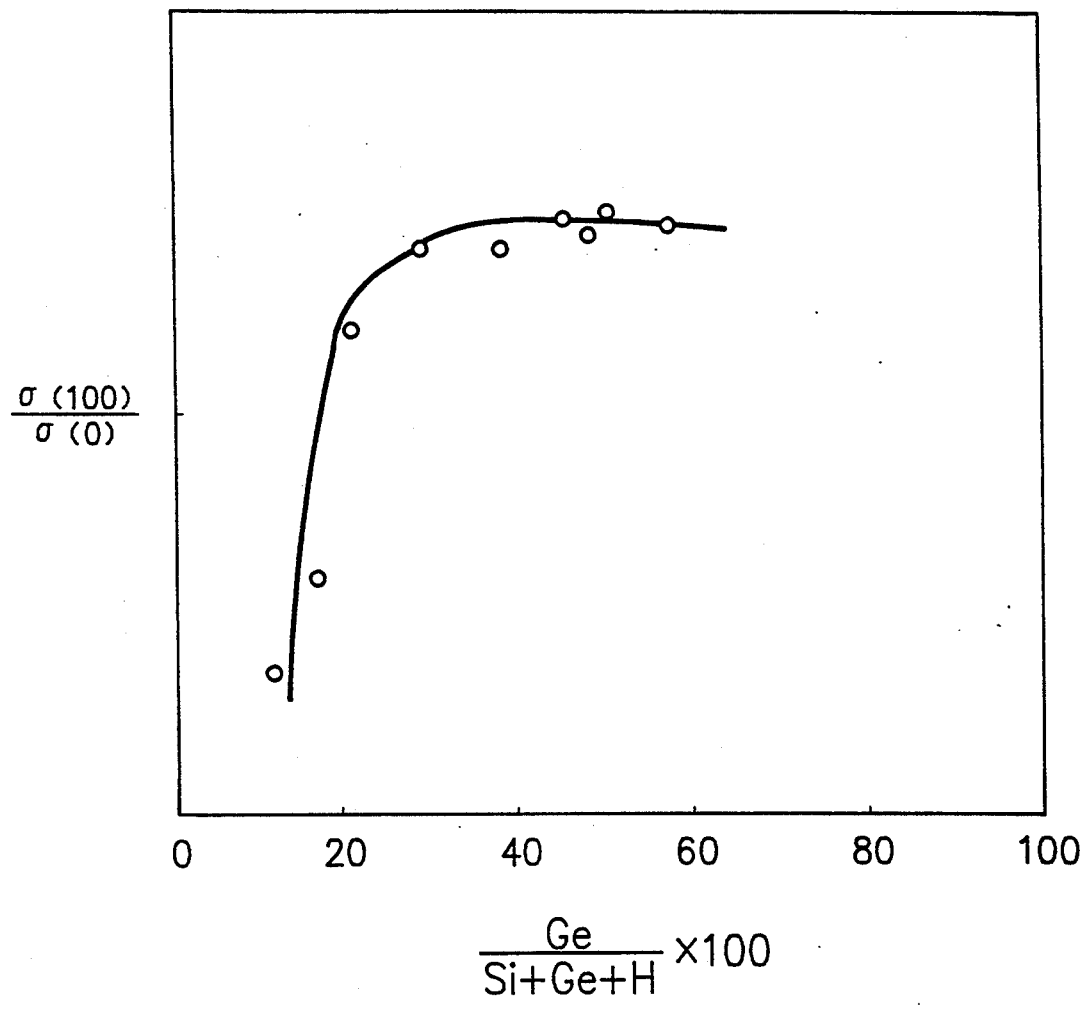
FIG. 6 shows a graph illustrating the interrelation between the content of Ge atoms in a film and the rate of degradation in photoconductivity of the film on the basis of the results obtained in Experiment 1 which will be later described.

As apparent from FIG. 6, the films for which the value of $\sigma(100)/\sigma(0)$ is relatively large is low in light deterioration and when the film is of 20 atomic % or more in composition ratio for the Ge, it is stable against irradiation of light, and particularly, when the film is of 30 atomic % or more in composition ratio of the Ge, it is markedly stable against irradiation of light.

Experiment 2

Figure 7:
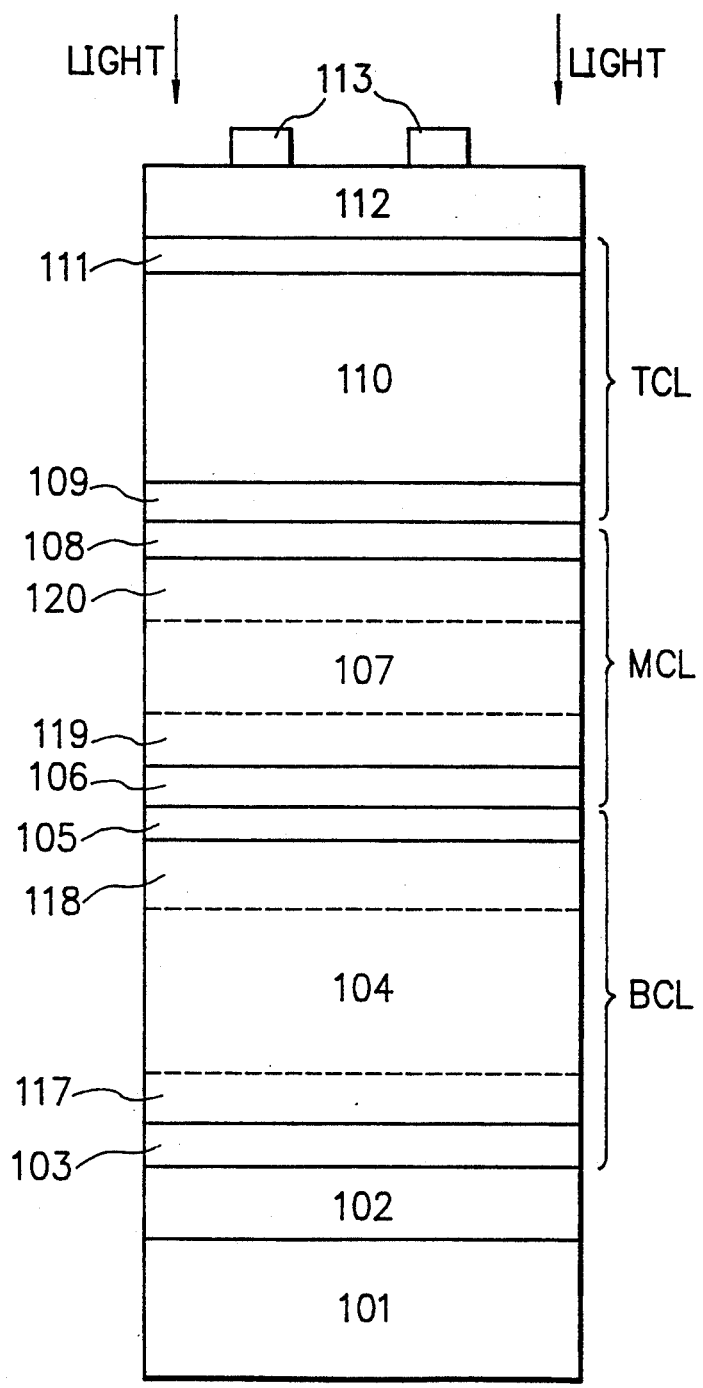
FIG. 7 is a schematic cross section view of a photovoltaic device used as a specimen in Experiment 2 which will be later described.

In this experiment, there were prepared a plurality of photovoltaic device samples of the configuration shown in FIG. 7, each having a semiconductor active layer region composed of a non-single crystalline SiGe:H semiconductor material containing germanium atoms (Ge) with a different composition ratio, in order to observe influences caused by the difference in composition ratio for the Ge in the photovoltaic device.

The photovoltaic device shown in FIG. 7 is of a triple cell type comprising three photovoltaic cells, namely, a bottom cell (BCL), a middle cell (MCL) and a top cell (TCL), tandem stacked on a substrate.

In FIG. 7, reference numeral 101 indicates a substrate. Reference numeral 102 indicates a lower electrode disposed on the substrate 101. On the lower electrode 102, there are stacked a bottom cell (BCL), a middle cell (MCL), and a top cell (TCL) in this order from the side of the substrate 101.

The BCL comprises an n-type semiconductor layer 103, an i-type buffer layer 117, an i-type semiconductor layer 104, an i-type buffer layer 118, and a p-type semiconductor layer 105. The MCL comprises an n-type semiconductor layer 106, an i-type buffer layer 119, an i-type semiconductor layer 107, an i-type buffer layer 120, and a p-type semiconductor layer 108. The TCL comprises an n-type semiconductor layer 109, an i-type semiconductor layer 110, and a p-type semiconductor layer 111.

Reference numeral 112 indicates a transparent and conductive electrode which is disposed on the p-type semiconductor layer 111. Reference numeral 113 indicates a collecting electrode which is disposed on the transparent and conductive electrode 112.

Each photovoltaic device sample was prepared in the following manner, wherein the three constituent cells (that is, the BCL, MCL and TCL) were respectively formed by using the film-forming apparatus shown in FIG. 5.

That is, there were firstly provided 49 stainless steel plates of 50 mm×50 mm in size as the substrate 101.

On each of the stainless plates as the substrate 101, there was formed an Ag thin film of about 1000 Å in thickness as the lower electrode 102 by using a conventional sputtering apparatus, wherein an Ag target was sputtered using Ar gas as the sputtering gas.

The substrate having the Ag thin film formed thereon was introduced into the load look chamber 213 of the film-forming apparatus shown in FIG. 5, wherein it was fixed to the substrate holder 202 on the transportation mechanism 206 as shown in FIG. 5 wherein the surface of the substrate (that is, the surface of the Ag thin film as the lower electrode 102 in this case) faces downward.

Then, the load lock chamber 213 was evacuated to a vacuum of less than $1\times10^{-5}$ Torr by operating a vacuum pump (not shown) for the load lock chamber 213. In this case, the film-forming chamber 201 was evacuated to and maintained at a vacuum of less than $1\times10^{-5}$ Torr by operating the vacuum pump 215.

After the inner pressures of the two chambers became substantially identical, the gate valve 207 was opened and the substrate holder 202 having the substrate arranged thereon was transferred into the film-forming chamber 201 by means of the transportation mechanism 206 under vacuum conditions. Thereafter, the gate valve 207 was closed.

The substrate holder 202 was moved so as to provide a distance of 30 mm between the surface of the Ag thin film on the substrate and the surface of the cathode electrode 212 by operating the transportation mechanism 206.

1. Formation of the BCL 1-(1). Formation of the n-type semiconductor layer 103

The substrate was heated so that the temperature of the surface thereof became 200° C. by actuating the heater 205. The surface of the substrate was maintained at this temperature. Thereafter, Si$_2$H$_6$ gas, H$_2$ gas, and PH$_3$ gas diluted to 1% with H$_2$ gas (hereinafter referred to as PH$_3$/H$_2$ gas (1%)) were introduced into the reaction space of the film-forming chamber 201 at respective flow rates of 10 sccm, 500 sccm, and 12 sccm through the gas feed pipes 208 and 209. The inner pressure of the film-forming chamber 201 was controlled to 1.5 Torr by adjusting the opening of the throttle valve 214. After the three gases became stable at the above respective flow rates, the high frequency power source 210 was switched on to apply a high frequency power of 20 W (13.56 MHz) to the cathode electrode 212 wherein plasma was produced to cause the formation of an n-type microcrystalline Si:H:P film (that is, an n-type μc-Si:H:P film) on the surface of the Ag thin film as the lower electrode 102 of the substrate. The μc-Si:H:P film was formed at a thickness of 200 Å. Thus, there was formed the n-type semiconductor layer 103.

After the formation of the n-type semiconductor layer 103 was completed, the introduction of the above gases was terminated, and at the same time, the application of the high frequency power was terminated. Then, the film-forming chamber 201 was evacuated to a vacuum of less than $1 \times 10^{-5}$ Torr.

The film-forming chamber 216 was also evacuated to and maintained at a vacuum of less than $1 \times 10^{-5}$ Torr by operating the vacuum pump (not shown) for the film-forming chamber 216. After the inner pressures of the film-forming chambers 201 and 216 became substantially identical, the Gate valve 207' was opened and the substrate holder 202 having the substrate thereon was transferred into the film-forming chamber 216 by means of the transportation mechanism 206 under vacuum condition. Thereafter, the gate valve 207' was closed.

1-(2). Formation of the buffer layer 117

In the film-forming chamber 216, the substrate was heated so that the temperature of the surface thereof became 200° C. by actuating the heater 205. The surface of the substrate was maintained at this temperature. Then, the film-forming procedures of forming the n-type semiconductor layer 103 in the above 1-(1) were repeated, except that the film-forming conditions were changed as follows:

gases used & flow rate:
$Si_2H_6$ gas: 10 sccm
$H_2$ gas: 500 sccm
inner pressure: 1.2 Torr
high frequency power applied: 15 W Thus, there was formed a non-doped a-Si:H film of 200 Å in thickness as the buffer layer 117 on the n-type semiconductor layer 103.

1-(3). Formation of the i-type semiconductor layer 104

After the formation of the buffer layer 117 was completed, the application of the high frequency power was suspended. Then, the procedures of forming the buffer layer 117 in the above 1-(2) were repeated in the film-forming chamber 216, except that $GeH_4$ gas was additionally introduced into the reaction space of the film-forming chamber 216 at a selected flow rate in the range of from 0.5 sccm to 18 sccm (see, Table 2), to thereby form a 2800 Å thick non-doped a-SiGe:H film as the i-type semiconductor layer 104 on the buffer layer 117.

1-(4). Formation of the buffer layer 118

After the formation of the i-type semiconductor layer 104 was completed, the introduction of the $GeH_4$ gas was terminated, and the application of the high frequency power was suspended. Then, the procedures of forming the buffer layer 117 in the above 1-(2) were repeated in the film-forming chamber 216 to thereby form a 200 Å thick non-doped a-Si:H film as the buffer layer 118 on the i-type semiconductor layer 104.

1-(5). Formation of the p-type semiconductor layer 105

After the formation of the buffer layer 118 was completed, the introduction of the $Si_2H_6$ gas and $H_2$ gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the film-forming chambers 201 and 216 became substantially identical, the gate valve 207' was opened, and the substrate holder 202 having the substrate thereon was transferred into the film-forming chamber 201 by means of the transportation mechanism 206 under vacuum conditions. Thereafter, the gate valve 207' was closed.

The substrate was heated so that the temperature of the surface thereof became 230° C. by actuating the heater 205. The surface of the substrate was maintained at this temperature. Thereafter, $SiH_4$ gas, $H_2$ gas, and $BF_3$ gas diluted to 2% with $H_2$ gas (hereinafer referred to as $BF_3/H_2$ gas (2%)) were introduced into the reaction space of the film-forming chamber 201 at respective flow rates of 5 sccm, 500 sccm, and 5 sccm through the gas feed pipes 208 and 209. The inner pressure of the film-forming chamber 201 was controlled to 1.5 Torr by adjusting the opening of the throttle valve 214. After the three gases became stable at the above respective flow rates, the high frequency power source 210 was switched on to apply a frequency power of 150 W (13.56 MHz) to the cathode electrode 212, wherein plasma was produced to cause the formation of a p-type microcrystalline Si:H:B film (that is, a p-type $\mu$c-Si:H:B film) as the p-type semiconductor layer 105 on the buffer layer 118. In this case, the uc-Si:H:B film was formed to a thickness of 100 Å.

Thus, there was formed a bottom photovoltaic cell as the BCL having an i-type semiconductor region of 3200 Å in thickness.

2. Formation of the MCL 2-(1). Formation of the n-type semiconductor layer 106

After the formation of the p-type semiconductor layer 105 was completed, the introduction of the $SiH_4$ gas, $H_2$ gas, and $BF_3/H_2$ gas (2%) was terminated. At the same time, the application of the high frequency power was terminated. The film-forming chamber 201 was evacuated to a vacuum of less than $1 \times 10^{-5}$ Torr. Then, the procedures of forming the n-type semiconductor layer 103 in the above 1-(1) were repeated to thereby form a 100 Å thick uc-Si:H:P film as the n-type semiconductor layer 106 on the p-type semiconductor layer 105.

2-(2). Formation of the buffer layer 119

After the formation of the n-type semiconductor layer 106 was completed, the introduction of the $Si_2H_6$ gas, $H_2$gas, and $PH_3/H_2$ gas (1%) was terminated, and at the same time, the application of the high frequency power was terminated. Then, the film-forming chamber 201 was evacuated to a vacuum of less than $1 \times 10^{-5}$ Torr. The film-forming chamber 216 was also evacuated to and maintained at a vacuum of less than $1 \times 10^{-5}$ Torr by operating the vacuum pump (not shown) for the film-forming chamber 216. After the inner pressures of the film-forming chambers 201 and 216 became substantially identical, the gate valve 207' was opened and the substrate holder 202 having the substrate thereon was transferred into the film-forming chamber 216 by means of the transportation mechanism 206 under vacuum conditions. Thereafter, the gate valve 207' was closed.

In the film-forming chamber 216, the procedures of forming the buffer layer 117 in the above 1-(2) were repeated to thereby form a 100 Å thick non-doped a-Si:H film as the buffer layer 119 on the n-type semiconductor layer 106.

2-(3). Formation of the i-type semiconductor layer 107

After the formation of the buffer layer 119 was completed, the application of the high frequency power was suspended. Then, the procedures of forming the buffer layer 119 in the above 2-(2) were repeated in the film-forming chamber 216, except that $GeH_4$ gas was additionally introduced into the reaction space of the film-forming chamber 216 at a selected flow rate in the range of from 0.5 sccm to 18 sccm (see, Table 2), to thereby form a 600 Å thick non-doped a-SiGe:H film as the i-type semiconductor layer 107 on the buffer layer 119.

2-(4). Formation of the buffer layer 120

After the formation of the i-type semiconductor layer 107 was completed, the introduction of the GeH$_4$ gas was terminated, and the application of the high frequency power was suspended. Then, the procedures of forming the buffer layer 119 in the above 2-(2) were repeated in the film-forming chamber 216 to thereby form a 100 Å thick non-doped a-Si:H film as the buffer layer 120 on the i-type semiconductor layer 107.

2-(5). Formation of the p-type semiconductor layer 108

After the formation of the buffer layer 120 was completed, the introduction of the Si$_2$H$_6$ gas and H$_2$ gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the film-forming chambers 201 and 216 became substantially identical, the gate valve 207' was opened, and the substrate holder 202 having the substrate thereon was transferred into the film-forming chamber 201 by means of the transportation mechanism 206 under vacuum condition. Thereafter, the gate valve 207' was closed.

The substrate was heated so that the temperature of the surface thereof became 200° C. by actuating the heater 205. The surface of the substrate was maintained at this temperature. Then, the procedures of forming the p-type semiconductor layer 105 in the above 1-(5) were repeated to thereby form a 100 Å thick μc-Si:H:B film as the p-type semiconductor layer 108 on the buffer layer 120.

Thus, there was formed a middle photovoltaic cell as the MCL having an i-type semiconductor region of 800 Å in thickness.

3. Formation of the TCL 3-(1). Formation of the n-type semiconductor layer 109

After the formation of the p-type semiconductor layer 108 was completed, the introduction of the SiH$_4$ gas, H$_2$ gas, and BF$_3$/H$_2$ gas (2%) was terminated. At the same time, the application of the high frequency power was terminated. The film-forming chamber 201 was evacuated to a vacuum of less than $1 \times 10^{-5}$ Torr.

Then, the procedures of forming the n-type semiconductor layer 103 in the above 1-(1) were repeated to thereby form a 100 Å thick μc-Si:H:P film as the n-type semiconductor layer 109 on the p-type semiconductor layer 108.

3-(2). Formation of the i-type semiconductor layer 110

After the formation of the n-type semiconductor layer 106 was completed the introduction of the Si$_2$H$_6$ gas, H$_2$ gas, and PH$_3$/H$_2$ gas (1%) was terminated, and at the same time, the application of the high frequency power was terminated. Then, the film-forming chamber 201 was evacuated to a vacuum of less than $1 \times 10^{-5}$ Torr. The film-forming chamber 216 was also evacuated to and maintained at a vacuum of less than $1 \times 10^{-5}$ Torr by operating the vacuum pump (not shown) for the film-forming chamber 216. After the inner pressures of the film-forming chambers 201 and 216 became substantially identical the gate valve 207' was opened, and the substrate holder 202 having the substrate thereon was transferred into the film-forming chamber 216 by means of the transportation mechanism 206 under vacuum conditions. Thereafter, the gate valve 207' was closed.

Then, the substrate was heated so that the temperature of the surface thereof became 250° C. by actuating the heater. The surface of the substrate was maintained at this temperature. Thereafter, Si$_2$H$_6$ gas and H$_2$ gas were introduced into the reaction space of the film-forming chamber 216 at respective flow rates of 10 sccm and 500 sccm. The inner pressure of the film-forming chamber 216 was controlled to 1.1 Torr by adjusting the opening of the throttle valve. After the two gases became stable at the above respective flow rates, the high frequency power source 210 was switched on to apply a high frequency power of 15 W (13.56 MHz) to the cathode electrode 212. By this, there was formed a 600 Å thick non-doped a-Si:H film as the i-type semiconductor layer 110 on the n-type semiconductor layer 109.

3-(3). Formation of the p-type semiconductor layer 111

After the formation of the i-type semiconductor layer 110 was completed, the introduction of the Si$_2$H$_6$ gas and H$_2$ gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the film-forming chambers 201 and 216 became substantially identical, the gate valve 207' was opened, and the substrate holder 202 having the substrate thereon was transferred into the film-forming chamber 201 by means of the transportation mechanism 206 under vacuum conditions. Thereafter, the gate valve 207' was closed.

The substrate was heated so that the temperature of the surface thereof became 230° C. The surface of the substrate was maintained at this temperature. Then, the procedures of forming the p-type semiconductor layer 105 in the above 1-(5) were repeated to thereby form a 100 Å thick μc-Si:H:B film as the p-type semiconductor layer 111 on the i-type semiconductor layer 110.

Thus, there was formed a top photovoltaic cell as the TCL.

After the formation of the TCL was completed, the high frequency power source 210 was switched off. At the same time, the heater 205 was also switched off. And the introduction of the gases was stopped. Next, the operation of the vacuum pump was stopped. Then, the inner pressure of the film-forming chamber 201 was returned to normal pressure. The substrate having the BCL, MCL, and TCL formed thereon was transferred into the load lock chamber 213 by means of the transportation mechanism 206, wherein it was cooled to room temperature. The substrate was then taken out from the load lock chamber.

Thereafter, the substrate having rh BCL, MCL, and TCL formed thereon was introduced into a conventional vacuum evaporation apparatus having an evaporation boat containing a mixture composed of fine particles of In and fine particles of Sn with a mixing ratio of 1:1 in terms of weight. The substrate was heated to and maintained at 170° C. The inside of the vacuum evaporation apparatus was evacuated to a vacuum of less than $1 \times 10^{-5}$ Torr. O$_2$ gas was then introduced into the vacuum evaporation apparatus. The inner pressure of the vacuum evaporation apparatus was controlled to about $1 \times 10^{-3}$ Torr. Then, the metal mixture contained in the evaporation boat was evaporated by way of the resistance heating method to deposit an about 700 Å thick ITO film as the transparent and conductive electrode 112 on the p-type semiconductor layer 111 of the TCL. After the substrate was cooled to room temperature, it was taken out from the vacuum evaporation apparatus.

A mask pattern for the formation of a collecting electrode was then arranged on the surface of the previously formed ITO film. The resultant was introduced into a conventional vacuum evaporation device, wherein an about 0.8 μm thick Ag film was deposited by way of the resistance heating method, to thereby form a comb-shaped collecting electrode as the collecting electrode 113.

Thus, there was obtained a triple cell type photovoltaic device of the configuration shown in FIG. 7.

The above procedures of forming the triple cell type photovoltaic device were repeated 49 times wherein the formation of the i-type semiconductor layer 104 comprising a-SiGe:H film and the formation of the i-type semiconductor layer 107 comprising a-SiGe:H film were conducted by changing the flow rate of the GeH$_4$ gas used to those described in Table 3.

Thus, there were obtained 49 kinds of triple cell type photovoltaic devices (Element Samples Nos. 1 to 49).

As for each of Element Samples Nos. 1 to 49, deterioration factor was observed in the following manner.

(i). The current/voltage characteristics including open-circuit voltage (Voc) and short-circuit current (Isc) were measured by a conventional method, wherein AM-1.5 light was irradiated to the element sample through its transparent and conductive electrode 113 side with an intensity of 100 mW/cm$^2$. There was obtained an initial photoelectric conversion efficiency $\eta_o$ based on the measured results.

(ii) The element sample was placed on a sample table provided with a temperature controlling mechanism. The element sample was maintained at 25° C., and AM-1.5 light was continuously irradiated to the element sample through its transparent and conductive electrode 112 side with an intensity of 100 mW/cm$^2$ for 500 hours. The current/voltage characteristics including open-circuit voltage (Voc) and short-circuit current (Isc) were measured by a conventional method. There was obtained a photoelectric conversion efficiency $\eta$ based on the measured results.

Based on the value of $\eta_o$ obtained in the above (i) and the value of obtained in the above (ii), there was obtained a relative value of $(\eta_o - \eta)/\eta_o$ in terms of a physical quantity indicating a deterioration factor.

The above evaluation was conducted for each of the 49 element samples (that is, Element Samples Nos. 1 to 49).

The results obtained are collectively shown in Table 3.

From the results shown in Table 3, it is understood that in the case when the i-type semiconductor layer of each of the bottom and middle photovoltaic cells in a triple cell type photovoltaic device is formed of an a-SiGe:H film formed under the condition shown in rows 2-3, 2-4, or 2-5 in Table 2, the initial photoelectric conversion efficiency is relatively improved and the deterioration factor upon repeated light irradiation over a long period of time is markedly reduced.

Experiment 3

Figure 8:
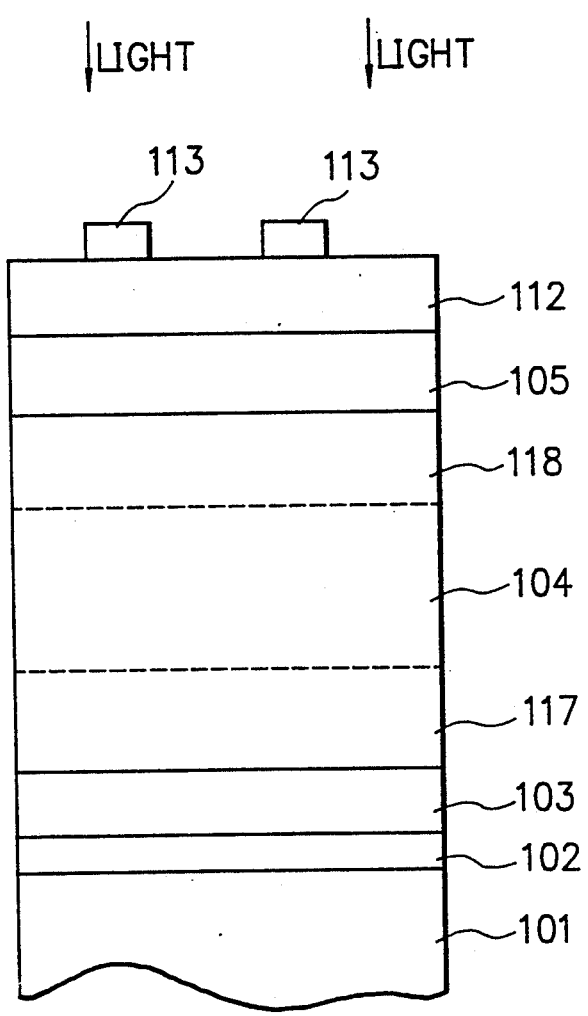
FIG. 8 is a schematic cross section view of a photovoltaic device used as a specimen in Experiment 3 which will be later described.

In this experiment, there were prepared a plurality of photovoltaic device samples of the configuration shown in FIG. 8, each having a semiconductor active layer region composed of a non-single crystalline SiGe:H semiconductor material containing germanium atoms (Ge) with a different composition ratio in order to observe influences caused due to the difference in composition ratio for the Ge in the photovoltaic device.

The photovoltaic device shown in FIG. 8 is of a single cell type.

In FIG. 8, reference numeral 101 indicates a substrate. Reference numeral 102 indicates a lower electrode disposed on the substrate 101. On the lower electrode 102, there is disposed a single photovoltaic cell.

The single photovoltaic cell comprises an n-type semiconductor layer 103, an i-type buffer layer 117, an i-type semiconductor layer 104, an i-type buffer layer 118, and a p-type semiconductor layer 105.

Reference numeral 112 indicates a transparent and conductive electrode which is disposed on the p-type semiconductor layer 111. Reference numeral 113 indicates a collecting electrode which is disposed on the transparent and conductive electrode 112.

Each photovoltaic device sample was prepared in the following manner, wherein the single photovoltaic cell was formed by using the film-forming apparatus shown in FIG. 5.

That is, there were firstly provided a plurality of stainless steel plates of 50 mm × 50 mm in size as the substrate 101.

On each of the stainless plates as the substrate 101, there was formed an Ag thin film of about 1000 Å in thickness as the lower electrode 103 by using a conventional sputtering apparatus, wherein an Ag target was sputtered using Ar gas as the sputtering gas.

The substrate having the Ag thin film formed thereon was introduced into the load lock chamber 213 of the film-forming apparatus shown in FIG. 5, wherein it was fixed to the substrate holder 203 on the transportation mechanism 206 in the way as shown in FIG. 5 wherein the surface of the substrate (that is, the surface of the Ag thin film as the lower electrode 102 in this case) faces downward.

Then, the load lock chamber 213 was evacuated to a vacuum of less than $1 \times 10^{-5}$ Torr by operating a vacuum pump (not shown) for the load lock chamber 213. In this case, the film-forming chamber 201 was evacuated to and maintained at a vacuum of less than $1 \times 10^{-5}$ Torr by operating the vacuum pump 215.

After the inner pressures of the two chambers became substantially identical, the gate valve 207 was opened and the substrate holder 202 having the substrate arraned thereon was transferred into the film-forming chamber 201 by means of the transportation mechanism 206 under vacuum conditions. Thereafter, the gate valve 207 was closed.

The substrate holder 202 was moved so as to provide a distance of 30 mm between the surface of the Ag thin film on the substrate and the surface of the cathode electrode 212 by operating the transportation mechanism 206.

Formation of the single photovoltaic cell (1). Formation of the n-type semiconductor layer 103

The substrate was heated so that the temperature of the surface thereof became 200° C. by actuating the heater 205. The surface of the substrate was maintained at this temperature. Thereafter, Si$_2$H$_6$ gas, H$_2$ gas, and PH$_3$ gas diluted to 1% with H$_2$ gas (hereinafer referred to as PH$_3$/H$_2$ gas (1%)) were introduced into the reaction space of the film-forming chamber 201 at respective flow rates of 10 sccm, 500 sccm, and 12 sccm through the gas feed pipes 208 and 209. The inner pressure of the film-forming chamber 201 was controlled to 1.5 Torr by adjusting the opening of the throttle valve 214. After the three gases became stable at the above respective flow rates, the high frequency power source 210 was switched on to apply a high frequency power of 20 W (13.56 MHz) to the cathode electrode 212, wherein plasma was produced to cause the formation of an n-type $\mu$c-Si:H:P film on the surface of the Ag thin film as the lower electrode 102 of the substrate. The $\mu$c-Si:H:P film was formed at a thickness of 200 Å. Thus, there was formed the n-type semiconductor layer 103.

After the formation of the n-type semiconductor layer 103 was completed, the introduction of the above gases was terminated, and at the same time, the application of the high frequency power was terminated. Then, the film-forming chamber 201 was evacuated to a vacuum of less than $1 \times 10^{-5}$ Torr. The film-forming chamber 216 was also evacuated to and maintained at a vacuum of less than $1 \times 10^{-5}$ Torr by operating the vacuum pump (not shown) for the film-forming chamber 216. After the inner pressures of the film-forming chambers 201 and 216 became substantially identical, the gate valve 207' was opened and the substrate holder 202 having the substrate thereon was transferred into the film-forming chamber 216 by means of the transportation mechanism 206 under vacuum conditions. Thereafter, the gate valve 207' was closed.

(2). Formation of the buffer layer 117

In the film-forming chamber 216, the substrate was heated so that the temperature of the surface thereof became 200° C. by actuating the heater 205. The surface of the substrate was maintained at this temperature. Then, the film-forming procedures of forming the n-type semiconductor layer 103 in the above (1) were repeated, except that the film-forming conditions were changed as follows:

gases used & flow rate:
Si$_2$H$_6$ gas: 10 sccm
H$_2$ gas: 500 sccm
inner pressure: 1.2 Torr
high frequency power applied: 15 W Thus, there was formed a non-doped a-Si:H film of 200 Å in thickness as the buffer layer 117 on the n-type semiconductor layer 103.

(3). Formation of the i-type semiconductor layer 104

After the formation of the buffer layer 117 was completed, the application of the high frequency power was suspended. Then, the procedures of forming the buffer layer 117 in the above (2) were repeated in the film-forming chamber 216, except that GeH$_4$ gas was additionally introduced into the reaction space of the film-forming chamber 216 at a selected flow rate in the range of from 0.5 sccm to 18 sccm (see, Table 2), to thereby form a 2800 Å thick non-doped a-SiGe:H film as the i-type semiconductor layer 104 on the buffer layer 117.

(4). Formation of the buffer layer 118

After the formation of the i-type semiconductor layer 104 was completed, the introduction of the GeH$_4$ gas was terminated, and the application of the high frequency power was suspended. Then, the procedures of forming the buffer layer 117 in the above (2) were repeated in the film-forming chamber 216 to thereby form a 200 Å thick non-doped a-Si:H film as the buffer layer 118 on the i-type semiconductor layer 104.

(5). Formation of the p-type semiconductor layer 105

After the formation of the buffer layer 118 was completed, the introduction of the Si$_2$H$_6$ gas and H$_2$ gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the film-forming chambers 201 and 216 became substantially identical, the gate valve 207' was opened, and the substrate holder 202 having the substrate thereon was transferred into the film-forming chamber 201 by means of the transportation mechanism 206 under vacuum condition. Thereafter, the gate valve 207' was closed.

The substrate was heated so that the temperature of the surface thereof became 230° C. by actuating the heater 205. The surface of the substrate was maintained at this temperature. Thereafter, SiH$_4$ gas, H$_2$ gas, and BF$_3$ gas diluted to 2% with H$_2$ gas (hereinafer referred to as BF$_3$/H$_2$ gas (2%)) were introduced into the reaction space of the film-forming chamber 201 at respective flow rates of 5 sccm, 500 sccm, and 5 sccm through the gas feed pipes 208 and 209. The inner pressure of the film-forming chamber 201 was controlled to 1.5 Torr by adjusting the opening of the throttle valve 214. After the three gases became stable at the above respective flow rates, the high frequency power source 210 was switched on to apply a high frequency power of 150 W (13.56 MHz) to the cathode electrode 212, wherein plasma was produced to cause the formation of a p-type $\mu$c-Si:H:B film as the p-type semiconductor layer 105 on the buffer layer 118. In this case the $\mu$c-Si:H:B film was formed at a thickness of 100 Å.

Thus, there was formed a photovoltaic cell as the single photovoltaic cell having an i-type semiconductor region of 3200 Å in thickness.

After the formation of the single photovoltaic cell was completed, the high frequency power source was switched off. At the same time, the heater was also switched off. And the introduction of the gases was stopped. Next, the operation of the vacuum pump was stopped. Then, the inner pressure of the film-forming chamber 201 was returned to normal pressure. The substrate having the photovoltaic cell formed thereon was transferred into the load lock chamber 213 by means of the transportation mechanism 206, wherein it was cooled to room temperature. The substrate was then taken out from the load lock chamber 213.

Thereafter, the substrate was introduced into a conventional vacuum evaporation apparatus having an evaporation boat containing a mixture composed of fine particles of In and fine particles of Sn with a mixing ratio of 1:1 in terms of weight ratio therein. The substrate was heated to and maintained at 170° C. The inside of the vacuum evaporation apparatus was evacuated to a vacuum of less than $1 \times 10^{-5}$ Torr. O$_2$ gas was then introduced into the vacuum evaporation apparatus. The inner pressure of the vacuum evaporation apparatus was controlled to about $1 \times 10^{-3}$ Torr. Then, the metal mixture contained in the evaporation boat was evaporated by way of the resistance heating method to deposit an about 700 Å thick ITO film as the transparent and conductive electrode 112 on the p-type semiconductor layer 111 of the photovoltaic cell. After the substrate was cooled to room temperature, it was taken out from the vacuum evaporation apparatus.

A mask pattern for the formation of a collecting electrode was then arranged on the surface of the previously formed ITO film. The resultant was introduced into a conventional vacuum evaporation device, wherein an about 0.8 μm thick Ag film was deposited by way of the resistance heating method, to thereby form a comb-shaped collecting electrode as the collecting electrode 113.

Thus, there was obtained a single cell type photovoltaic device of the configuration shown in FIG. 8.

The above procedures of forming the single cell type photovoltaic device were repeated several times, wherein the formation of the i-type semiconductor layer 104 comprising a-SiGe:H film was conducted by changing the flow rate of the GeH$_4$ gas used to a value in the range of from 0.5 sccm to 20 sccm in each case.

Thus, there were obtained a plurality of single cell type photovoltaic device samples.

For each of the samples, its deterioration factor was observed in the same manner as in Example 2.

Figure 9:
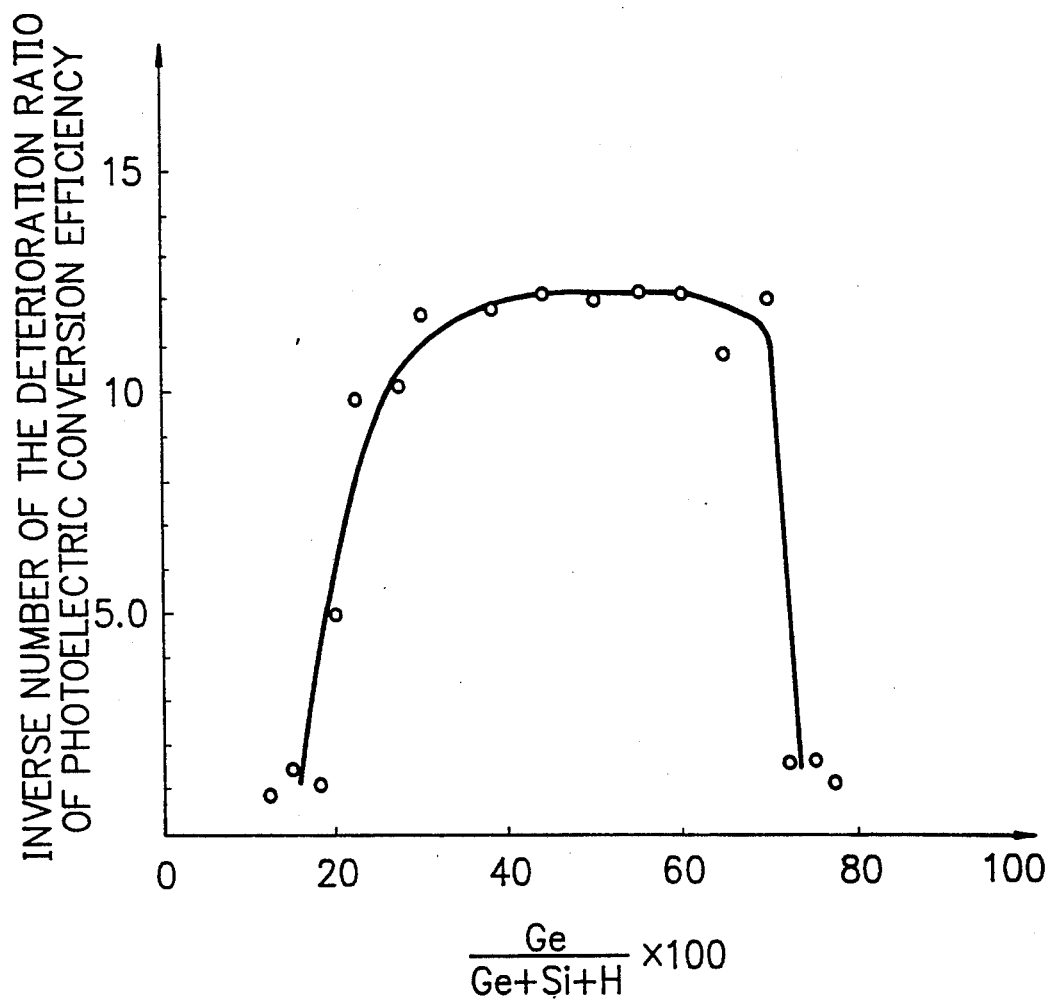
FIG. 9 shows a graph illustrating the interrelation between the content of Ge atoms in a film and the rate of degradation in photoconductivity of the film on the basis of the results obtained in Experiment 3 which will be later described.

The deterioration factors obtained are graphically shown in relation to the composition rates of the Ge (Ge/(Ge+Si+H)) in FIG. 9. It should be noted that the deterioration factor is shown by an inverse number along the vertical axis of FIG. 9 so that small values of the deterioration factor are situated at the upper positions.

As apparent from the results graphically shown in FIG. 9, it is understood that the single cell type photovoltaic devices in which the i-type semiconductor layer is composed of an a-SiGe film containing germanium atoms (Ge) in an amount of from 20 to 70 atomic % are desirably small in deterioration factor and the single cell type photovoltaic devices in which the i-type semiconductor layer is composed of an a-SiGe film containing germanium atoms (Ge) in an amount of from 30 to 70 atomic % are significantly small in deterioration factor.

The present invention has been accomplished based on the knowledge obtained through the above experiments.

The feature of the photovoltaic device with a pin junction active semiconductor region (that is, a pin junction photovoltaic device) comprising an n-type semiconductor layer, an i-type semiconductor layer, and a p-type semiconductor layer according to the present invention lies in the fact at a buffer layer comprising a non-single crystalline silicon semiconductor material substantially free of germanium atoms is interposed between the p-type semiconductor layer and the i-type semiconductor layer, another buffer layer comprising a non-single crystalline silicon semiconductor material substantially free of germanium atoms is interposed between the i-type semiconductor layer and the n-type semiconductor layer, and the i-type semiconductor layer is formed of an amorphous silicon germanium semiconductor material (that is, an a-SiGe semiconductor material) containing the germanium atoms (Ge) in an amount of 20 to 70 atomic % in the entire region, such that the concentration of the germanium atoms (Ge) in the thickness direction is varied so as to establish a maximum concentration point.

The present invention will be described in more detail in the following.

Figure 2:
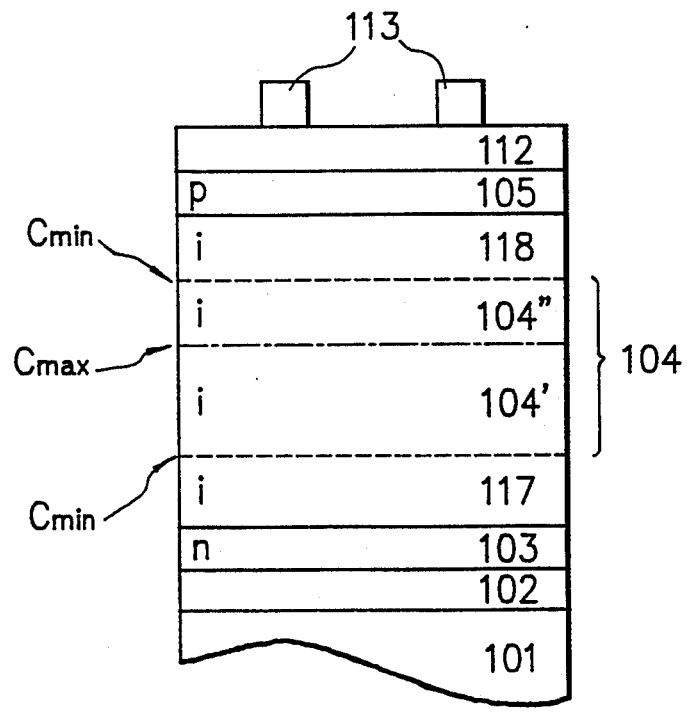
FIG. 2 is a schematic cross section view of the photovoltaic device shown in FIG. 1.

A typical example of the photovoltaic device according to the present invention is of the configuration schematically shown in FIG. 2. FIG. 1 is a schematic diagram illustrating the profile of the energy band gap in the photovoltaic device shown in FIG. 2.

The photovoltaic device shown in FIG. 2 comprises a lower electrode 102, an n-type semiconductor layer 103, a buffer layer 117 of i-type, an i-type semiconductor layer 104, a buffer layer 118 of i-type, a p-type semiconductor layer 105, and a transparent and conductive electrode 112, laminated in this order on a substrate 101. Reference numeral 113 indicates a collecting electrode disposed on the transparent and conductive electrode 112. This photovoltaic device is of the type wherein light is impinged from the side of the p-type semiconductor layer 105. Each of the lower electrode 102 and the transparent and conductive electrode 112 serves as a means to output photocurrent from the pin junction structure.

The lower electrode 102 is connected to the n-type semiconductor layer 103 so as to provide an ohmic contact, and likewise, the transparent and conductive electrode 112 is connected to the p-type semiconductor layer 105 so as to provide an ohmic contact.

The i-type semiconductor layer 104 comprises an i-type semiconductor layer region 104' composed of (a) an i-type a-SiGe:H material with a given concentration distribution of the Ge atoms in the thickness direction and another i-type semiconductor layer region 104" composed of (b) an i-type a-SiGe:H material with a concentration distribution of the Ge atoms in the thickness direction which is different from that of the i-type a-SiGe material (a), wherein a maximum point (Cmax) of the concentration of the germanium atoms (Ge) is present in the vicinity of the interface between the i-type semiconductor layer region 104' and the i-type semiconductor layer region 104" (see, FIG. 1).

In the following, description will be made of each of the constituents of the above photovoltaic device.

Substrate

The substrate 101 may be electroconductive or electrically insulating, and it may be transparent or opaque.

The electroconductive substrate can include, for example, metals such as Fe, Ni, Cr, Al, Mo, Au, Nb, Ta, V, Ti, Pt, and Pb and alloys of these metals such as brass, stainless steel, and the like. In the case where the substrate 101 comprises an electroconductive member selected from the group consisting of the above metals and alloys, the substrate may serve also as the lower electrode 102. In this case, the substrate may also serve as a current-outputting electrode.

The electrically insulating substrate can include, for example, films or sheets of inorganic materials such as glass, ceramics, SiO$_2$, Si$_3$N$_4$, Al$_2$O$_3$, and the like, or synthetic resins such as polyester, polyethylene, polycarbonate, cellulose acetate, polypropylene, polyvinyl chloride, polyvinylidene chloride, polystyrene, polyamide, polyimide, and the like.

The electroconductive substrate may comprise a member made of such metal or alloy as above mentioned, coated with any of the foregoing synthetic resins on the rear face thereof.

In the case where the substrate 101 comprises such an electrically insulating film or sheet as above mentioned, it is desired to form an electroconductive film of a metal, e.g., Al, Ag, Pt, Au, Ni, Ti, Mo, W, Fe, V, Cr or Cu, an alloy, e.g., stainless steel, brass or nichrome, or a transparent and conductive oxide (TCO) material, e.g., SnO$_2$, In$_2$O$_3$, or ITO (In$_2$O$_3$+SnO$_2$) on the surface of the electrically insulating substrate, on which a deposited film (the lower electrode or a semiconductor layer) is disposed, by a metal printing technique, vacuum deposition technique, or sputtering technique. In this case, the electroconductive film formed on the surface of the electrically insulating substrate may function as the foregoing current outputting electrode.

The substrate 101, even if it is composed of an electroconductive material, may be provided with a metallic layer comprising a metal different from the constituent metal of the substrate on the surface thereof on which a deposited film is to be formed, in order to improve the long wavelength light reflection coefficient at the surface of the substrate and also in order to prevent occurrence of mutual interdiffusion of the constituent materials between the substrate and the deposited semiconductor film formed on the surface thereof.

The substrate 101 may comprise a single crystalline member. Such single crystalline member can include, for example, wafer-like members of single crystalline materials of Si, Ge, C, NaCl, KCL, LiF, GaSb, InAs, InSb, GaP, MgO, $CaF_2$, $BaF_2$, alpha-$Al_2O_3$, or the like, layered members comprising a plurality of these wafer-like shaped members in laminated form, and other layered members comprising one of these wafer-like shaped members and an expitaxially grown member formed thereon.

In the case where the pin junction photovoltaic device is used by impinging light from the side of the substrate 101, it is necessary for the substrate to be constituted by a material selected from the materials above mentioned which can allow light transmission therethrough.

It is possible for the surface of the substrate to be flat or uneven, wherein the surface is provided with minute irregularities. In the case where the substrate surface is provided with minute irregularities, the irregularities may be spherical, conical, or pyramid shape, in which the maximum height is preferably 500 Å to 5000 Å. There is an advantage in this case in that light is irregularly reflected at the uneven surface of the substrate, thereby increasing the optical path length of the light thus reflected.

The substrate 101 may be of any configuration such as plate-like, belt-like or cylindrical shape, which can be properly determined depending upon the application uses. As for the thickness of the substrate, it should be properly determined so that a pin junction photovoltaic device can be formed thereon as desired. In the case where flexibility is required for the photovoltaic device or in the case of a pin junction photovoltaic device of the type in which light is impinged from the side of the substrate, the substrate is desired to be made as thin as possible within a range capable of sufficiently providing the function as the substrate. However, the thickness is usually designed to be not less than 10 $\mu$m in view of facilitating the fabrication and handling efficiencies and also in view of mechanical strength of the substrate.

Electrodes

In the photovoltaic device of the present invention, appropriate electrodes are used in accordance with the configuration of the device. As such electrodes, there can be mentioned the lower electrode, transparent and conductive electrode (upper electrode), and collecting electrode. The upper electrode denotes the one on the side from which light is impinged, and the lower electrode denotes the one placed opposite the upper electrode, with the semiconductor layers being arranged between the two electrodes.

These electrodes will be described in the following.

Lower electrode

In the photovoltaic device of the present invention, the face through which light for generating a photoelectromotive force is impinged is different depending on the kind of the substrate 101 to be used, which is capable or not capable of allowing light transmission therethrough. For instance, in the case where the substrate comprises a member which is not capable of allowing light transmission therethrough, light is impinged from the side of the transparent and conductive electrode 112.

Therefore, the location of the lower electrode 102 is properly designed depending upon the side of the impinging light.

In the case of a photovoltaic device of the type in which light is impinged from the side opposite the substrate, the lower electrode 102 is arranged between the substrate 101 and the semiconductor layer 103.

In the case where the substrate is electroconductive, the substrate can function also as the lower electrode, the lower electrode can be omitted.

In the case where the substrate is electroconductive but is of a high sheet resistance, the lower electrode 102 may be disposed as a lower resistance electrode serving to output current or in order to increase the reflectivity of the incident light at the surface of the substrate so as to make it utilized more efficiently. In the case where the substrate 101 comprises an electrically insulating member, it is essential to provide the lower electrode 102 in order to output the current, and the lower electrode is placed between the electrically insulating substrate 101 and the semiconductor layer 103.

The lower electrode 102 may be comprised of a thin film of a metal selected from the group consisting of Ag, Au, Pt, Ni, Cr, Cu, Al, Ti, Zn, Mo, and W or an alloy selected from the group consisting of alloys of said metals. The thin film may be formed by means of the known vacuum evaporation, electron beam, or sputtering techniques. However, due care should be given so that the metallic thin film thus formed is not a resistive component of the pin junction photovoltaic cell. In view of this, the metallic thin film by which the lower electrode 102 is constituted is desired to be of a sheet resistance preferably of 50 $\Omega$ or less, more preferably 10 $\Omega$ or less.

Alternatively, it is possible to dispose a diffusion preventive layer composed of an electroconductive material such as zinc oxide between the lower electrode and the semiconductor layer 103. (This is not shown in the figure). When a diffusion preventive layer is employed in this way, there are provided such advantages that it prevents the metal elements of the lower electrode 102 from diffusing into the semiconductor layer; it serves to cause multiple interference effects with the thin film and confine the incident light within the pin junction semiconductor region; and being provided with a certain resistance value, it prevents occurrence of short circuits, which would otherwise occur between the lower electrode 102 and the transparent and conductive electrode 112 through the semiconductor layers arranged between them due to pinholes and the like.

Transparent and conductive electrode (upper electrode)

The transparent and conductive electrode 112 is desired to have a light transmittance of 85% or more so that it allows the semiconductor layer to efficiently absorb sunlight or fluorescent light. In addition to this, it is desired to have a sheet resistance of 100 Ω or less from the viewpoint of preventing the internal resistance of the pin junction semiconductor region from becoming great, thereby reducing the performance.

In view of the above, the transparent and conductive electrode 112 is desired to comprise a thin film of a metal oxide selected from the group consisting of $SnO_2$, $In_2O_3$, ZnO, CdO, $Cd_2SnO_4$, and ITO ($In_2O_3+SnO_2$), or a semitransparent thin film of a metal selected from the group consisting of Au, Al, and Cu.

In the case of a photovoltaic device of the configuration shown in FIG. 2, the transparent and conductive electrode 112 is disposed on the p-type semiconductor layer 105. Therefore, it is necessary for the transparent and conductive electrode to be constituted by a thin film selected from those above mentioned which are good in adhesion at least with the p-type semiconductor layer.

The transparent and conductive electrode 112 comprising such thin film may be formed by means of the known resistance heating evaporation, electron beam evaporation, sputtering, or spraying techniques.

Collecting electrode

The collecting electrode 113 is disposed on the transparent and conductive electrode 112 for the purpose of reducing the surface resistance of the transparent and conductive electrode.

The collecting electrode 113 is desired to comprise a thin film of a metal selected from the group consisting of Ag, Cr, Ni, Al, Au, Ti, Pt, Cu, Mo, and W or an alloy selected from the group consisting of alloys of said metals. It is possible for the collecting electrode to be constituted by a member comprising a plurality of such metallic thin films in laminated form. The thin film may be formed by means of the known vacuum evaporation, electron beam evaporation, or sputtering techniques.

The shape and the area of the collecting electrode 113 should be properly designed so that a sufficient quantity of light can be received by the semiconductor layer.

Specifically, the shape is desired to be designed such that it extend uniformly all over the light receiving face of the pin junction photovoltaic cell. The area is desired to be designed such that it cover 15% or less of said light receiving face in a preferred embodiment or 10% or less in a more preferred embodiment.

The member by which the collecting electrode 113 is constituted is of a sheet resistance preferably of 50 Ω or less, or more preferably 10 Ω or less.

Semiconductor layers

In the following, description will be made of each of the constituent semiconductor layers.

i-type semiconductor layer

The i-type semiconductor layer 104 in the photovoltaic device of the present invention comprises an i-type semiconductor layer constituted by an a-SiGe semiconductor material containing the germanium atoms (Ge) in an amount preferably in the range of from 20 to 70 atomic %, more preferably in the range of from 30 to 70 atomic % in the entire region in which the concentration of the germanium atoms (Ge) in the thickness direction is varied while providing a maximum concentration point (Cmax).

Specifically, as is apparent from FIG. 1, the i-type semiconductor layer 104 comprises the i-type semiconductor layer region 104' formed of (i) an i-type a-SiGe:H semiconductor material containing the germanium atoms in an amount in the range of from 20 to 70 atomic % at (i-a) a given concentration distribution in the thickness direction and the i-type semiconductor layer region 104" formed of (ii) an i-type a-SiGe:H semiconductor material containing the germanium atoms in an amount in the range of from 20 to 70 atomic % at (ii-a) a concentration distribution in the thickness direction which is different from the concentration distribution (i-a), wherein the concentration distribution (i-a) in the i-type semiconductor layer region 104' is minimum (Cmin) (hereinafter referred to as "Cmin point 1") in the vicinity of the interface with the buffer layer 117 situated on the side of the n-type semiconductor layer 103 and it is gradually increased therefrom to become maximum (Cmax) (hereinafter referred to as "Cmax point 1") in the vicinity the interface with the i-type semiconductor layer region 104" wherein the energy band gap is maximum at the Cmin point 1 and it is gradually decreased therefrom to become minimum at the Cmax point 1; and on the other hand, the concentration distribution (ii-a) in the i-type semiconductor layer region 104" is maximum (Cmax) (hereinafter referred to as "Cmax point 2") in the vicinity of the interface with the i-type semiconductor layer 104' and it is gradually decreased therefrom to become minimum (Cmin) (hereinafter referred to as "Cmin point 2") in the vicinity the interface with the buffer layer 118 situated on the side of the p-type semiconductor layer 105 wherein the energy band gap is mimimum at the Cmax point 2 and it is gradually increased therefrom to become maximum at the Cmin point 2. That is, the i-type semiconductor layer region 104' and the i-type semiconductor layer region 104" have such an opposite concentration distribution of the germanium atoms (Ge) and such an opposite graded energy band gap with each other.

As for the amount of the germanium atoms (Ge) at each of the Cmin points 1 and 2, it is preferably 20 atomic % or more, more preferably 30 atomic % or more. As for the amount of the germanium atoms (Ge) at the Cmax point, it is preferably 70 atomic % or less.

The photovoltaic device of the present invention is provided with the foregoing specific stacked i-type semiconductor layer comprising two different i-type semiconductor layer regions each comprising a specific a-SiGe:H semiconductor material containing the germanium atoms (Ge) in an amount in the range of from 20 to 70 atomic % in the entire region which has an opposite concentration distribution as for the germanium atoms (Ge) is that the concentration distribution is varied while providing a maximum concentration point as above described and which has an opposite graded energy band gap as described above. Because of this, in the photovoltaic device of the present invention, the recombination of generated photocarriers is extremely reduced, and if recombination of the photocarriers should occur, defects such as dangling bonds due to such a recombination are hardly caused, and as a result, the semiconductor characteristics are hardly deteriorated even upon repeated irradiation of light over a long period of time.

The i-type semiconductor layer 104 configured as described in the above is designed such that any portion thereof has an energy band gap of 1.35 eV to 1.60 eV. In other words, any of the foregoing Cmin point 1 and 2 is designed such that it has an energy band gap of 1.35 eV to 1.60 eV.

The thickness of each of the semiconductor layer regions 104' and 104" may be properly determined depending upon the related conditions, provided the above requirements for each of the i-type semiconductor layer regions 104' and 104" are fulfilled as desired. However, in any case, the total thickness of the i-type semiconductor layer 104 should be in the range of from 1000 Å to 3000 Å.

Any of the foregoing a-SiGe: H semiconductor materials (i) and (ii) is a semiconductor material which is not intentionally doped with a dopant such as a p-type dopant, e.g., B (boron) or an n-type dopant, e.g., P (phosphorous) or As (arsenic), and which exhibits a slight n-type conductivity. Each of them may be, therefore, doped with such a p-type dopant as above mentioned in order to compensate the n-type conductivity thereof, if necessary.

Therefore, each of the a-SiGe:H semiconductor materials (i) and (ii) includes a-SiGe:H semiconductor material which exhibits a slight n-type conductivity and a semiconductor material comprising a-SiGe:H semiconductor material compensated to be intrinsic by the incorporation of a p-type dopant.

The i-type semiconductor layer comprising the foregoing i-type semiconductor layer regions 104' and 104" may be formed by way of the known vacuum evaporation, sputtering, high frequency plasma CVD (commonly called RF plasma CVD), microwave plasma CVD, electron cyclotron resonance (ECR), thermal-induced CVD, or low pressure CVD (LPCVD) techniques. Among these film-forming techniques, the RF plasma CVD and microwave plasma CVD techniques are the most appropriate in view of mass production at an industrial scale. As the film-forming apparatus suitable for the formation of the i-type semiconductor layer 104 using one of these two film-forming techniques, there can be employed a single chamber film-forming apparatus or a multi-chambered film-forming apparatus.

In order to form each of the foregoing a-SiGe:H semiconductor material (film) (i) as the i-type semiconductor layer 104' and the foregoing a-SiGe:H semiconductor material (film) (ii) as the i-type semiconductor layer 104" by way of either the RF plasma CVD technique or the microwave plasma CVD technique, there are used a gaseous or gasifiable Si-imparting raw material and a gaseous or gasifiable Ge-imparting raw material. Such Si-imparting raw material can include, for example, $SiH_4$, $Si_2H_6$, $Si_3H_8$, $(SiH_2)_4$, $(SiH_2)_5$, $(SiH_2)_6$, $SiF_4$, $Si_2F_6$, $Si_3F_8$, $(SiF_2)_4$, $(SiF_2)_5$, $(SiF_2)_6$, $SiHF_3$, and $SiH_2F_2$. Such Ge-imparting raw material can include, for example, $GeH_4$, $Ge_2H_6$, $GeF_4$, $Ge_2F_6$, $Ge_3F_8$, $(GeF_2)_4$, $(GeF_2)_5$, $(GeF_2)_6$, $GeHF_3$, and $GeH_2F_2$.

In any case, these Si-imparting raw materials may be used either singly or in combination of two or more of them. Likewise, these Ge-imparting raw materials may be used either singly or in combination of two or more of them.

At the time of forming any of the foregoing a-SiGe:H film (i) and the foregoing a-SiGe:H film (ii) by way of either the high frequency plasma CVD technique or the microwave plasma CVD technique, one or more of the above Si-imparting raw materials in the gaseous state and one or more of the above Ge-imparting raw materials in the gaseous state are introduced into a film-forming space while controlling their flow rates at respective predetermined values using mass flow controllers.

In the case where either the Si-imparting raw material or the Ge-imparting raw material is not in a gaseous state but in a liquid state at room temperature and normal pressure, such raw material is gasified by bubbling it with a carrier gas such as an inert gas (e.g., Ar or He) or $H_2$ gas in a bubbling vessel equipped with a temperature controller while heating to produce raw material gas, which is followed by introducing it into the film-forming space while controlling its flow rate at a predetermined value.

Similarly, in the case where either the Si-imparting raw material or the Ge-imparting raw material is not in a gaseous state but in a solid state at room temperature and normal pressure, such raw material is gasified by subjecting it to heat treatment together with a carrier gas such as an inert gas (e.g., Ar or He) or $H_2$ gas in a furnace equipped with a temperature controller to produce raw material gas, which is followed by introducing it into the film-forming space while controlling its flow rate at a predetermined value.

The substrate temperature upon forming any of the foregoing a-SiGe:H semiconductor films (i) and (ii) is preferably in the range of from 100° to 500° C., more preferably in the range of from 150° to 450° C., most preferably in the range of from 200° to 400° C.

As for the inner pressure of the film-forming chamber upon film formation, it is different depending upon the kind of film-forming technique to be employed. Specifically in the case where the RF plasma CVD technique is employed, it is preferably in the range of from 0.01 to 50 Torr, more preferably in the range of from 0.1 to 10 Torr, most preferably in the range of from 0.5 to 1.5 Torr. In the case where the microwave plasma CVD technique is employed it is preferably in the range of from $1 \times 10^{-4}$ to 1 Torr more preferably in the range of from $1 \times 10^{-3}$ to 0.1 Torr, most preferably in the range of from $2 \times 10^{-3}$ to $2 \times 10^{-2}$ Torr.

Buffer layers

Each of the buffer layers 117 and 118 in the photovoltaic device of the present invention is disposed for the purpose of preventing occurrence of trapping levels for photocarriers at the interfaces with the n-type semiconductor layer 103 and the p-type semiconductor layer.

In a preferred embodiment, each of the buffer layers 118 and 118 is composed of an i-type non-single crystalline semiconductor material such as a-Si:H, $\mu$c-Si:H, or the like which is substantially free of germanium atoms (Ge).

In the case where wither the buffer layer 117 or the buffer layer 118 is formed of an a-SiGe:H semiconductor film with a varied concentration distribution of the Ge atoms which is similar to either the foregoing a-SiGe:H semiconductor film (i) or the foregoing a-SiGe:H semiconductor film (ii), there is unavoidably created a layer region with a concentration of the Ge atoms in an amount of less than 20 atomic %. In this case, the objects of the invention cannot be attained as desired.

Upon forming the buffer layer 118 on the i-type semiconductor layer region 104" of the i-type semiconductor layer 104 using a film-forming raw material gas containing silicon atoms (Si) but not containing germanium atoms (Ge), there could be an occasion where the germanium atoms contained in the previously formed i-type semiconductor layer region 104" with an amount of 20 to 70 atomic % contaminate the buffer layer 118. However, as long as the amount of such Ge atoms contaminated in the foregoing a-Si:H semiconductor film or μc-Si:H semiconductor film as the buffer layer 118 is not more than 0.1 atomic % or preferably not more than 0.01 atomic %, such an a-Si:H semiconductor film or μc-Si:H semiconductor film contaminated with the Ge atoms in an amount of 0.1 atomic % or less is substantially equivalent to a pure a-Si:H semiconductor film or μc-Si:H semiconductor film, and because of this, the layer characteristics of the a-Si:H or μc-Si:H film as the buffer layer are maintained as desired without being deteriorated even upon continuous irradiation of light over a long period of time.

On the other hand, in the case where the amount of such Ge atoms contaminated in the foregoing a-Si:H semiconductor film or μc-Si:H semiconductor film as the buffer layer 118 is 2 atomic % or more, the a-Si:H semiconductor film or μc-Si:H semiconductor film becomes a so-called a-SiGe:H semiconductor film or a μc-SiGe:H semiconductor film, and as a result, the layer characteristics of the a-Si:H or μc-Si:H semiconductor film as the buffer layer are gradually deteriorated during continuous irradiation of light over a long period of time.

Independently, the present inventors have found through experimental studies than an a-SiGe:H semiconductor film containing the germanium atoms (Ge) in an amount of 2 to 19 atomic % is liable to deteriorate in terms of semiconductor characteristics when it is irradiated with light over a long period of time, and thus, such a-SiGe:H semiconductor film cannot be employed as either the buffer layer 118 or the buffer layer 117.

The present inventors also have found that when the i-type semiconductor layer comprising two different i-type semiconductor layer regions each comprising the foregoing specific a-SiGe:H semiconductor material (film) containing the germanium atoms (Ge) in an amount in the range of from 20 to 70 atomic % in the entire region which has an opposite concentration distribution of the germanium atoms (Ge) in that the concentration distribution is varied while providing a maximum concentration point and when an opposite graded energy band gap is interposed between two i-type semiconductor layers (that is, the buffer layer 117 and 118) each comprising a non-single crystalline Si:H semiconductor film substantially free of germanium atoms (Ge) such as an a-Si:H semiconductor film or uc-Si:H semiconductor film substantially free of germanium atoms (Ge), the semiconductor characteristics required for the i-type semiconductor layer of a pin junction photovoltaic device are secured without deterioration even upon continuous irradiation of light over a long period of time; and such a non-single crystalline Si:H semiconductor film as the buffer layer is contacted with the adjacent semiconductor layer of n-type or p-type in a desirable state with a good matching property.

Hence, it is necessary for each of the buffer layers 118 and 118 to be formed of a non-single crystalline Si:H semiconductor film substantially free of germanium atoms (Ge), such as an a-Si:H semiconductor film or μc-Si:H semiconductor film substantially free of germanium atoms (Ge). However, the non-single crystalline Si:H semiconductor film constituting either the buffer layer 117 or 118 may contain a slight amount of germanium atoms if it is 0.1 atomic % or less.

Thus, upon forming the buffer layer, due care should be given so that the germanium atoms of the i-type semiconductor layer 104 are not contaminated into the buffer layer.

The thickness of each of the buffer layers 117 and 118 is desired to be in the range of from 50 to 1000 Å.

Each of the buffer layers 117 and 118 may be formed in the same manner as in the case of forming the i-type semiconductor layer 104 using one or more of the foregoing Si-imparting raw materials.

The configuration of the foregoing specific i-type semiconductor layer 104 disposed between the foregoing buffer layers 117 and 118 according to the present invention is distinctly different from that in the prior art.

That is, there is known a technique of improving the characteristics of a solar cell by way of providing a so-called buffer layer capable of providing a gradient of energy band width at the interface between the semiconductor layer of p-type or n-type and the intrinsic semiconductor layer, thereby providing improved internal electric characteristics. This buffer layer is formed of an a-SiGe semiconductor film containing the germanium atoms (Ge) with a continuously varied composition ratio of from 0 to 20 atomic % or from 0 to 50 atomic % and which has an energy band gap graded from about 1.7 eV to about 1.5 eV. There is also known a technique of improving the characteristics of a solar cell by way of a so-called graded layer disposed so that a continuously varied distribution of the composition ratio between the constituent silicon and germanium atoms is established in the i-type semiconductor layer other than the buffer layer, wherein a layer region containing the germanium atoms with a continuously varied ratio of 0 to 20 atomic % is included in order to provide a greatly graded energy band gap.

According to these techniques in the prior art wherein the above buffer layer or the above graded layer is used, the initial solar cell characteristics can be improved, but such solar cell characteristics are gradually deteriorated upon continuous irradiation of light over a long period of time. And in the prior art, no consideration has been made of the foregoing facts that the characteristics of a pin junction photovoltaic device are liable to deteriorate upon continuous irradiation of light over a long period of time in the case of using the a-SiGe semiconductor film with a low composition ratio of the germanium atoms as the buffer layer in combination with the i-type semiconductor layer comprising an a-SiGe:H semiconductor film with a continuously varied composition ratio of the germanium atoms.

n-type semiconductor layer and p-type semiconductor layer

Each of the n-type semiconductor layer 103 and the p-type semiconductor layer 105 may be formed of any of the foregoing non-single crystalline semiconductor films used in the case of the i-type semiconductor layer 104 and also in the case of the buffer layers 117 and 118, such as a-SiGe:H semiconductor film, a-Si:H semiconductor film, and μc-Si:H film as long as they are doped with a proper valence electron controlling agent.

Such semiconductor films as the n-type semiconductor layer or the p-type semiconductor layer may be formed in the same manner as in the case of forming the i-type semiconductor layer 104 using one or more film-forming raw materials in a gaseous state mentioned in the case of forming the i-type semiconductor layer, together with an appropriate dopant-imparting raw material in gaseous state.

In the case of forming the n-type semiconductor layer, an n-type dopant-imparting raw material selected from the group consisting of phosphorous hydrides such as $PH_3$, $P_2H_4$, and $PF_3$ in a gaseous state is introduced into the film-forming space together with the film-forming raw material in a gaseous state. These n-type dopant-imparting raw materials may be used either singly or in combination of two or more of them.

In the case of forming the p-type semiconductor layer, a p-type dopant-imparting raw material selected from the group consisting of boron hydrides such as $B_2H_6$, $B_4H_{10}$, $B_5H_9$, $B_5H_{11}$, $B_6H_{10}$, $B_6H_{12}$, $B_6H_{14}$, and $BF_3$ in a gaseous state is introduced into the film-forming space together with the film-forming raw material in a gaseous state. These p-type dopant-imparting raw materials boron may be used either singly or in combination of two or more of them.

Besides the above non-single crystalline semiconductor films, it is possible for each of the n-type semiconductor layer and p-type semiconductor layer to be formed of other amorphous semiconductor films of a-SiC:H, a-SiN:H, a-SiO:H, or the like or other microcrystalline semiconductor films of $\mu$c-SiC:H, $\mu$c-SiN:H, $\mu$c-SiO:H, or the like. In any case, these semiconductor films are necessary to be doped with an appropriate valence electron controlling agent as well as in the above case. These semiconductor films are advantageously used as the n-type semiconductor layer or the p-type semiconductor layer particularly in a triple cell type pin junction photovoltaic device in that light absorption in each of the three pin junction photovoltaic cells in which the i-type semiconductor layer of at least one of the bottom and middle pin junction cells is of the foregoing configuration comprising the foregoing specific i-type semiconductor layer regions 104' and 104" is efficiently performed.

The manner of forming each of the constituent semiconductor layers of the photovotaic device according to the present invention has been described above.

Additional explanation will now be made of the manner of forming the i-type semiconductor layer 104.

Figure 11:
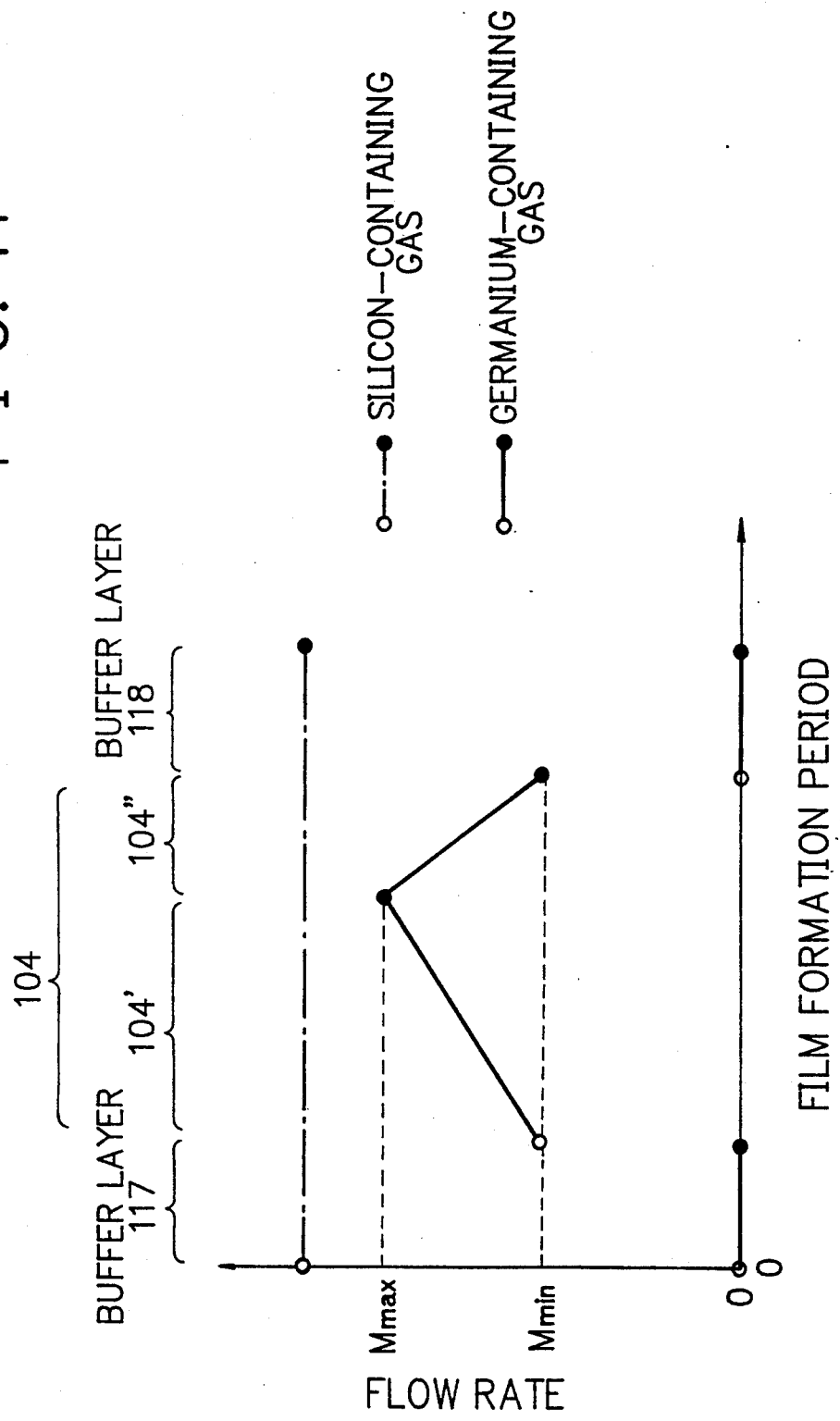
FIG. 11 is a schematic view showing flow rate diagrams for the film-forming raw material gases used during forming a film containing Si and Ge atoms in the present invention.

That is, it is important to properly control the flow rate of a Ge-imparting raw material gas upon forming the i-type semiconductor layer 104. FIG. 11 shows a schematic graph illustrating the interrelation between the flow rate of a Si-imparting raw material gas and a variation curve of the flow rate of a Ge-imparting raw material gas during forming of the buffer layer 117, the i-type semiconductor layer comprising the i-type semiconductor layer region 104' and the i-type semiconductor layer region 104", and the buffer layer 118. As is apparent from FIG. 11, film formation is conducted by supplying only the Si-imparting raw material gas without supplying the Ge-imparting raw material gas and hydrogen gas ($H_2$) when each of the buffer layers 117 and 118 is formed. When the i-type semiconductor layer 104 is formed, film formation is conducted by supplying the Si-imparting raw material gas, the Ge-imparting raw material gas, and hydrogen gas ($H_2$), wherein the Si-imparting raw material gas and the hydrogen gas are supplied constant at the respective fixed flow rates, while the flow rate of the Ge-imparting raw material gas is varied such that the flow rate starts from the point of Mmin (that is, the minimum flow rate), followed by increasing up to the point of Mmax (that is, the maximum flow rate), and after the point of the Mmax, decreases to the previous point of Mmin (that is, the beginning minimum flow rate). Particularly, the minimum flow rate (Mmin) and the maximum flow rate (Mmax) are designed so that the resulting a-SiGe:H semiconductor film has a concentration distribution of Ge atoms in which the concentration varies from a beginning minimum concentration point (20 atomic %), through a maximum concentration point (70 atomic %), to an end minimum concentration point (20 atomic %). Specifically, the flow rate of the Si-imparting raw material gas is fixed at a flow rate of 10 sccm, the flow rate of the hydrogen gas is fixed at a flow rate of 500 and the flow rate of the Ge-imparting raw material gas is varied in the range of from 1.5 to 16 sccm.

The formation of each of these constituent semiconductor layers of the photovoltaic device according to the present invention can be conducted following the film-forming procedures using the film-forming apparatus shown in PIG. 5 which have been described in the foregoing Experiments 1 to 3, wherein the buffer layer 117, i-type semiconductor layer 104, and buffer layer 118 are formed in an identical film-forming chamber.

In a preferred embodiment, the buffer layers 117 and 118 are formed in the same film-forming chamber which is independent from the film-forming chamber in which the i-type semiconductor layer is formed in order to prevent the buffer layer from being contaminated with the germanium atoms contained in the i-type semiconductor layer 104.

As above described, the photovoltaic device according to the present invention incudes three embodiments, i.e. a single cell type photovoltaic device of the configuration shown in FIGS. 1 and 2, a tandem type photovoltaic device in which the i-type semiconductor layer of the bottom pin junction cells is of the configuration shown in FIGS. 1 and 2 and the i-type semiconductor layer of the top pin junction cell, and a triple cell type photovoltaic device in which the i-type semiconductor layer of at least one of the bottom and middle pin junction cells is of the configuration shown in FIGS. 1 and 2. In a preferred embodiment of the triple cell type photovoltaic device, the i-type layer of each of the bottom and middle pin junction cells is of the configuration shown in FIGS. 1 and 2.

The single cell type photovoltaic device can be desirably used as a photosensor for detecting long wavelength light. Each of the tandem type photovoltaic device and the triple cell type photovoltaic device can be desirably used as a solar cell.

Figure 10:
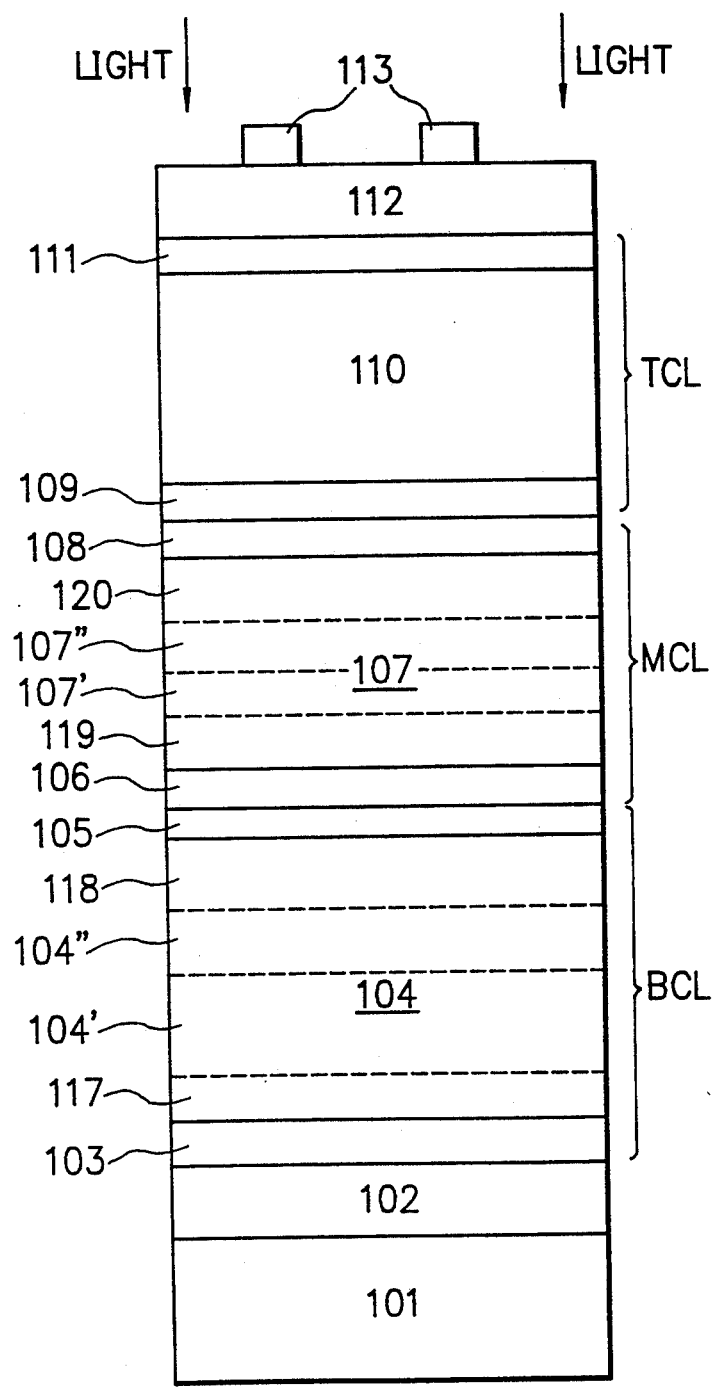
FIG. 10 is a schematic cross section view of another example of a photovoltaic device according to the present invention.

FIG. 10 is a schematic cross section view illustrating a typical example of the triple cell type pin junction photovoltaic device according to the present invention.

The configuration of the triple cell type pin junction photovoltaic device shown in FIG. 10 is the same as that of the triple cell type pin junction photovotaic device shown in FIG. 7 which was used for experimental purpose in the foregoing Experiment 2, except that the i-type semiconductor layer 104 of the bottom cell (BCL) in FIG. 7 is replaced by a two-layered i-type semiconductor layer 104 (that is, an i-type semconductor 104) comprising an i-type semiconductor layer region 104' and an i-type semiconductor layer region 104" wherein the layer configuration of the two-layered i-type semiconductor layer 104 is the same as that of the two-layered i-type semiconductor layer 104 shown in FIGS. 1 and 2 and the i-type semiconductor layer 107 of the middle cell (MCL) in FIG. 7 is replaced by a two-layered i-type semiconductor layer 107 (that is, an i-type semiconductor layer 107) comprising an i-type semiconductor layer region 107' and an i-type semiconductor layer region 107", wherein the layer configuration of the two-layered i-type semiconductor layer 107 is the same as that of the two-layered i-type semiconductor layer 104 shown in FIGS. 1 and 2.

In the triple cell type pin junction photovoltaic device shown in FIG. 10, as well as in the case of the single cell type pin junction photovoltaic device shown in FIGS. 1 and 2, a maximum concentration point of the Ge atoms contained (Cmax) is present at the interface between the i-type semiconductor layer region 104' and the i-type semiconductor layer region 104" of the BCL (this maximum concentration point (Cmax) of the BCL will be hereinafter referred to as "Cmax 104"), and a maximum concentration point of the Ge atoms contained (Cmax) is also present at the interface between the i-type semiconductor layer region 107' and the i-type semiconductor layer region 107" of the MCL (this maximum concentration point (Cmax) of the MCL will be hereinafter referred to as "Cmax 107").

In the triple cell type pin junction photovoltaic device according to the present invention, it is desired that Cmax 104 is greater than Cmax 107.

As for the layer thickness of the i-type semiconductor layer 104 in the triple cell type pin junction photovoltaic device shown in FIG. 10, it is desired to be in the range of from 1000 Å to 3000 Å in terms of total layer thickness. Similarly, the semiconductor layer 107 is desired to be of a layer thickness in the range of from 800 Å to 2000 Å. However, in any case, it is desired that the i-type semiconductor layer 107 be designed to be of a thickness which is thinner than the i-type semiconductor layer 104 and the i-type semiconductor layer region 104" be designed to be of a thickness which is thicker than the i-type semiconductor layer region 107".

In the following, the present invention will be described in more detail with reference to the following examples, which are not intended to restrict the scope of the invention.

EXAMPLE 1 AND COMPARATIVE EXAMPLES 1 AND 2

Example 1

In this example, there were prepared four different pin junction photovoltaic device samples (Sample Nos. 11-1 to 11-4) each having the configuration shown in FIG. 10.

Preparation of a pin junction photovoltaic device sample (Sample No. 11-1)

The pin junction photovoltaic device sample (Sample No. 11-1) was prepared following the procedures of the foregoing Experiment 2 using the film-forming apparatus shown in FIG. 5.

That is, there was firstly provided a stainless steel plate of 50 mm×50 mm in size as the substrate 101.

On the stainless steel plate as the substrate 101, there was formed an Ag thin film of about 1000 Å in thickness as the lower electrode 103 by using a conventional sputtering apparatus, wherein an Ag target was sputtered using Ar gas as the sputtering gas.

The substrate having the Ag thin film formed thereon was introduced into the load lock chamber 213 of the film-forming apparatus shown in FIG. 5, wherein it was fixed to the substrate holder 202 on the transportation mechanism 206 in the way as shown in FIG. 5 wherein the surface of the substrate (that is, the surface of the Ag thin film as the lower electrode 102 in this case) faces downward.

Then, the load lock chamber 213 was evacuated to a vacuum of less than $1 \times 10^{-5}$ Torr by operating a vacuum pump (not shown) for the load lock chamber 213. In this case, the film-forming chamber 201 was evacuated to and maintained at a vacuum of less than $1 \times 10^{-5}$ Torr by operating the vacuum pump 215.

After the inner pressures of the two chambers became substantially identical, the gate valve 207 was opened and the substrate holder 202 having the substrate arranged thereon was transferred into the film-forming chamber 201 by means of the transportation mechanism 206 under vacuum conditions. Thereafter, the gate valve 207 was closed.

The substrate holder 202 was moved so as to provide a distance of 30 mm between the surface of the Ag thin film on the substrate and the surface of the cathode electrode 212 by operating the transportation mechanism 206.

1. Formation of bottom cell (BCL)

1-(1). Formation of the n-type semiconductor layer 103

The substrate was heated so that the temperature of the surface thereof became 250° C. by actuating the heater 205. The surface of the substrate was maintained at this temperature. Thereafter, $Si_2H_6$ gas, $H_2$ gas, and $PH_3$ gas diluted to 1% with $H_2$ gas (hereinafer referred to as $PH_3/H_2$ gas (1%)) were introduced into the reaction space of the film-forming chamber 201 at respective flow rates of 10 sccm, 500 sccm, and 12 sccm through the gas feed pipes 208 and 209. The inner pressure of the film-forming chamber 201 was controlled to 1.5 Torr by adjusting the opening of the throttle valve 214. After the three gases became stable at the above respective flow rates, the high frequency power source 210 was switched on to apply a high frequency power of 20 W (13.56 MHz) to the cathode electrode 212, wherein plasma was produced to cause the formation of an n-type μc-Si:H:P film of 200 Å in thickness on the surface of the Ag thin film as the lower electrode 102 of the substrate. Thus, there was formed the n-type semiconductor layer 103.

After the formation of the n-type semiconductor layer 103 was completed, the introduction of the above gases was terminated, and at the same time, the application of the high frequency power was terminated. Then, the film-forming chamber 201 was evacuated to a vacuum of less than $1 \times 10^{-5}$ Torr.

The film-forming chamber 216 was also evacuated to and maintained at a vacuum of less than $1 \times 10^{-5}$ Torr by operating the vacuum pump (not shown) for the film-forming chamber 216. After the inner pressures of the film-forming chambers 201 and 216 became substantially identical, the gate valve 207' was opened, and the substrate holder 202 having the substrate thereon was transferred into the film-forming chamber 216 by means of the transportation mechanism 206 under a vacuum condition. Thereafter, the gate valve 207' was closed.

1-(2). Formation of the buffer layer 117

In the film-forming chamber 216, the substrate was heated so that the temperature of the surface thereof became 250° C. by actuating the heater 205. The surface of the substrate was maintained at this temperature. Then, the film-forming procedures of forming the n- type semiconductor layer 103 in the above 1-(1) were repeated, except that the film-forming conditions were changed as follows:

gases used & flow rate:
$Si_2H_6$ gas: 10 sccm
$H_2$ gas: 500 sccm
inner pressure: 1.2 Torr
high frequency power applied: 15 W Thus, there was formed a non-doped a-Si:H film of 200 Å in thickness as the buffer layer 117 on the n-type semiconductor layer 103.

1-(3). Formation of the i-type semiconductor layer 104

After the formation of the buffer layer 117 was completed, the application of the high frequency power was suspended. Then, the procedures of forming the buffer layer 117 in the above 1-(2) were repeated in the film-forming chamber 216, except that $GeH_4$ gas was additionally introduced into the reaction space of the film-forming chamber 216 firstly at a flow rate continuously varied from 1.1 sccm to 16 sccm (formation of a first i-type semiconductor layer region as the i-type semiconductor layer region 104') and secondly at a flow rate varied from 16 sccm to 1.1 sccm (formation of a second i-type semiconductor layer region as the i-type semiconductor layer region 104") on the basis of the flow rate variation curve shown in FIG. 12, to thereby form a 2800 Å thick non-doped a-SiGe:H film comprised of first and second layer regions (that is, the i-type semiconductor layer regions 104' and 104") each having a different, continuously varied concentration distribution of the Ge atoms and with a maximum concentration point of the Ge atoms at the interface between the two layer regions as the i-type semiconductor layer 104 on the buffer layer 117.

1-(4). Formation of the buffer layer 118

After the formation of the i-type semiconductor layer 104 was completed, the introduction of the $GeH_4$ gas was terminated, and the application of the high frequency power was suspended. Then, the procedures of forming the buffer layer 117 in the above 1-(2) were repeated in the film-forming chamber 216 to thereby form a 200 Å thick non-doped a-Si:H film as the buffer layer 118 on the i-type semiconductor layer 104.

1-(5). Formation of the p-type semiconductor layer 105

After the formation of the buffer layer 118 was completed, the introduction of the $Si_2H_6$ gas and $H_2$ gas was terminated. At the same time, the application of the high frequency power was terminated. The film-forming chamber 216 was evacuated to a vacuum of less than $1\times10^{-5}$ Torr. The film-forming chamber 201 was also evacuated to and maintained at a vacuum of less than $1\times10^{-5}$ Torr. After the inner pressures of the two film-forming chambers 201 and 216 became substantially identical, the gate valve 207' was opened, and the substrate holder 202 having the substrate thereon was transferred into the film-forming chamber 201 by means of the transportation mechanism 206 under vacuum conditions. Thereafter, the gate valve 207' was closed.

The substrate was heated so that the temperature of the surface thereof became 230° C. by actuating the heater 205. The surface of the substrate was maintained at this temperature. Thereafter, $SiH_4$ gas, $H_2$ gas, and $BF_3$ gas diluted to 2% with $H_2$ gas (hereinafer referred to as $BF_3/H_2$ gas (2%)) were introduced into the reaction space of the film-forming chamber 201 at respective flow rates of 5 sccm, 500 sccm, and 5 sccm through the gas feed pipes 208 and 209. The inner pressure of the film-forming chamber 201 was controlled to 1.5 Torr by adjusting the opening of the throttle valve 214. After the three gases became stable at the above respective flow rates, the high frequency power source 210 was switched on to apply a high frequency power of 150 W (13.56 MHz) to the cathode electrode 212, wherein plasma was produced to cause the formation of a p-type $\mu c$-Si:H:B film of 100 Å in thickness as the p-type semiconductor layer 105 on the buffer layer 118.

Thus, there was formed a bottom photovoltaic cell as the BCL having an i-type semiconductor region of 3200 Å in thickness.

2. Formation of middle cell (MCL)

2-(1). Formation of the n-type semiconductor layer 106

After the formation of the p-type semiconductor layer 105 was completed, the introduction of the $SiH_4$ gas, $H_2$ gas, and $BF_3/H_2$ gas (2%) was terminated. At the same time, the application of the high frequency power was terminated. The film-forming chamber 201 was evacuated to a vacuum of less than $1\times10^{-5}$ Torr.

Then, the procedures of forming the n-type semiconductor layer 103 in the above 1-(1) were repeated to thereby form a 100 Å thick $\mu c$-Si:H:P film as the n-type semiconductor layer 106 on the p-type semiconductor layer 105.

2-(2). Formation of the buffer layer 119

After the formation of the n-type semiconductor layer 106 was completed, the introduction of the $Si_2H_6$ gas, $H_2$gas and $PH_3/H_2$ gas (1%) was terminated, and at the same time, the application of the high frequency power was terminated. Then, the film-forming chamber 201 was evacuated to a vacuum of less than $1\times10^{-5}$ Torr. The film-forming chamber 216 was also evacuated to and maintained at a vacuum of less than $1\times10^{-5}$ Torr by operating the vacuum pump (not shown) for the film-forming chamber 216. After the inner pressures of the two film-forming chambers 201 and 216 became substantially identical, the gate valve 207' was opened, and the substrate holder 202 having the substrate thereon was transferred into the film-forming chamber 216 by means of the transportation mechanism 206 under a vacuum condition. Thereafter, the gate valve 207' was closed.

In the film-forming chamber 216, the procedures of forming the buffer layer 117 in the above 1-(2) were repeated to thereby form a 100 Å thick non-doped a-Si:H film as the buffer layer 119 on the n-type semiconductor layer 106.

2-(3). Formation of the i-type semiconductor layer 107

After the formation of the buffer layer 119 was completed, the application of the high frequency power was suspended. Then, the procedures of forming the buffer layer 119 in the above 2-(2) were repeated in the film-forming chamber 216, except that $GeH_4$ gas was additionally introduced into the reaction space of the film-forming chamber 216 firstly at a flow rate continuously varied from 1.1 sccm to 16 sccm (formation of a first i-type semiconductor layer region as the i-type semiconductor layer region 107') and secondly at a flow rate varied from 16 sccm to 1.1 sccm (formation of a second i-type semiconductor layer region as the i-type semiconductor layer region 107") on the basis of the flow rate variation curve shown in FIG. 12, to thereby form a 600 Å thick non-doped a-SiGe:H film comprised of first and second layer regions (that is, the i-type semiconductor layer regions 107' and 107") each having a different, continuously varied concentration distribution of the Ge atoms and with a maximum concentration point of the Ge atoms at the interface between the two layer regions as the i-type semiconductor layer 107 on the buffer layer 119.

2-(4). Formation of the buffer layer 120

After the formation of the i-type semiconductor layer 107 was completed, the introduction of the GeH$_4$ gas was terminated, and the application of the high frequency power was suspended. Then, the procedures of forming the buffer layer 119 in the above 2-(2) were repeated in the film-forming chamber 216 to thereby form a 100 Å thick non-doped a-Si:H film as the buffer layer 120 on the i-type semiconductor layer 107.

2-(5). Formation of the p-type semiconductor layer 108

After the formation of the buffer layer 120 was completed, the introduction of the Si$_2$H$_6$ gas and H$_2$ gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the two film-forming chambers 201 and 216 became substantially identical the gate valve 207' was opened, and the substrate holder 202 having the substrate thereon was transferred into the film-forming chamber 201 by means of the transportation mechanism 206 under vacuum conditions. Thereafter, the gate valve 207' was closed.

The substrate was heated so that the temperature of the surface thereof became 200° C. by actuating the heater 205. The surface of the substrate was maintained at this temperature. Then, the procedures of forming the p-type semiconductor layer 105 in the above 1-(5) were repeated to thereby form a 100 Å thick µc-Si:H:B film as the p-type semiconductor layer 108 on the buffer layer 120.

Thus, there was formed a middle photovoltaic cell as the MCL having an i-type semiconductor region of 800 Å in thickness.

3. Formation of top cell (TCL)

3-(1). Formation of the n-type semiconductor layer 109

After the formation of the p-type semiconductor layer 108 was completed, the introduction of the SiH$_4$ gas, H$_2$ gas, and BF$_3$/H$_2$ gas (2%) was terminated. At the same time, the application of the high frequency power was terminated. The film-forming chamber 201 was evacuated to a vacuum of less than $1 \times 10^{-5}$ Torr.

Then, the procedures of forming the n-type semiconductor layer 103 in the above 1-(1) were repeated to thereby form a 100 Å thick µc-Si:H:P film as the n-type semiconductor layer 109 on the p-type semiconductor layer 108.

3-(2). Formation of the i-type semiconductor layer 110

After the formation of the n-type semiconductor layer 106 was completed, the introduction of the Si$_2$H$_6$ gas, H$_2$ gas, and PH$_3$/H$_2$ gas (1%) was terminated, and at the same time, the application of the high frequency power was terminated. Then, the film-forming chamber 201 was evacuated to a vacuum of less than $1 \times 10^{-5}$ Torr. The film-forming chamber 216 was also evacuated to and maintained at a vacuum of less than $1 \times 10^{-5}$ Torr by operating the vacuum pump (not shown) for the film-forming chamber 216. After the inner pressures of the two film-forming chambers 201 and 216 became substantially identical, the gate valve 207' was opened, and the substrate holder 202 having the substrate thereon was transferred into the film-forming chamber 216 by means of the transportation mechanism 206 under vacuum conditions. Thereafter, the gate valve 207' was closed.

Then, the substrate was heated so that the temperature of the surface thereof became 250° C. by actuating the heater. The surface of the substrate was maintained at this temperature. Thereafter, Si$_2$H$_6$ gas and H$_2$ gas were introduced into the reaction space of the film-forming chamber 216 at respective flow rates of 10 sccm and 500 sccm. The inner pressure of the film-forming chamber 216 was controlled to 1.1 Torr by adjusting the opening of the throttle valve. After the two gases became stable at the above respective flow rates, the high frequency power source was switched on to apply a high frequency power of 15 W (13.56 MHz) to the cathode electrode 212. By this, there was formed a 600 Å thick non-doped a-Si:H film as the i-type semiconductor layer 110 on the n-type semiconductor layer 109.

3-(3). Formation of the p-type semiconductor layer 111

After the formation of the i-type semiconductor layer 110 was completed, the introduction of the Si$_2$H$_6$ gas and H$_2$gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the two film-forming chambers 201 and 216 became substantially identical, the gate valve 207' was opened, and the substrate holder 202 having the substrate thereon was transferred into the film-forming chamber 201 by means of the transportation mechanism 206 under vacuum conditions. Thereafter, the gate valve 207' was closed.

The substrate was heated so that the temperature of the surface thereof became 230° C. The surface of the substrate was maintained at this temperature. Then, the procedures of forming the p-type semiconductor layer 105 in the above 1-(5) were repeated to thereby form a 100 Å thick µc-Si:H:B film as the p-type semiconductor layer 111 on the i-type semiconductor layer 110.

Thus, there was formed a top photovoltaic cell as the TCL.

After the formation of the TCL was completed, the high frequency power source was switched off. At the same time, the heater was also switched off. And the introduction of the gases was stopped. Next, the operation of the vacuum pump was stopped. Then, the inner pressure of the film-forming chamber 201 was returned to normal pressure. The substrate having the BCL, MCL, and TCL formed thereon was transferred into the load lock chamber 213 by means of the transportation mechanism 206, wherein it was cooled to room temperature. The substrate was then taken out from the load lock chamber.

Thereafter, the substrate having the BCL, MCL, and TCL formed thereon was introduced into a conventional vacuum evaporation apparatus having an evaporation boat containing a mixture composed of fine particles of In and fine particles of Sn with a mixing ratio of 1:1 in terms of weight ratio therein. The substrate was heated to and maintained at 170° C. The inside of the vacuum evaporation apparatus was evacuated to a vacuum of less than $1\times10^{-5}$ Torr. $O_2$ gas was then introduced into the vacuum evaporation apparatus. The inner pressure of the vacuum evaporation apparatus was controlled to about $1\times10^{-3}$ Torr. Then, the metal mixture contained in the evaporation boat was evaporated by way of the resistance heating method to deposit an about 700 Å thick ITO film as the transparent and conductive electrode 112 on the p-type semiconductor layer 111 of the TCL. After the substrate was cooled to room temperature, it was taken out from the vacuum evaporation apparatus.

A mask pattern for the formation of a collecting electrode was then arranged on the surface of the previously formed ITO film. The resultant was introduced into a conventional vacuum evaporation device, wherein an about 0.8 um thick Ag film was deposited by way of the resistance heating method, to thereby form a comb-shaped electrode as the collecting electrode 113.

Thus, there was obtained a triple cell type pin junction photovoltaic device sample (Sample No. 11-1).

Preparation of a pin junction photovoltaic device sample (Sample No. 11-2)

Figure 13:
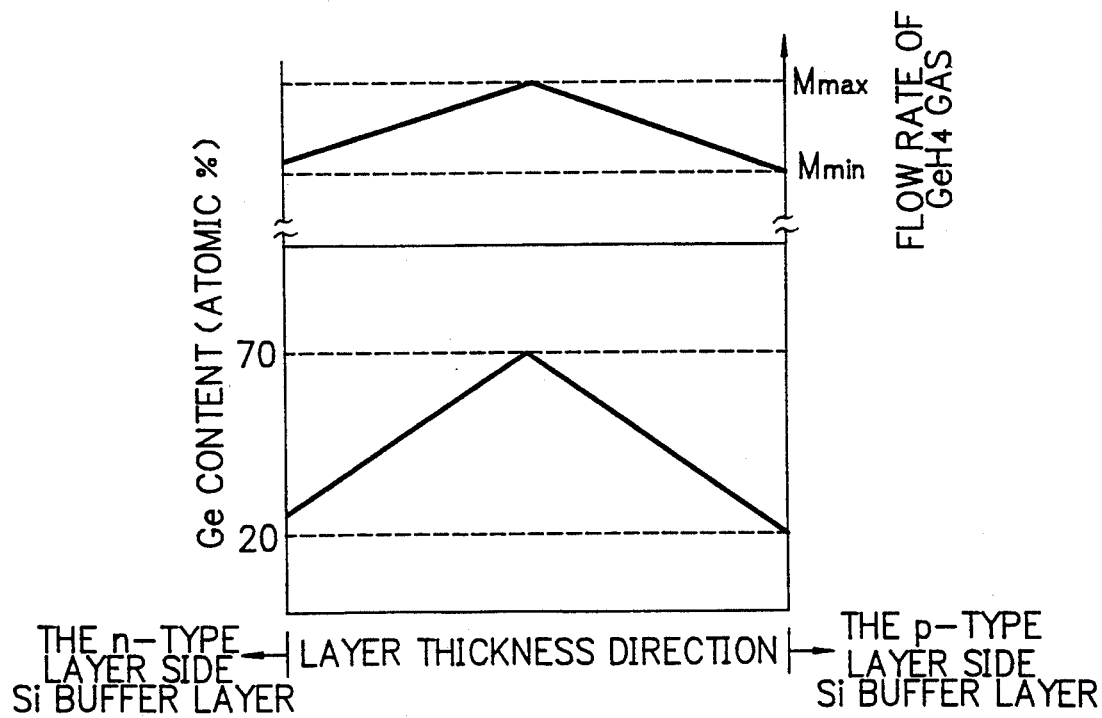
FIG. 13 is a schematic view showing a second flow rate diagram for GeH$_4$ gas used during forming a film containing Si and Ge atoms in Example 1 the present invention.

The procedures of forming the pin junction photovoltaic device sample (Sample No. 11-1) were repeated, except that the introduction of the $GeH_4$ gas in the step 1-(3) of forming the i-type semiconductor layer 104 was conducted on the basis of the flow rate variation curve shown in FIG. 13 and the introduction of the $GeH_4$ gas in the step 2-(3) of forming the i-type semiconductor layer 107 was conducted on the basis of the flow rate variation curve shown in FIG. 13, to thereby obtain a triple cell type pin junction photovoltaic device sample (Sample No. 11-2).

Preparation of a pin junction photovoltaic device sample (Sample No. 11-3)

Figure 14:
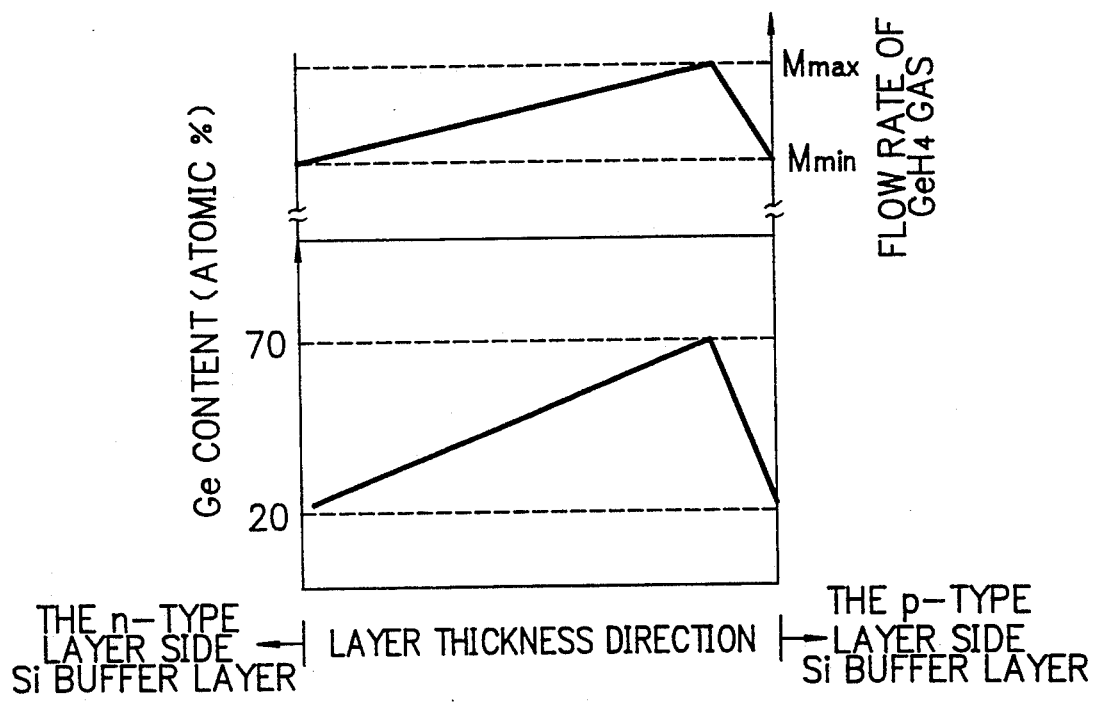
FIG. 14 is a schematic view showing a third flow rate diagram for GeH$_4$ gas used during forming a film containing Si and Ge atoms in Example 1 the present invention.

The procedures of forming the pin junction photovoltaic device sample (Sample No. 11-1) were repeated, except that the introduction of the $GeH_4$ gas in the step 1-(3) of forming the i-type semiconductor layer 104 was conducted on the basis of the flow rate variation curve shown in FIG. 14 and the introduction of the $GeH_4$ gas in the step 2-(3) of forming the i-type semiconductor layer 107 was conducted on the basis of the flow rate variation curve shown in FIG. 14, to thereby obtain a triple cell type pin junction photovoltaic device sample (Sample No. 11-3).

Preparation of a pin junction photovoltaic device sample (Sample No. 11-4)

Figure 15:
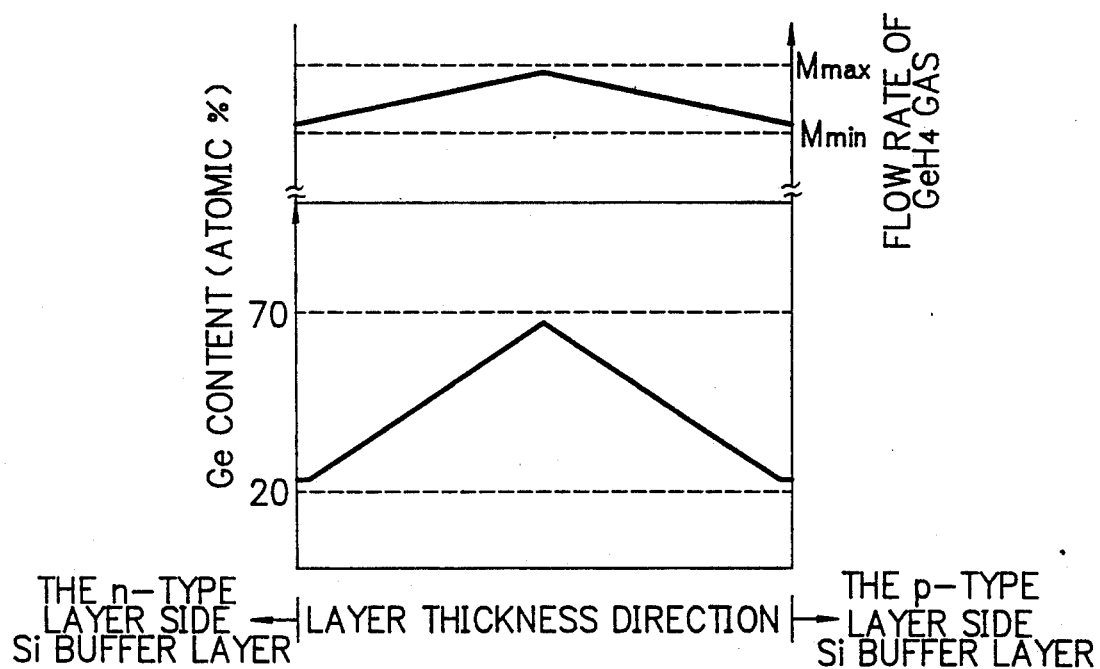
FIG. 15 is a schematic view showing a fourth flow rate diagram for GeH$_4$ gas used during forming a film containing Si and Ge atoms in Example 1 the present invention.

The procedures of forming the pin junction photovoltaic device sample (Sample No. 11-1) were repeated, except that the introduction of the $GeH_4$ gas in the step 1-(3) of forming the i-type semiconductor layer 104 was conducted on the basis of the flow rate variation curve shown in FIG. 15 and the introduction of the $GeH_4$ gas in the step 2-(3) of forming the i-type semiconductor layer 107 was conducted on the basis of the flow rate variation curve shown in FIG. 15, to thereby obtain a triple cell type pin junction photovoltaic device sample (Sample No. 11-4).

COMPARATIVE EXAMPLE 1

There were prepared three comparative pin junction photovoltaic samples (Sample Nos. 21-1 to 21-3) of the same layer constitution as that of the pin junction photovoltaic device shown in FIG. 10, except that each of the i-type semiconductor layer 104 and the i-type semiconductor layer 107 in each of them is constituted by an a-SiGe:H semiconductor film with a concentration distribution of the Ge atoms which is monotonously decreased or increased in the thickness direction or with a uniform concentration distribution of the Ge atoms.

Preparation of a comparative pin junction photovoltaic device sample (Sample No. 21-1)

Figure 16:
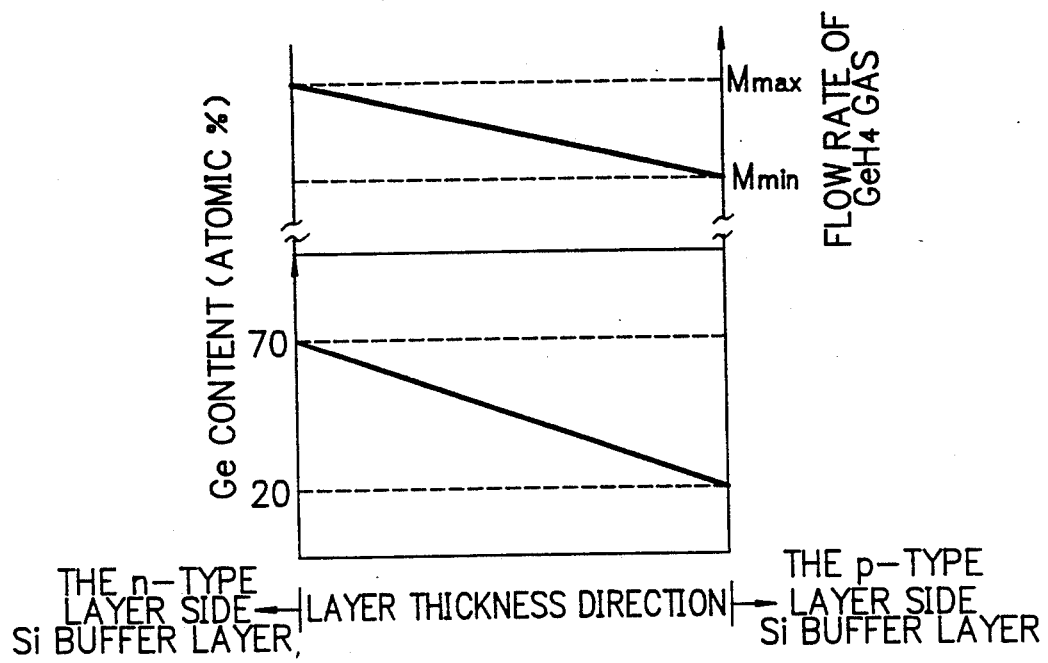
FIG. 16 is a schematic view showing a first flow rate diagram for GeH$_4$ gas used during forming a film containing Si and Ge atoms in a Comparative Example.

The procedures of forming the pin junction photovoltaic device sample (Sample No. 11-1) were repeated, except that the introduction of the $GeH_4$ gas in the step 1-(3) of forming the i-type semiconductor layer 104 was conducted on the basis of the flow rate variation curve shown in FIG. 16 and the introduction of the $GeH_4$ gas in the step 2-(3) of forming the i-type semiconductor layer 107 was conducted on the basis of the flow rate variation curve shown in FIG. 16, to thereby obtain a comparative triple cell type pin junction photovoltaic device sample (Sample No. 21-1).

Preparation of a comparative pin junction photovoltaic device sample (Sample No. 21-2)

Figure 17:
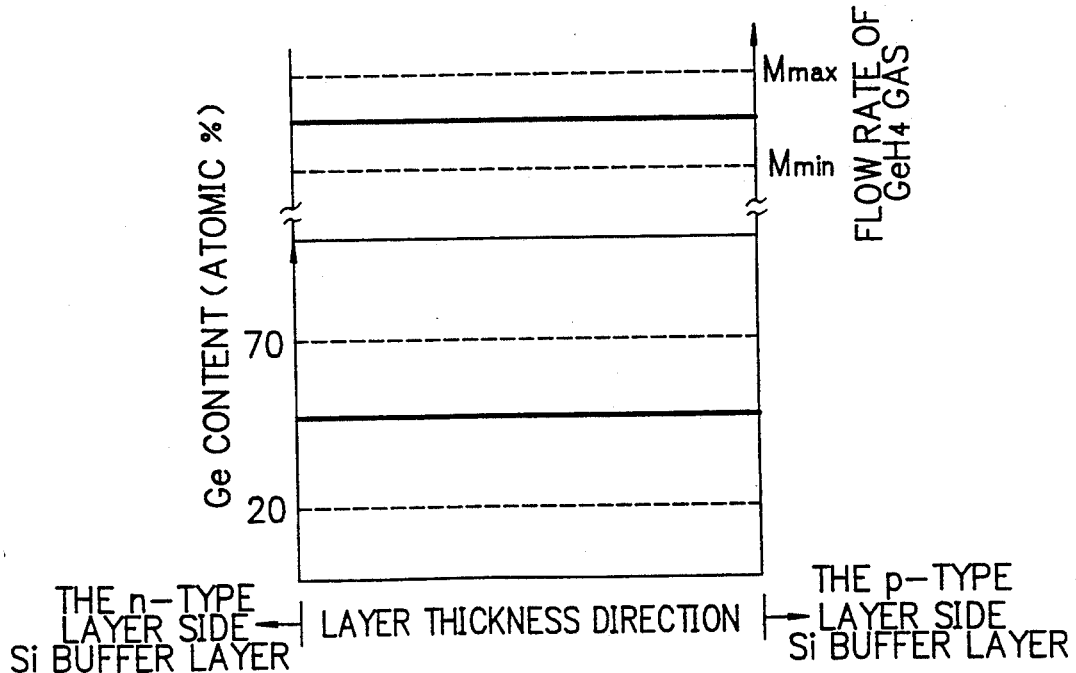
FIG. 17 is a schematic view showing a second flow rate diagram for GeH$_4$ gas used during forming a film containing Si and Ge atoms in a Comparative Example.

The procedures of forming the pin junction photovoltaic device sample (Sample No. 11-1) were repeated, except that the introduction of the $GeH_4$ gas in the step 1-(3) of forming the i-type semiconductor layer 104 was conducted on the basis of the flow rate variation curve shown in FIG. 17 and the introduction of the $GeH_4$ gas in the step 2-(3) of forming the i-type semiconductor layer 107 was conducted on the basis of the flow rate variation curve shown in FIG. 17, to thereby obtain a comparative triple cell type pin junction photovoltaic device sample (Sample No. 21-2).

Preparation of a comparative pin junction photovoltaic device sample ( Sample No. 21-3)

Figure 18:
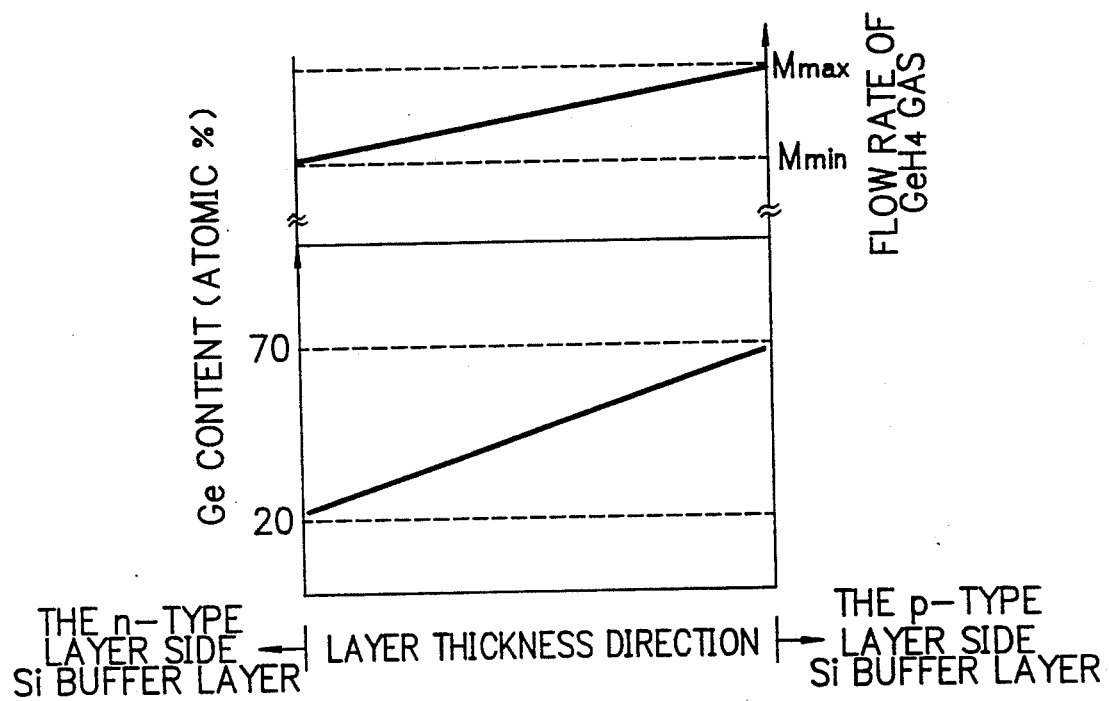
FIG. 18 is a schematic view showing a third flow rate diagram for GeH$_4$ gas used during forming a film containing Si and Ge atoms in a Comparative Example.

The procedures of forming the pin junction photovoltaic device sample (Sample No. 11-1) were repeated, except that the introduction of the $GeH_4$ gas in the step 1-(3) of forming the i-type semiconductor layer 104 was conducted on the basis of the flow rate variation curve shown in FIG. 18 and the introduction of the $GeH_4$ gas in the step 2-(3) of forming the i-type semiconductor layer 107 was conducted on the basis of the flow rate variation curve shown in FIG. 18, to thereby obtain a comparative triple cell type pin junction photovoltaic device sample (Sample No. 21-3).

COMPARATIVE EXAMPLE 2

There were prepared three comparative pin junction photovoltaic samples (Sample Nos. 21-4 to 21-6) of the same layer constitution as that of the pin junction photovoltaic device shown in FIG. 10, except that each of the i-type semiconductor layer 104 and the i-type semiconductor layer 107 in each of them is constituted by an a-SiGe:H semiconductor film with a maximum concentration point for the Ge atoms at a central position in the thickness direction.

Preparation of a comparative pin junction photovoltaic device sample (Sample No. 21-4)

Figure 19:
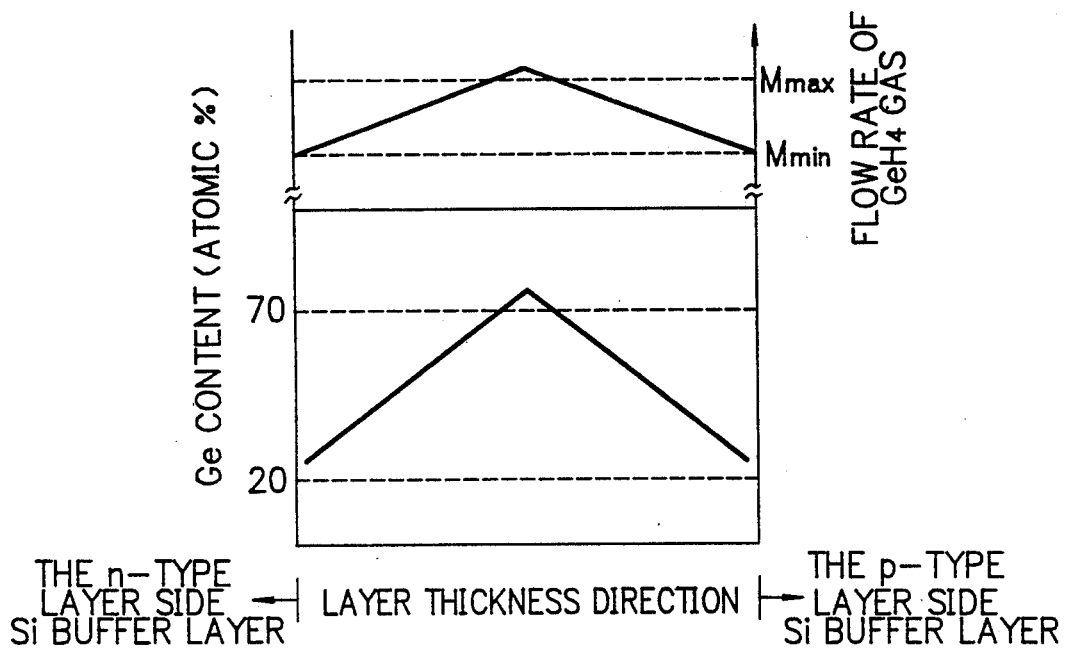
FIG. 19 is a schematic view showing a fourth flow rate diagram for GeH$_4$ gas used during forming a film containing Si and Ge atoms in a Comparative Example.

The procedures of forming the pin junction photovoltaic device sample (Sample No. 11-1) were repeated, except that the introduction of the $GeH_4$ gas in the step 1-(3) of forming the i-type semiconductor layer 104 was conducted on the basis of the flow rate variation curve shown in FIG. 19 and the introduction of the $GeH_4$ gas in the step 2-(3) of forming the i-type semiconductor layer 107 was conducted on the basis of the flow rate variation curve shown in FIG. 19, to thereby obtain a comparative triple cell type pin junction photovoltaic device sample in which the a-SiGe:H semiconductor film of which each of the i-type semiconductor layer 104 and the i-type semiconductor layer 107 is constituted has a maximum concentration point for the Ge atoms in an amount exceeding 70 atomic % at a central position in the thickness direction and (Sample No. 21-4).

Preparation of a comparative pin junction photovoltaic device sample (Sample No. 21-5)

Figure 20:
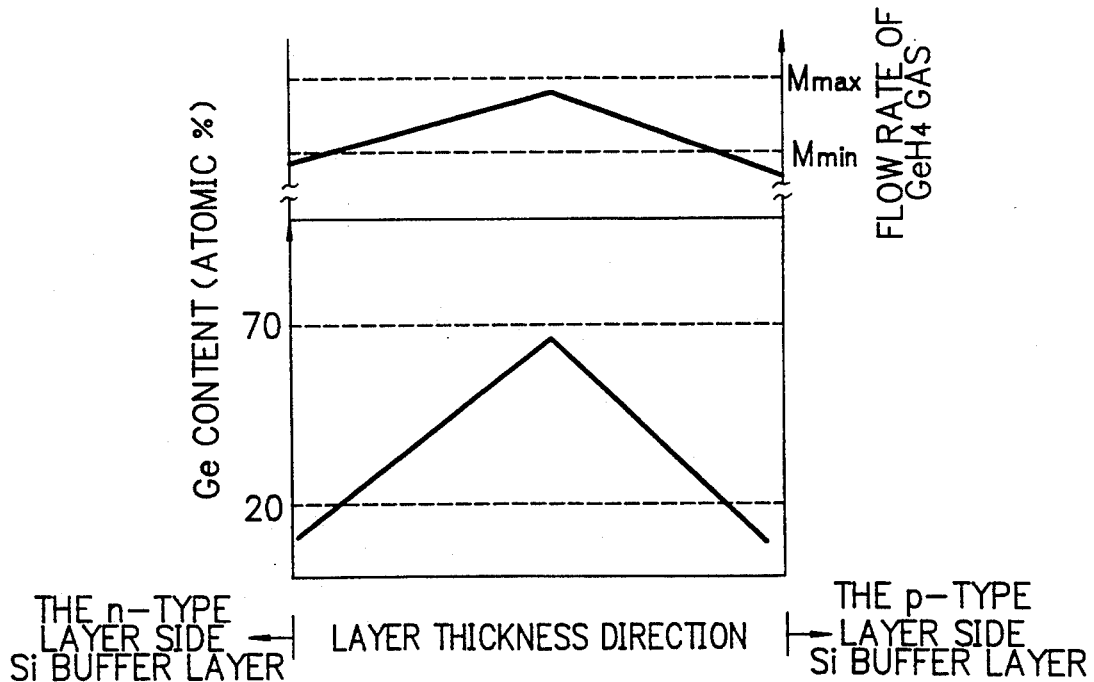
FIG. 20 is a schematic view showing a fifth flow rate diagram for GeH$_4$ gas used during forming a film containing Si and Ge atoms in Comparative Example.

The procedures of forming the pin junction photovoltaic device sample (Sample No. 11-1) were repeated, except that the introduction of the GeH$_4$ gas in the step 1-(3) of forming the i-type semiconductor layer 104 was conducted on the basis of the flow rate variation curve shown in FIG. 20 and the introduction of the GeH$_4$ gas in the step 2-(3) of forming the i-type semiconductor layer 107 was conducted on the basis of the flow rate variation curve shown in FIG. 20, to thereby obtain a comparative triple cell type pin junction photovoltaic device sample in which the a-SiGe:H semiconductor film of which each of the i-type semiconductor layer 104 and the i-type semiconductor layer 107 is constituted has a maximum concentration point for the Ge atoms in an amount of less than 70 atomic % at a central position in the thickness direction and has a minimum concentration point for the Ge atoms in an amount of less than 20 atomic % at each of the opposite sides (Sample No. 21-5).

Preparation of a comparative pin junction photovoltaic device sample (Sample No. 21-6)

Figure 21:
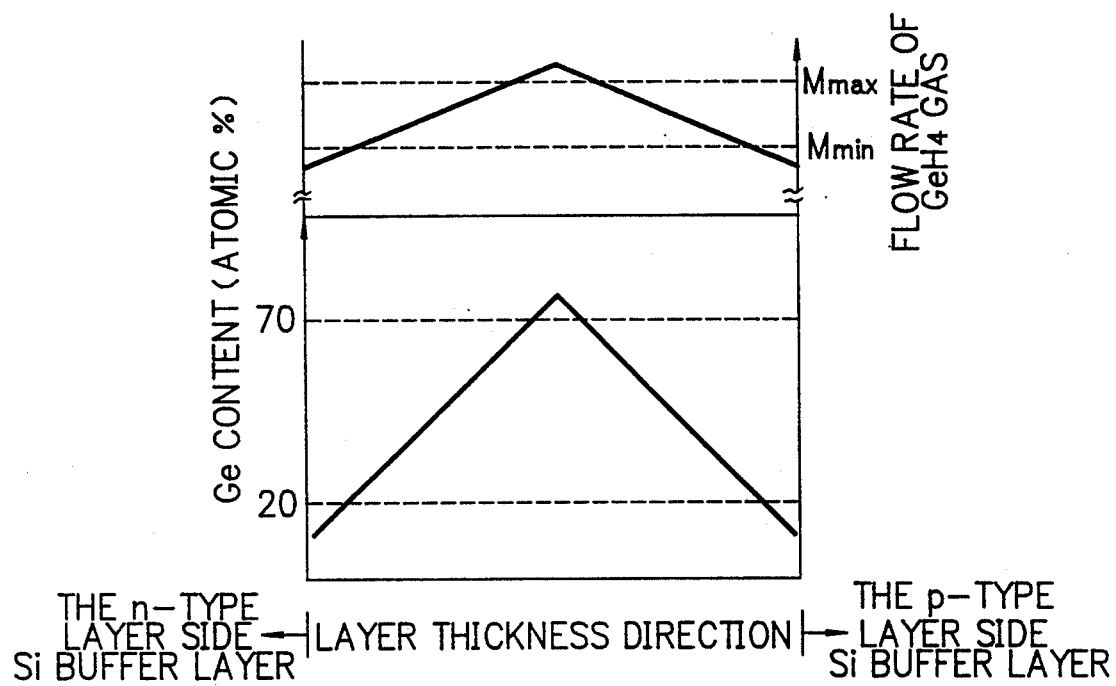
FIG. 21 is a schematic view showing a sixth flow rate diagram for GeH$_4$ gas used during forming a film containing Si and Ge atoms in a Comparative Example.

The procedures of forming the pin junction photovoltaic device sample (Sample No. 11-1) were repeated, except that the introduction of the GeH$_4$ gas in the step 1-(3) of forming the i-type semiconductor layer 104 was conducted on the basis of the flow rate variation curve shown in FIG. 21 and the introduction of the GeH$_4$ gas in the step 2-(3) of forming the i-type semiconductor layer 107 was conducted on the basis of the flow rate variation curve shown in FIG. 21, to thereby obtain a comparative triple cell type pin junction photovoltaic device sample in which the a-SiGe:H semiconductor film of which each of the i-type semiconductor layer 104 and the i-type semiconductor layer 107 is constituted has a maximum concentration point for the Ge atoms in an amount exceeding 70 atomic % at a central position in the thickness direction and has a minimum concentration point for the Ge atoms in an amount of less than 20 atomic % at each of the opposite sides (Sample. No. 21-6).

Evaluation

Each of the pin junction photovoltaic device samples (Sample Nos. 11-1 to 11-4) obtained in Example 1 and the comparative pin junction photovoltaic device samples (Sample Nos. 21-1 to 21-6) obtained in Comparative Examples 1 to 2 was examined with respect to its initial photoelectric conversion efficiency and physical quantity in terms of deterioration factor in the following manner.

(i) The current/voltage characteristics including open-circuit voltage (Voc) and short-circuit current (Isc) were measured by a conventional method, wherein AM-1.5 light was irradiated to the sample through its transparent and conductive electrode 112 side with an intensity of 100 mW/cm$^2$. An initial photoelectric conversion efficiency $\eta_o$ based on the measured results was thus obtained.

(ii) The sample was placed on a sample table provided with a temperature controlling mechanism. The sample was maintained at 25° C., and AM-1.5 light was continuously irradiated to the sample through its transparent and conductive electrode 112 side with an intensity of 100 mW/cm$^2$ for 500 hours. The current/voltage characteristics including open-circuit voltage (Voc) and short-circuit current (Isc) were measured by a conventional method. Photoelectric conversion efficiency $\eta$ based on the measured results was thereby obtained.

Based on the value of $\eta_o$ obtained in the above (i) and the value of $\eta$ obtained in the above (ii), there was obtained a value of $(\eta_o-\eta)/\eta_o$ indicating the deterioration factor.

The above evaluation was conducted for each of the samples.

The results obtained are collectively shown in Table 4, in which the values of initial and after light irradiation photoelectric conversion efficiencies of each of the samples (Sample Nos. 11-1 to 11-4, and 21-2 to 21-6) are given relative to those of the sample (Sample No. 21-1) which were set at a value of 1.

From the results shown in Table 4, it is understood that each of the pin junction photovoltaic device samples (Sample Nos. 11-1 to 11-4) obtained in Example 1 of the present invention surpasses each of the comparative photovoltaic device samples (Sample Nos. 21-1 to 21-6) not only in terms of initial photoelectric conversion efficiency but also in terms of deterioration factor (that is, photoelectric conversion efficiency after continuous light irradiation over a long period of time).

EXAMPLE 2

There were prepared seven pin junction photovoltaic device samples (Samples Nos. 12-1 to 12-7) of the configuration shown in FIG. 10 wherein the buffer layers 117, 118, 119, and 120 are of a given identical thickness which is different in each case, by repeating the procedures of preparing the pin junction photovoltaic device sample of Sample No. 11-3 in Example 1.

Preparation of a pin junction photovotaic device (Sample No. 12-1)

The procedures of preparing the pin junction photovoltaic device sample of Sample No. 11-3 in Example 1 were repeated, except that each of the buffer layers 117, 118, 119, and 120 was formed at a thickness of 10 Å, to thereby form a triple cell type pin junction photovoltaic device sample (Sample No. 12-1).

Preparation of a pin junction photovotaic device (Sample No. 12-2)

The procedures of preparing the pin junction photovoltaic device sample of Sample No. 11-3 in Example 1 were repeated, except that each of the buffer layers 117, 118, 119, and 120 was formed at a thickness of 30 Å, to thereby form a triple cell type pin junction photovoltaic device sample (Sample No. 12-2).

Preparation of a pin junction photovotaic device (Sample No. 12-3)

The procedures of preparing the pin junction photovoltaic device sample of Sample No. 11-3 in Example 1 were repeated, except that each of the buffer layers 117, 118, 119, and 120 was formed at a thickness of 50 Å, to thereby form a triple cell type pin junction photovoltaic device sample (Sample No. 12-3).

Preparation of a pin junction photovotaic device (Sample No. 12-4)

The procedures of preparing the pin junction photovoltaic device sample of Sample No. 11-3 in Example 1 were repeated, except that each of the buffer layers 117, 118, 119, and 120 was formed at a thickness of 100 Å, to thereby form a triple cell type pin junction photovoltaic device sample (Sample No. 12-4).

Preparation of a pin junction photovotaic device (Sample No, 12-5)

The procedures of preparing the pin junction photovoltaic device sample of Sample No. 11-3 in Example 1 were repeated, except that each of the buffer layers 117, 118, 119, and 120 was formed at a thickness of 500 Å, to thereby form a triple cell type pin junction photovoltaic device sample (Sample No. 12-5).

Preparation of a pin junction photovotaic device (Sample No. 12-6)

The procedures of preparing the pin junction photovoltaic device sample of Sample No. 11-3 in Example 1 were repeated, except that each of the buffer layers 117, 118, 119, and 120 was formed at a thickness of 1000 Å, to thereby form a triple cell type pin junction photovoltaic device sample (Sample No. 12-6).

Preparation of a pin junction photovoltaic device (Sample No. 12-7)

The procedures of preparing the pin junction photovoltaic device sample of Sample No. 11-3 in Example 1 were repeated, except that each of the buffer layers 117, 118, 119, and 120 was formed at a thickness of 1200 Å, to thereby form a triple cell type pin junction photovoltaic device sample (sample No. 12-7).

Independently, for comparative purposes, the procedures of preparing the pin junction photovoltaic device sample of Sample No. 11-3 in Example 1 were repeated, except that none of the buffer layers 117, 118, 119 and 120 was formed, to thereby form a comparative triple cell type pin junction photovoltaic device sample without any buffer layers (Sample No. 22-1).

Evaluation

For each of the pin junction photovoltaic device samples (Sample Nos. 12-1 to 12-7) and the comparative pin junction photovoltaic device sample obtained in the above, its deterioration factor was determined in the following manner.

(i) The current/voltage characteristics including open-circuit voltage (Voc) and short-circuit current (Isc) were measured by a conventional method, wherein AM-1.5 light was irradiated to the sample through its transparent and conductive electrode 112 side with an intensity of 100 mW/cm$^2$. An initial photoelectric conversion efficiency $\eta_o$ based on the measured results was thus obtained.

(ii) The sample was placed on a sample table provided with a temperature controlling mechanism. The sample was maintained at 25° C., and AM-1.5 light was continuously irradiated to the sample through its transparent and conductive electrode 112 side with an intensity of 100 mW/cm$^2$ for 500 hours. The current/voltage characteristics including open-circuit voltage (Voc) and short-circuit current (Isc) were measured by a conventional method. Photoelectric conversion efficiency $\eta$ based on the measured results was thereby obtained.

Based on the value of $\eta_o$ obtained in the above (i) and the value of $\eta$ obtained in the above (ii), there was obtained a value of $(\eta_o-\eta)/\eta_o$ indicating the deterioration factor.

The above evaluation was conducted for each of the samples (Sample Nos. 12-1 to 12-7).

The comparative sample (Sample No. 22-1) obtained in the above was also examined with respect to its initial photoelectric conversion efficiency and deterioration factor in the manner above described.

The results obtained are collectively shown in Table 5, in which the values of initial and after light irradiation photoelectric conversion efficiencies for each of Samples Nos. 12-1 to 12-7 are given relative to those of the comparative sample (Sample No. 22-1) which were set at a value of 1.

From the results shown in Table 5, it is understood that each of the pin junction photovoltaic device samples in which the buffer layers are of a thickness of from 50 to 100 Å surpasses each of the pin junction photovoltaic device samples in which the buffer layers are of a thickness of less than 50 Å or more than 1000 Å not only in terms of initial photoelectric conversion efficiency but also in terms of deterioration factor (that is, photoelectric conversion efficiency after continuous light irradiation over a long period of time).

EXAMPLE 3

In this example, there was prepared a triple cell type pin junction photovoltaic device of the configuration shown in FIG. 10, in which the i-type semiconductor layer 104 of the bottom cell is constituted by an a-SiGe:H semiconductor film with a maximum concentration point containing the Ge atoms in an amount of 56.0 atomic % (minimum energy band gap: 1.37 eV) and a minimum concentration point containing the Ge atoms in an amount of 22.0 atomic % at each of opposite sides (maximum energy band gap: 1.58 eV) and the i-type semiconductor layer 107 of the middle cell is constituted by an a-SiGe:H semiconductor film with a maximum concentration point containing the Ge atoms in an amount of 40.5 atomic % (minimum energy band Gap: 1.45 eV) and a minimum concentration point containing the Ge atoms in an amount of 22.0 atomic % at each of the opposite sides (maximum energy band gap: 1.58 eV).

This pin junction photovoltaic device was prepared following the procedures of Example using the film-forming apparatus shown in FIG. 5.

That is, there was firstly provided a stainless steel plate of 50 mm×50 mm in size as the substrate 101.

On the stainless steel plate as the substrate 101, there was formed an Ag thin film of about 1000 Å in thickness as the lower electrode 103 by using a conventional sputtering apparatus, wherein an Ag target was sputtered using Ar gas as the sputtering gas.

The substrate having the Ag thin film formed thereon was introduced into the load lock chamber 213 of the film-forming apparatus shown in FIG. 5, wherein it was fixed to the substrate holder 202 on the transportation mechanism 206 in the way as shown in FIG. 5 wherein the surface of the substrate (that is, the surface of the Ag thin film as the lower electrode 102 in this case) faces downward.

Then, the load lock chamber 206 was evacuated to a vacuum of less than $1 \times 10^{-5}$ Torr by operating a vacuum pump (not shown) for the load lock chamber 206. In this case, the film-forming chamber 201 was evacuated to and maintained at a vacuum of less than $1 \times 10^{-5}$ Torr by operating the vacuum pump 215.

After the inner pressures of the two chambers became substantially identical, the gate valve 207 was opened, and the substrate holder 202 having the substrate arranged thereon was transferred into the film-forming Chamber 201 by means of the transportation mechanism 206 under vacuum conditions. Thereafter, the gate valve 207 was closed.

The substrate holder 202 was moved so as to provide a distance of 30 mm between the surface of the Ag thin film on the substrate and the surface of the cathode electrode 212 by operating the transportation mechanism 206.

1. Formation of bottom cell (BCL)

1-(1). Formation of the n-type semiconductor layer 103

The substrate was heated so that the temperature of the surface thereof became 250° C. by actuating the heater 205. The surface of the substrate was maintained at this temperature. Thereafter, $Si_2H_6$ gas, $H_2$ gas, and $PH_3$ gas diluted to 1% with $H_2$ gas (hereinafer referred to as $PH_3/H_2$ gas (1%)) were introduced into the reaction space of the film-forming chamber 201 at respective flow rates of 10 sccm, 500 sccm, and 12 sccm through the gas feed pipes 208 and 209. The inner pressure of the film-forming chamber 201 was controlled to 1.5 Torr by adjusting the opening of the throttle valve 214. After the three gases became stable at the above respective flow rates, the high frequency power source 210 was switched on to apply a high frequency power of 20 W (13.56 MHz) to the cathode electrode 212, wherein plasma was produced to cause the formation of an n-type $\mu c$-Si:H:P film of 200 Å in thickness on the surface of the Ag thin film as the lower electrode 102 of the substrate. Thus, there was formed the n-type semiconductor layer 103.

After the formation of the n-type semiconductor layer 103 was completed, the introduction of the above gases was terminated, and at the same time, the application of the high frequency power was terminated. Then, the film-forming chamber 201 was evacuated to a vacuum of less than $1 \times 10^{-5}$ Torr. The film-forming chamber 216 was also evacuated to and maintained at a vacuum of less than $1 \times 10^{-5}$ Torr by operating the vacuum pump (not shown) for the film-forming chamber 216. After the inner pressures of the two film-forming chambers became substantially identical, the gate valve 207' was opened, and the substrate holder 202 having the substrate thereon was transferred into the film-forming chamber 216 by means of the transportation mechanism 206 under vacuum conditions. Thereafter, the gate valve 207' was closed.

1-(2). Formation of the buffer layer 117

In the film-forming chamber 216, the substrate was heated so that the temperature of the surface thereof became 200° C. by actuating the heater 205. The surface of the substrate was maintained at this temperature. Then, the film-forming procedures of forming the n-type semiconductor layer 103 in the above 1-(1) were repeated, except that the film-forming conditions were changed as follows:

gases used & flow rate:
$Si_2H_6$ gas: 10 sccm
$H_2$ gas: 500 sccm
inner pressure: 1.2 Torr
high frequency power applied: 15 W Thus, there was formed a non-doped a-Si:H film of 200 Å in thickness as the buffer layer 117 on the n-type semiconductor layer 103.

1-(3). Formation of the i-type semiconductor layer 104

Figure 22:
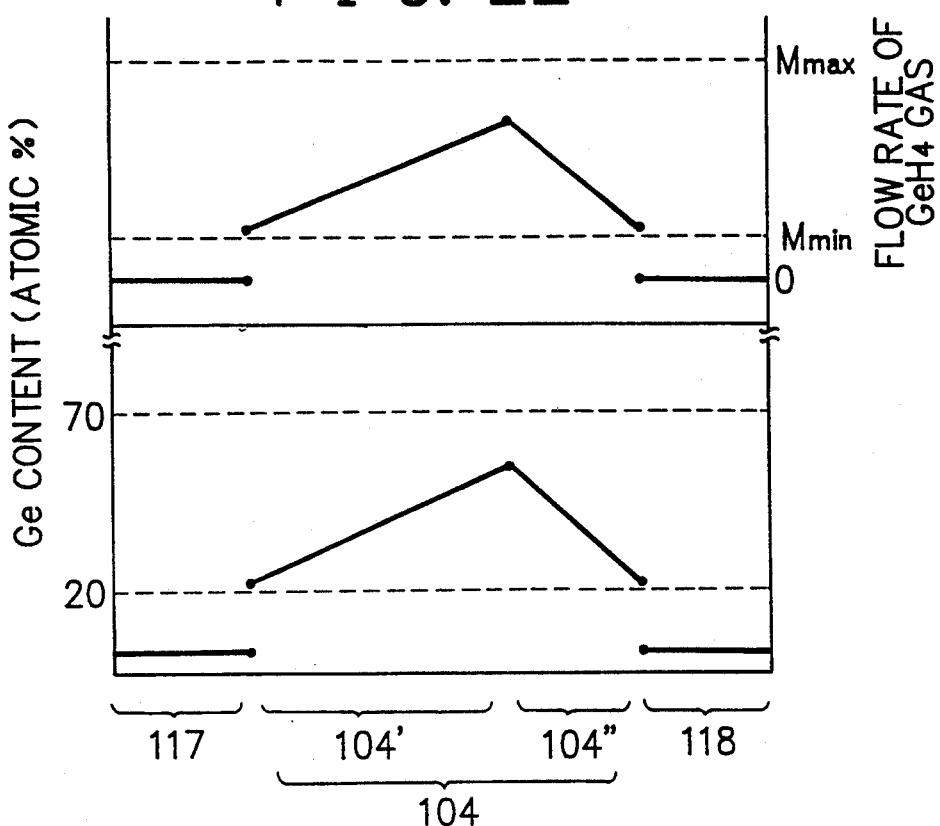
FIG. 22 is a schematic view showing a flow rate diagram for GeH$_4$ gas used during forming an i-type layer and a buffer layer of the bottom cell of a photovoltaic device in Example 3 of the present invention which will be later described.

After the formation of the buffer layer 117 was completed, the application of the high frequency power was suspended. Then, the procedures of forming the buffer layer 117 in the above 1-(2) were repeated in the film-forming chamber 216, except that $GeH_4$ gas was additionally introduced into the reaction space of the film-forming chamber 216 firstly at a flow rate continuously increased from 1.5 sccm to 10 sccm, wherein a first i-type semiconductor layer region comprising an a-SiGe:H semiconductor film of 2000 Å in thickness as the i-type semiconductor layer region 104' was formed, and continuously at a flow rate continuously decreased from said 10 sccm to 1.5 sccm, wherein a second i-type semiconductor layer region comprising an a-SiGe:H semiconductor film of 800 Å in thickness as the i-type semiconductor layer region 104" was formed, (the flow rate variation of the $GeH_4$ gas in this case was conducted based on the flow rate variation curve shown in FIG. 22), to thereby form a 2800 Å thick non-doped a-SiGe:H film comprised of the first and second layer regions (that is, the i-type semiconductor layer regions 104' and 104") with a maximum concentration point containing the Ge atoms in an amount of 56.0 atomic % at the interface between the two layer regions and with a minimum concentration point containing the Ge atoms in an amount of 22.0 atomic % at each of opposite sides as the i-type semiconductor layer 104 on the buffer layer 117.

1-(4). Formation of the buffer layer 118

After the formation of the i-type semiconductor layer 104 was completed the introduction of the $GeH_4$ gas was terminated, and the application of the high frequency power was suspended. Then, the procedures of forming the buffer layer 117 in the above 1-(2) were repeated in the film-forming chamber 216 to thereby form a 200 Å thick non-doped a-Si:H film as the buffer layer 118 on the i-type semiconductor layer 104.

1-(5). Formation of the p-type semiconductor layer 105

After the formation of the buffer layer 118 was completed, the introduction of the $Si_2H_6$ gas and $H_2$ gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the two film-forming chambers became substantially identical, the gate valve 207' was opened, and the substrate holder 202 having the substrate thereon was transferred into the film-forming chamber 201 by means of the transportation mechanism 206 under vacuum condition. Thereafter, the gate valve 207' was closed.

The substrate was heated so that the temperature of the surface thereof became 230° C. by actuating the heater 205. The surface of the substrate was maintained at this temperature. Thereafter, $SiH_4$ gas, $H_2$ gas, and $BF_3$ gas diluted to 2% with $H_2$ gas (hereinafer referred to as $BF_3/H_2$ gas (2%)) were introduced into the reaction space of the film-forming chamber 201 at respective flow rates of 5 sccm, 500 sccm, and 5 sccm. The inner pressure of the film-forming chamber 201 was controlled to 1.5 Torr by adjusting the opening of the throttle valve 214. After the three gases became stable at the above respective flow rates, the high frequency power source 210 was switched on to apply a high frequency power of 150 W (13.56 MHz) to the cathode electrode 212, wherein plasma was produced to cause the formation of a p-type μc-Si:H:B film of 100 Å in thickness as the p-type semiconductor layer 105 on the buffer layer 118.

Thus, there was formed a bottom photovoltaic cell as the BCL.

2. Formation of middle cell (MCL)

2-(1). Formation of the n-type semiconductor layer 106

After the formation of the p-type semiconductor layer 105 was completed, the introduction of the SiH$_4$ gas, H$_2$ gas, and BF$_3$/H$_2$gas (2%) was terminated At the same time the application of the high frequency power was terminated. The film-forming chamber 201 was evacuated to a vacuum of less than $1 \times 10^{-5}$ Torr.

Then, the procedures of forming the n-type semiconductor layer 103 in the above 1-(1) were repeated to thereby form a 100 Å thick μc-Si:H:P film as the n-type semiconductor layer 106 on the p-type semiconductor layer 105.

2-(2). Formation of the buffer layer 119

After the formation of the n-type semiconductor layer 106 was completed, the introduction of the Si$_2$H$_6$ gas, H$_2$gas, and PH$_3$/H$_2$ gas (1%) was terminated, and at the same time, the application of the high frequency power was terminated. Then, the film-forming chamber 201 was evacuated to a vacuum of less than $1 \times 10^{-5}$ Torr. The film-forming chamber 216 was also evacuated to and maintained at a vacuum of less than $1 \times 10^{-5}$ Torr. After the inner pressures of the two film-forming chambers became substantially identical, the gate valve 207' was opened, and the substrate holder 202 having the substrate thereon was transferred into the film-forming chamber 216 by means of the transportation mechanism 206 under vacuum conditions. Thereafter, the gate valve 207' was closed.

In the film-forming chamber 216, the procedures of forming the buffer layer 117 in the above 1-(2) were repeated to thereby form a 100 Å thick non-doped a-Si:H film as the buffer layer 119 on the n-type semiconductor layer 106.

2-(3). Formation of the i-type semiconductor layer 107

Figure 23:
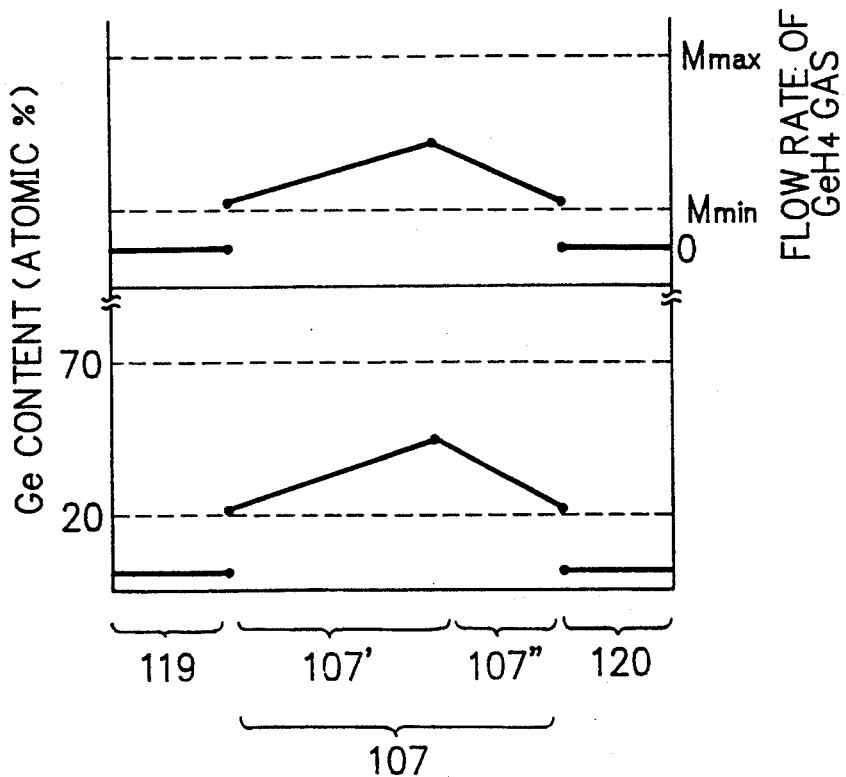
FIG. 23 is a schematic view showing a flow rate diagram for GeH$_4$ gas used during forming an i-type layer and a buffer of the middle cell of a photovoltaic device in Example 3 of the present invention which will be later described.
Figure 24:
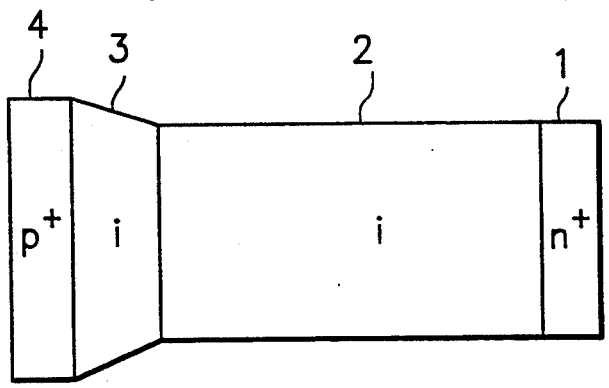
FIGS. 24 through 26 are schematic views respectively illustrating the profile of the energy band gap in known photovoltaic devices.
Figure 25:
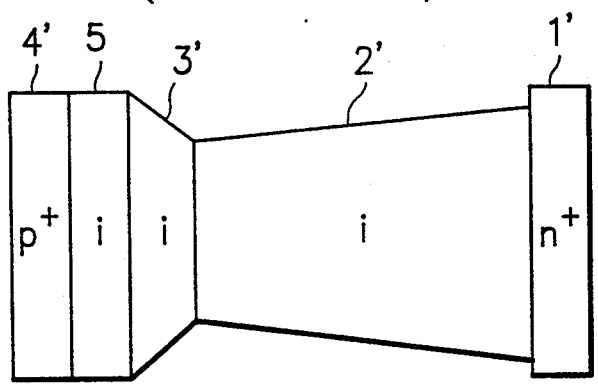
Figure 26:
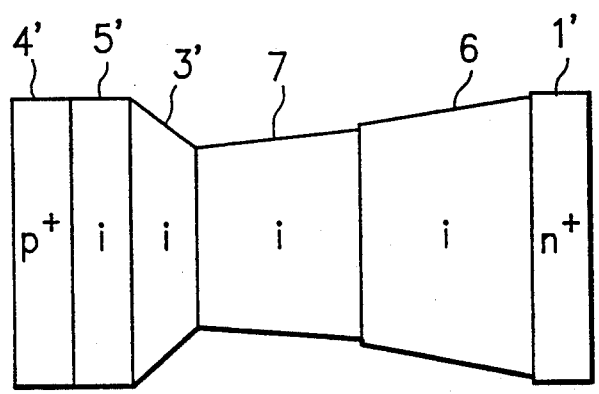

After the formation of the buffer layer 119 was completed, the application of the high frequency power was suspended. Then, the procedures of forming the buffer layer 119 in the above 2-(2) were repeated in the film-forming chamber 216, except that GeH$_4$ gas was additionally introduced into the reaction space of the film-forming chamber 216 firstly at a flow rate continuously increased from 1.5 sccm to 5.0 sccm, wherein a first i-type semiconductor layer region comprising an a-SiGe:H semiconductor film of 400 Å in thickness as the i-type semiconductor layer region 107' was formed, and continuously at a flow rate continuously decreased from said 5.0 sccm to 1.5 sccm, wherein a second i-type semiconductor layer region comprising an a-SiGe:H semiconductor film of 200 Å in thickness as the i-type semiconductor layer region 107" was formed, (the flow rate variation of the GeH$_4$ gas in this case was conducted based on the flow rate variation curve shown in FIG. 23), to thereby form a 600 Å thick non-doped a-SiGe:H film comprised of the first and second layer regions (that is, the i-type semiconductor layer regions 104' and 104") with a maximum concentration point containing the Ge atoms in an amount of 40.5 atomic % at the interface between the two layer regions and with a minimum concentration point containing the Ge atoms in an amount of 22.0 atomic % at each of opposite sides as the i-type semiconductor layer 107 on the buffer layer 119.

2-(4). Formation of the buffer layer 120

After the formation of the i-type semiconductor layer 107 was completed, the introduction of the GeH$_4$ gas was terminated, and the application of the high frequency power was suspended. Then, the procedures of forming the buffer layer 119 in the above 2-(2) were repeated in the film-forming chamber 216 to thereby form a 100 Å thick non-doped a-Si:H film as the buffer layer 120 on the i-type semiconductor layer 107.

2-(5). Formation of the p-type semiconductor layer 108

After the formation of the buffer layer 120 was completed, the introduction of the Si$_2$H$_6$ gas and H$_2$ gas was terminated. At the same time, the application of the high frequency power was terminated. The film-forming chamber 216 was evacuated to a vacuum of less than $1 \times 10^{-5}$ Torr. The film-forming chamber 201 was also evacuated to and maintained at a vacuum of less than $1 \times 10^{-5}$ Torr. After the inner pressures of the two film-forming chambers became substantially identical, the gate valve 207' was opened, and the substrate holder 202 having the substrate thereon was transferred into the film-forming chamber 201 by means of the transportation mechanism 206 under vacuum conditions. Thereafter, the gate valve 207' was closed.

The substrate was heated so that the temperature of the surface thereof became 200° C. by actuating the heater 205. The surface of the substrate was maintained at this temperature. Then, the procedures of forming the p-type semiconductor layer 105 in the above 1-(5) were repeated to thereby form a 100 Å thick μc-Si:H:B film as the p-type semiconductor layer 108 on the buffer layer 120.

Thus, there was formed a middle photovoltaic cell as the MCL.

3. Formation of top cell (TCL)

3-(1). Formation of the n-type semiconductor layer 109

After the formation of the p-type semiconductor layer 108 was completed, the introduction of the SiH$_4$ gas, H$_2$ gas, and BF$_3$/H$_2$ gas (2%) was terminated. At the same time, the application of the high frequency power was terminated. The film-forming chamber 201 was evacuated to a vacuum of less than $1 \times 10^{-5}$ Torr.

Then, the procedures of forming the n-type semiconductor layer 103 in the above 1-(1) were repeated to thereby form a 100 Å thick μc-Si:H:P film as the n-type semiconductor layer 109 on the p-type semiconductor layer 108.

3-(2). Formation of the i-type semiconductor layer 110

After the formation of the n-type semiconductor layer 106 was completed, the introduction of the Si$_2$H$_6$ gas, H$_2$gas, and PH$_3$/H$_2$ gas (1%) was terminated, and at the same time, the application of the high frequency power was terminated. Then, the film-forming chamber 201 was evacuated to a vacuum of less than $1 \times 10^{-5}$ Torr. The film-forming chamber 216 was also evacuated to and maintained at a vacuum of less than $1\times10^{-5}$ Torr by operating the vacuum pump (not shown) for the film-forming chamber 216. After the inner pressures of the two film-forming chambers became substantially identical, the gate valve 207' was opened, and the substrate holder 202 having the substrate thereon was transferred into the film-forming chamber 216 by means of the transportation mechanism 206 under vacuum conditions. Thereafter, the gate valve 207' was closed.

Then, the substrate was heated so that the temperature of the surface thereof became 250° C. by actuating the heater. The surface of the substrate was maintained at this temperature. Thereafter, $Si_2H_6$ gas and $H_2$ gas were introduced into the reaction space of the film-forming chamber 216 at respective flow rates of 10 sccm and 500 sccm. The inner pressure of the film-forming chamber 216 was controlled to 1.1 Torr by adjusting the opening of the throttle valve. After the two gases became stable at the above respective flow rates, the high frequency power source was switched on to apply a frequency power of 15 W (13.56 MHz) to the cathode electrode 212. By this, there was formed a 600 Å thick non-doped a-Si:H film at the i-type semiconductor layer 110 on the n-type semiconductor layer 109.

3-(3). Formation of the p-type semiconductor layer 111

After the formation of the i-type semiconductor layer 110 was completed, the introduction of the $Si_2H_6$ gas and $H_2$ gas was terminated. At the same time, the application of the high frequency power was terminated. The film-forming chamber 216 was evacuated to a vacuum of less than $1\times10^{-5}$ Torr. The film-forming chamber 201 was also evacuated to and maintained at a vacuum of less than $1\times10^{-5}$ Torr. After the inner pressures of the two film-forming chambers became substantially identical, the gate valve 207' was opened, and the substrate holder 202 having the substrate thereon was transferred into the film-forming chamber 201 by means of the transportation mechanism 206 under vacuum condition. Thereafter, the gate valve 207' was closed.

The substrate was heated so that the temperature of the surface thereof became 230° C. The surface of the substrate was maintained at this temperature. Then, the procedures of forming the p-type semiconductor layer 105 in the above 1-(5) were repeated to thereby form a 100 Å thick μc-Si:H:B film as the p-type semiconductor layer 111 on the i-type semiconductor layer 110.

Thus, there was formed a top photovoltaic cell as the TCL.

After the formation of the TCL was completed, the high frequency power source was switched off. At the same time, the heater was also switched off. And the introduction of the gases was stopped. Successively, the operation of the vacuum pump was stopped. Then, the inner pressure of the film-forming chamber 201 was returned to normal pressure. The substrate having the BCL, MCL, and TCL formed thereon was transferred into the load lock chamber 213 by means of the transportation mechanism 206, wherein it was cooled to room temperature. The substrate was then taken out from the load lock chamber.

Thereafter, the substrate having the BCL, MCL, and TCL formed thereon was introduced into a conventional vacuum evaporation apparatus having an evaporation boat containing a mixture composed of fine particles of In and fine particles of Sn with a mixing ratio of 1:1 in terms of weight ratio therein. The substrate was heated to and maintained at 170° C. The inside of the vacuum evaporation apparatus was evacuated to a vacuum of less than $1\times10^{-5}$ Torr. $O_2$ gas was then introduced into the vacuum evaporation apparatus. The inner pressure of the vacuum evaporation apparatus was controlled to about $1\times10^{-3}$ Torr. Then, the metal mixture contained in the evaporation boat was evaporated by way of the resistance heating method to deposit an about 700 Å thick ITO film as the transparent and conductive electrode 112 on the p-type semiconductor layer 111 of the TCL. After the substrate was cooled to room temperature, it was taken out from the vacuum evaporation apparatus.

A mask pattern for the formation of a collecting electrode was then arranged on the surface of the previously formed ITO film. The resultant was introduced into a conventional vacuum evaporation device, wherein an about 0.8 μm thick Ag film was deposited by way of the resistance heating method, to thereby form a comb-shaped collecting electrode as the collecting electrode 113.

Thus, there was obtained a triple cell type pin junction photovoltaic device.

The pin junction photovoltaic device was evaluated in the same manner as in Example 1, wherein the foregoing comparative pin junction photovoltaic sample (Sample No. 21-1) (see, Table 4) was used as a comparison standard.

As a result, it was found that the value of the initial photoelectric conversion efficiency and the value of photoelectric conversion efficiency after continuous light irradiation for 500 hours of the pin junction photovoltaic device obtained in this example surpass by 1.14 and 1.13 times respectively those of the comparative pin junction photovoltaic device sample.

TABLE 1

| | |
|---|---|
| raw material gas A $Si_2H_6$ | 10 sccm |
| raw material gas B $H_2$ | 500 sccm |
| high frequency power applied | 15 W (13.56 MHz) |
| substrate temperature | 250° C. |
| inner pressure | 1.1 Torr |
| distance between substrate and electrode | 30 mm |

| Sample No. | flow rate of $GeH_4$ gas (sccm) | composition ratio of Ge (atomic %) | $Eg^{opt}$ (eV) |
|---|---|---|---|
| 1-1 | 0.5 | 12.5 | 1.65 |
| 1-2 | 1.0 | 19.5 | 1.60 |
| 1-3 | 1.5 | 22.0 | 1.58 |
| 1-4 | 3.0 | 29.0 | 1.54 |
| 1-5 | 4.5 | 38.5 | 1.48 |
| 1-6 | 5.5 | 45.0 | 1.44 |
| 1-7 | 6.5 | 48.0 | 1.42 |
| 1-8 | 7.2 | 50.0 | 1.41 |
| 1-9 | 10.0 | 56.0 | 1.37 |

TABLE 2

| identification No. | flow rate of $GeH_4$ gas (sccm) | composition ratio of Ge (atomic %) |
|---|---|---|
| 2-1 | 0.5 | 12.5 |
| 2-2 | 1.0 | 19.5 |
| 2-3 | 1.1 | 20.0 |
| 2-4 | 7.2 | 50.0 |
| 2-5 | 16 | 70.0 |

TABLE 2-continued

| identification No. | flow rate of GeH₄ gas (sccm) | composition ratio of Ge (atomic %) |
|---|---|---|
| 2-6 | 17 | 72.0 |
| 2-7 | 18 | 75.5 |

TABLE 3

| Element Sample No. | GeH₄ gas flow rate condition No. | GeH₄ gas flow rate condition No. | initial photoelectric conversion efficiency (relative value) | photoelectric conversion efficiency after light irradiation (relative value) | evaluation in terms of practical use |
|---|---|---|---|---|---|
| 1 | 2-1 | 2-1 | 1.0* | 1.0* | X |
| 2 | 2-1 | 2-2 | 1.1 | 1.2 | X |
| 3 | 2-1 | 2-3 | 1.2 | 1.0 | X |
| 4 | 2-1 | 2-4 | 1.2 | 1.1 | X |
| 5 | 2-1 | 2-5 | 1.2 | 1.0 | X |
| 6 | 2-1 | 2-6 | 1.1 | 1.1 | X |
| 7 | 2-1 | 2-7 | 0.9 | 1.0 | X |
| 8 | 2-2 | 2-1 | 1.1 | 1.0 | X |
| 9 | 2-2 | 2-2 | 1.0 | 0.9 | X |
| 10 | 2-2 | 2-3 | 1.2 | 1.0 | Δ |
| 11 | 2-2 | 2-4 | 1.2 | 0.9 | Δ |
| 12 | 2-2 | 2-5 | 1.1 | 0.9 | Δ |
| 13 | 2-2 | 2-6 | 1.0 | 1.0 | X |
| 14 | 2-2 | 2-7 | 1.0 | 0.8 | X |
| 15 | 2-3 | 2-1 | 1.3 | 0.8 | X |
| 16 | 2-3 | 2-2 | 1.2 | 0.7 | Δ |
| 17 | 2-3 | 2-3 | 2.0 | 0.1 | ⊙ |
| 18 | 2-3 | 2-4 | 1.9 | 0.2 | ○ |
| 19 | 2-3 | 2-5 | 2.0 | 0.1 | ⊙ |
| 20 | 2-3 | 2-6 | 1.2 | 0.7 | Δ |
| 21 | 2-3 | 2-7 | 1.0 | 0.8 | X |
| 22 | 2-4 | 2-1 | 1.1 | 1.0 | X |
| 23 | 2-4 | 2-2 | 1.3 | 0.9 | X |
| 24 | 2-4 | 2-3 | 1.2 | 0.1 | |
| 25 | 2-4 | 2-4 | 2.1 | 0.09 | |
| 26 | 2-4 | 2-5 | 2.0 | 0.08 | |
| 27 | 2-4 | 2-6 | 1.9 | 0.8 | Δ |
| 28 | 2-4 | 2-7 | 1.2 | 0.9 | X |
| 29 | 2-5 | 2-1 | 1.1 | 1.0 | X |
| 30 | 2-5 | 2-2 | 1.2 | 0.7 | Δ |
| 31 | 2-5 | 2-3 | 2.0 | 0.1 | |
| 32 | 2-5 | 2-4 | 1.9 | 0.07 | |
| 33 | 2-5 | 2-5 | 2.1 | 0.09 | |
| 34 | 2-5 | 2-6 | 1.4 | 0.8 | Δ |
| 35 | 2-5 | 2-7 | 1.3 | 1.0 | X |
| 36 | 2-6 | 2-1 | 1.2 | 1.0 | X |
| 37 | 2-6 | 2-2 | 1.2 | 0.8 | X |
| 38 | 2-6 | 2-3 | 1.3 | 0.5 | Δ |
| 39 | 2-6 | 2-4 | 1.2 | 0.6 | Δ |
| 40 | 2-6 | 2-5 | 1.3 | 0.6 | Δ |
| 41 | 2-6 | 2-6 | 1.2 | 0.8 | X |
| 42 | 2-6 | 2-7 | 1.0 | 0.7 | X |
| 43 | 2-7 | 2-1 | 0.8 | 0.7 | X |
| 44 | 2-7 | 2-2 | 0.9 | 0.6 | X |
| 45 | 2-7 | 2-3 | 0.8 | 0.3 | X |
| 46 | 2-7 | 2-4 | 0.9 | 0.3 | X |
| 47 | 2-7 | 2-5 | 0.9 | 0.5 | X |
| 48 | 2-7 | 2-6 | 0.9 | 0.4 | X |
| 49 | 2-7 | 2-7 | 0.8 | 0.4 | X |

⊙: excellent
○: good
Δ: practically acceptable
X: practically unacceptable
*comparison standard value

TABLE 4

Figure 12:
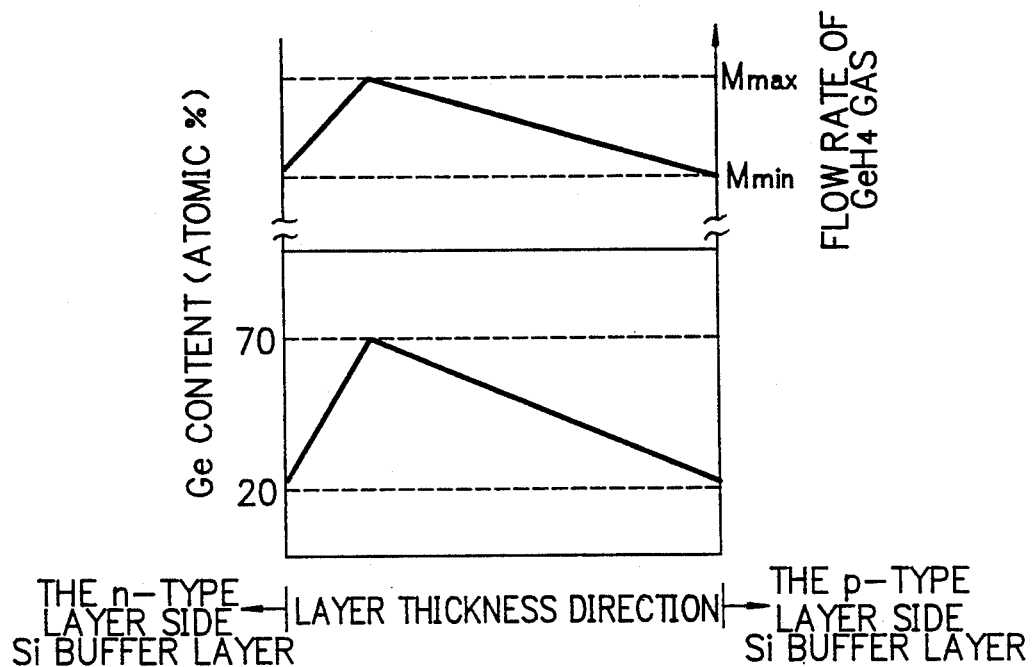
FIG. 12 is a schematic view showing a first flow rate diagram for GeH$_4$ gas used during forming a film containing Si and Ge atoms in Example 1 of the present invention.

| sample No. | Ge concentration distribution in each of the i-type semiconductor layers 104 & 107 | initial photoelectric conversion efficiency (relative value) | photoelectric conversion efficiency after light irradiation (relative value) |
|---|---|---|---|
| 11-1 | FIG. 12 | 1.11 | 1.11 |
| 11-2 | FIG. 13 | 1.12 | 1.11 |
| 11-3 | FIG. 14 | 1.13 | 1.12 |
| 11-4 | FIG. 15 | 1.12 | 1.11 |
| 21-1 | FIG. 16 | 1.00* | 1.00* |
| 21-2 | FIG. 17 | 1.01 | 1.01 |
| 21-3 | FIG. 18 | 1.02 | 1.01 |
| 21-4 | FIG. 19 | 1.02 | 1.01 |
| 21-5 | FIG. 20 | 1.03 | 1.00 |
| 21-6 | FIG. 21 | 1.01 | 1.00 |

*comparison standard value

TABLE 5

| sample No. | Si buffer layer thickness (Å) | initial photoelectric conversion efficiency (relative value) | photoelectric conversion efficiency after light irradiation (relative value) |
| --- | --- | --- | --- |
| 22-1 | 0 | 1.00* | 1.00* |
| 12-1 | 10 | 1.01 | 1.02 |
| 12-2 | 30 | 1.01 | 1.01 |
| 12-3 | 50 | 1.09 | 1.10 |
| 12-4 | 100 | 1.10 | 1.10 |
| 12-5 | 500 | 1.11 | 1.09 |
| 12-6 | 1000 | 1.10 | 1.10 |
| 12-7 | 1200 | 1.02 | 1.01 |

*comparison standard value

What is claimed is:

1. A pin junction photovoltaic device comprising a substrate and a pin junction semiconductor active layer region disposed on said substrate, said pin junction semiconductor active layer region comprising a p-type semiconductor layer composed of a p-type non-single crystalline semiconductor material, an i-type semiconductor layer composed of an i-type non-single crystalline semiconductor material, and an n-type semiconductor layer composed of an n-type non-single crystalline semiconductor material, characterized in that (a) a buffer layer comprising a non-single crystalline silicon semiconductor material substantially free of germanium atoms is interposed between said p-type semiconductor layer and said i-type semiconductor layer, (b) a buffer layer comprising a non-single crystalline silicon semiconductor material substantially free of germanium atoms is interposed between said i-type semiconductor layer and said n-type semiconductor layer, and said i-type semiconductor layer is formed of an amorphous silicon germanium semiconductor material containing the germanium atoms in an amount of 20 to 70 atomic % in the entire region in which the concentration distribution of the germanium atoms in the thickness direction is varied while providing a maximum concentration point.

2. A pin junction photovoltaic device according to claim 1, wherein the maximum concentration point of the germanium atoms in the i-type semiconductor layer is situated at a position lying toward the p-type semiconductor layer from the center of the i-type semiconductor layer in the thickness direction.

3. A pin junction photovoltaic device according to claim 1, wherein each of the buffer layers (a) and (b) is of a thickness in the range of from 50 to 1000 Å.

4. A pin junction photovoltaic device according to claim 1, wherein each of the buffer layers (a) and (b) comprises a hydrogenated amorphous silicon material.

5. A pin junction photovoltaic device according to claim 1, wherein the p-type semiconductor layer comprises a hydrogenated microcrystalline silicon material.

6. A pin junction photovoltaic device according to claim 1, wherein the p-type semiconductor layer comprises a silicon carbide material.

7. A pin junction photovoltaic device according to claim 1, wherein the n-type semiconductor layer comprises a hydrogenated amorphous silicon material or a hydrogenated microcrystalline silicon material.

8. A pin junction photovoltaic device according to claim 1, wherein the amount of the germanium atoms contained in the i-type semiconductor layer is in the range of from 30 to 70 atomic %.

9. A pin junction photovoltaic device according to claim 1, wherein the i-type semiconductor layer has an energy band gap in the range of from 1.35 to 1.60 eV at any portion of the i-type semiconductor layer.

10. A pin junction photovoltaic device according to claim 1, wherein the region having the maximum concentration point for the germanium atoms in the i-type semiconductor layer has an energy band gap in the range of from 1.35 to 1.60 eV.

11. A pin junction photovoltaic device comprising (a) a first pin junction cell and (b) a second pin junction cell, said first pin junction cell (a) and said second pin junction cell (b) being stacked in this order on a substrate, said pin junction photovoltaic device being of the type in which light is impinged from the side of said second pin junction cell (b), said first pin junction cell (a) comprising (a-i) a p-type semiconductor layer composed of a p-type non-single crystalline semiconductor material, (a-ii) an i-type semiconductor layer composed of an i-type non-single crystalline semiconductor material, and (a-iii) an n-type semiconductor layer composed of an n-type non-single crystalline semiconductor material, said second pin junction cell (b) comprising (b-i) a p-type semiconductor layer composed of a p-type non-single crystalline Semiconductor material, (b-ii) an i-type semiconductor layer composed of an i-type non-single crystalline semiconductor material, and (b-iii) an n-type semiconductor layer composed of an n-type non-single crystalline semiconductor material, characterized in that said first pin junction cell (a) contains (a-iv) a buffer layer comprising a non-single crystalline silicon semiconductor material substantially free of germanium atoms interposed between said p-type semiconductor layer (a-i) and said i-type semiconductor layer (a-ii) and (a-v) a buffer layer comprising a non-single crystalline silicon semiconductor material substantially free of germanium atoms interposed between said i-type semiconductor layer (a-ii) and said n-type semiconductor layer (a-iii), and said i-type semiconductor layer (a-ii) of said first pin junction cell (a) is formed of an amorphous silicon germanium semiconductor material containing the germanium atoms in an amount of 20 to 70 atomic % in the entire region in which the concentration distribution of the germanium atoms in the thickness direction is varied while providing a maximum concentration point.

12. A pin junction photovoltaic device according to claim 11, wherein the maximum concentration point of the germanium atoms in the i-type semiconductor layer (a-ii) is situated at a position lying toward the p-type semiconductor layer (a-i) from the center of the i-type semiconductor layer (a-ii) in the thickness direction.

13. A pin junction photovoltaic device according to claim 11, wherein each of the buffer layers (a-iv) and (a-v) is of a thickness in the range of from 50 to 1000 Å.

14. A pin junction photovoltaic device according to claim 11, wherein each of the buffer layers (a-iv) and (a-v) comprises a hydrogenated amorphous silicon material.

15. A pin junction photovoltaic device according to claim 11, wherein the p-type semiconductor layer (a-i) comprises a hydrogenated microcrystalline silicon material.

16. A pin junction photovoltaic device according to claim 11, wherein the p-type semiconductor layer (a-i) comprises a silicon carbide material.

17. A pin junction photovoltaic device according to claim 11, wherein the n-type semiconductor layer (a-iii)

comprises a hydrogenated amorphous silicon material or a hydrogenated microcrystalline silicon material.

18. A pin junction photovoltaic device according to claim 11, wherein the amount of the germanium atoms contained in the i-type semiconductor layer (a-ii) is in the range of from 30 to 70 atomic %.

19. A pin junction photovoltaic device according to claim 11, wherein the i-type semiconductor layer (a-ii) has an energy band gap in the range of from 1.35 to 1.60 eV at any portion of the i-type semiconductor layer.

20. A pin junction photovoltaic device according to claim 11, wherein the region having the maximum concentration point for the germanium atoms in the i-type semiconductor layer (a-ii) has an energy band gap in the range of from 1.35 to 1.60 eV.

21. A pin junction photovoltaic device comprising (a) a first pin junction cell, (b) a second pin junction cell, and (c) a third pin junction cell, said first pin junction cell (a), said second pin junction cell (b), and said third pin junction cell (c) being stacked in this order on a substrate, said pin junction photovoltaic device being of the type in which light is impinged from the side of said third pin junction cell (c), said first pin junction cell (a) comprising (a-i) a p-type semiconductor layer composed of a p-type non-single crystalline semiconductor material, (a-ii) an i-type semiconductor layer composed of an i-type non-single crystalline semiconductor material, and (a-iii) an n-type semiconductor layer composed of an n-type non-single crystalline semiconductor material, said second pin junction cell (b) comprising (b-i) a p-type semiconductor layer composed of a p-type non-single crystalline semiconductor material, (b-ii) an i-type semiconductor layer composed of an i-type non-single crystalline semiconductor material, and (b-iii) an n-type-semiconductor layer composed of an n-type non-single crystalline semiconductor material, and said third pin junction cell (c) comprising (c-i) a p-type semiconductor layer composed of a p-type non-single crystalline semiconductor material, (c-ii) an i-type semiconductor layer composed of an i-type non-single crystalline semiconductor material, and (c-iii) an n-type semiconductor layer composed of an n-type non-single crystalline semiconductor material, characterized in that said first pin junction cell (a) contains (a-iv) a buffer layer comprising a non-single crystalline silicon semiconductor material substantially free of germanium atoms interposed between said p-type semiconductor layer (a-i) and said i-type semiconductor layer (a-ii) and (a-v) a buffer layer comprising a non-single crystalline silicon semiconductor material substantially free of germanium atoms interposed between said i-type semiconductor layer (a-ii) and said n-type semiconductor layer (a-iii), and said i-type semiconductor layer (a-ii) of said first pin junction cell (a) is formed of an amorphous silicon germanium semiconductor material containing the germanium atoms in an amount of 20 to 70 atomic % in the entire region in which the concentration distribution of the germanium atoms in the thickness direction is varied while providing a maximum concentration point; said second pin junction cell (b) contains (b-vi) a buffer layer comprising a non-single crystalline silicon semiconductor material substantially free of germanium atoms interposed between said p-type semiconductor layer (b-i) and said i-type semiconductor layer (b-ii) and (b-v) a buffer layer comprising a non-single crystalline silicon semiconductor material substantially free of germanium atoms interposed between said i-type semiconductor layer (b-ii) and said n-type semiconductor layer (b-iii), and said i-type semiconductor layer (b-ii) of said first pin junction cell (b) is formed of an amorphous silicon germanium semiconductor material containing the germanium atoms in an amount of 20 to 70 atomic % in the entire region in which the concentration distribution of the germanium atoms in the thickness direction is varied while providing a maximum concentration point.

22. A pin junction photovoltaic device according to claim 21, wherein the maximum concentration point of the germanium atoms in the i-type semiconductor layer (a-ii) is situated at a position lying toward the p-type semiconductor layer (a-i) from the center of the i-type semiconductor layer (a-ii) in the thickness direction, and the maximum concentration point of the germanium atoms in the i-type semiconductor layer (b-ii) is situated at a position lying toward the p-type semiconductor layer (b-i) from the center of the i-type semiconductor layer (b-ii) in the thickness direction.

23. A pin junction photovoltaic device according to claim 21, wherein each of the buffer layers (a-iv), (a-v), (b-iv), and (b-v) is of a thickness in the range of from 50 to 1000 Å.

24. A pin junction photovoltaic device according to claim 21, wherein each of the buffer layers (a-iv), (a-v), (b-iv), and (b-v) comprises a hydrogenated amorphous silicon material.

25. A pin junction photovoltaic device according to claim 21, wherein each of the p-type semiconductor layers (a-i) and (b-i) comprises a hydrogenated microcrystalline silicon material.

26. A pin junction photovoltaic device according to claim 21, wherein each of the p-type semiconductor layers (a-i) and (b-i) comprises a silicon carbide material.

27. A pin junction photovoltaic device according to claim 21, wherein each of the n-type semiconductor layers (a-iii) and (b-iii) comprises a hydrogenated amorphous silicon material or a hydrogenated microcrystalline silicon material.

28. A pin junction photovoltaic device according to claim 21, wherein the amount of the germanium atoms contained in each of the i-type semiconductor layers (a-ii) and (b-ii) is in the range of from 30 to 70 atomic %.

29. A pin junction photovoltaic device according to claim 21, wherein each of the i-type semiconductor layers (a-ii) and (b-ii) has an energy band gap in the range of from 1.35 to 1.60 eV at any portion of the i-type semiconductor layer.

30. A pin junction photovoltaic device according to claim 21, wherein the region having the maximum concentration point for the germanium atoms in each of the i-type semiconductor layers (a-ii) and (b-ii) has an energy band gap in the range of from 1.35 to 1.60 eV.

* * * * *

UNITED STATES PATENT AND TRADEMARK OFFICE
CERTIFICATE OF CORRECTION

PATENT NO. : 5,324,364
DATED : June 28, 1994
INVENTOR(S) : KOICHI MATSUDA, ET AL.

It is certified that error appears in the above-identified patent and that said Letters Patent is hereby corrected as shown below:

COLUMN 5

Line 33, "1 the" should read --1 of the--.
Line 37, "1 the" should read --1 of the--.
Line 41, "1 the" should read --1 of the--.

COLUMN 7

Line 20, "(b-ill)" should read --(b-iii)--.
Line 25, "fee" should read --free--.
Line 40, "is" should read --is to--.
Line 52, "(a-ill)" should read --(a-iii)--.
Line 58, "(b-ill)" should read --(b-iii)--.
Line 65, "(c-ill)" should read --(c-iii)--.

COLUMN 8

Line 25, "(b-ill)" should read --(b-iii)--.

COLUMN 15

Line 44, "H$_2$gas," should read --H$_2$ gas,--.
Line 56, "completed" should read --completed,--.
Line 57, "H$_2$gas," should read --H$_2$ gas,--.
Line 66, "identical" should read --identical,--.

COLUMN 16

Line 24, "H$_2$gas" should read --H$_2$ gas--.
Line 58, "rh" should read --the--.

UNITED STATES PATENT AND TRADEMARK OFFICE
CERTIFICATE OF CORRECTION

PATENT NO. : 5,324,364
DATED : June 28, 1994
INVENTOR(S) : KOICHI MATSUDA, ET AL.

It is certified that error appears in the above-identified patent and that said Letters Patent is hereby corrected as shown below:

COLUMN 17

Line 20, "times" should read --times,--.
Line 29, "49," should read --49, its--.
Line 36, "113" should read --112--.
Line 40, "mechanism," should read --mechanism.--.

COLUMN 18

Line 66, "(1) ." should read --(1).--.

COLUMN 20

Line 37, "case" should read --case,--.

COLUMN 22

Line 29, "atoms-in" should read --atoms in--.
Line 63, "filmor" should read --film or--.

COLUMN 24

Line 25, "electrode," should read --electrode, and--.

COLUMN 25

Line 49, "extend" should read --extends--.
Line 50, "cover" should read --covers--.

UNITED STATES PATENT AND TRADEMARK OFFICE
CERTIFICATE OF CORRECTION

PATENT NO. : 5,324,364

DATED : June 28, 1994

INVENTOR(S) : KOICHI MATSUDA, ET AL.

It is certified that error appears in the above-identified patent and that said Letters Patent is hereby corrected as shown below:

COLUMN 26

Line 24, "vicinity" should read --vicinity of--.
    Line 36, "vicinity" should read --vicinity of--.
    Line 59, "is" should read --in--.

COLUMN 28

Line 56, "wither" should read --either--.

COLUMN 29

Line 31, "than" should read --that--.

COLUMN 32

Line 14, "500" should read --500 sccm--.
    Line 21, "PIG. 5" should read --FIG. 5--.
    Line 33, "incudes" should read --includes--.
    Line 57, "photovotaic" should read --photovoltaic--.

COLUMN 36

Line 31, "$H_2$gas" should read --$H_2$ gas--.

COLUMN 37

Line 27, "identical" should read --identical,--.

COLUMN 44

Line 24, "100 Å" should read --1000 Å--.

UNITED STATES PATENT AND TRADEMARK OFFICE
CERTIFICATE OF CORRECTION

PATENT NO. : 5,324,364
DATED : June 28, 1994
INVENTOR(S) : KOICHI MATSUDA, ET AL.

It is certified that error appears in the above-identified patent and that said Letters Patent is hereby corrected as shown below:

COLUMN 46

Line 39, "completed" should read --completed,--.

COLUMN 47

Line 19, "terminated" should read --terminated.--.
Line 20, "time" should read --time,--.
Line 31, "H$_2$gas" should read --H$_2$ gas--.
Line 62, "continuously" (first occurrence) should be deleted.

COLUMN 48

Line 64, "H$_2$gas" should read --H$_2$ gas--.

COLUMN 51

TABLE 3, Element Sample Nos. 24, 25 and 26:

```
"0.1       "  should read  --0.1    ⊚ --.
 0.09                        0.09   ⊚
 0.08                        0.08   ⊚
```

TABLE 3, Element Sample Nos. 31, 32 and 33:

```
"0.1       "  should read  --0.01   ⊚ --.
 0.07                        0.07   ⊚
 0.09                        0.09   ⊚
```

UNITED STATES PATENT AND TRADEMARK OFFICE
CERTIFICATE OF CORRECTION

PATENT NO. : 5,324,364

DATED : June 28, 1994

INVENTOR(S) : KOICHI MATSUDA, ET AL.

It is certified that error appears in the above-identified patent and that said Letters Patent is hereby corrected as shown below:

<u>COLUMN 54</u>

Line 23, "Semiconductor" should read --semiconductor--.

Signed and Sealed this

Thirty-first Day of January, 1995

Attest:

BRUCE LEHMAN

Attesting Officer     Commissioner of Patents and Trademarks